United States Patent
Johnson et al.

(10) Patent No.: US 11,127,893 B2
(45) Date of Patent: Sep. 21, 2021

(54) SYSTEMS AND METHODS FOR SUPERCONDUCTING DEVICES USED IN SUPERCONDUCTING CIRCUITS AND SCALABLE COMPUTING

(71) Applicant: D-WAVE SYSTEMS INC., Burnaby (CA)

(72) Inventors: Mark W. Johnson, Vancouver (CA); Paul I. Bunyk, New Westminster (CA); Andrew J. Berkley, Vancouver (CA); Richard G. Harris, North Vancouver (CA); Kelly T. R. Boothby, Coquitlam (CA); Loren J. Swenson, Burnaby (CA); Emile M. Hoskinson, Vancouver (CA); Christopher B. Rich, Vancouver (CA); Jan E. S. Johansson, Kristiansand (NO)

(73) Assignee: D-WAVE SYSTEMS INC., Burnaby (CA)

(*) Notice: Subject to any disclaimer, the term of this patent is extended or adjusted under 35 U.S.C. 154(b) by 0 days.

(21) Appl. No.: 16/098,801

(22) PCT Filed: May 3, 2017

(86) PCT No.: PCT/US2017/030857
§ 371 (c)(1),
(2) Date: Nov. 2, 2018

(87) PCT Pub. No.: WO2017/192733
PCT Pub. Date: Nov. 9, 2017

(65) Prior Publication Data
US 2021/0013391 A1    Jan. 14, 2021

Related U.S. Application Data

(60) Provisional application No. 62/331,287, filed on May 3, 2016, provisional application No. 62/405,027, filed on Oct. 6, 2016.

(51) Int. Cl.
| | | |
|---|---|---|
| *G06N 10/00* | (2019.01) | |
| *H01L 39/22* | (2006.01) | |
| *H01L 39/02* | (2006.01) | |

(52) U.S. Cl.
CPC .......... *H01L 39/225* (2013.01); *G06N 10/00* (2019.01); *H01L 39/025* (2013.01)

(58) Field of Classification Search
CPC ...... H01L 39/225; H01L 39/025; G06N 10/00
See application file for complete search history.

(56) References Cited

U.S. PATENT DOCUMENTS

| | | |
|---|---|---|
| 4,275,314 A | 6/1981 | Fulton |
| 4,496,854 A | 1/1985 | Chi et al. |

(Continued)

FOREIGN PATENT DOCUMENTS

| | | |
|---|---|---|
| CA | 2386426 A1 | 5/2001 |
| JP | 2007074120 A | 3/2007 |

(Continued)

OTHER PUBLICATIONS

Whittaker et al., "A Frequency and Sensitivity Tunable Microresonator Array for High-Speed Quantum Processor Readout," Journal of Applied Physics 119, arXiv:1509.05811v2 [quant-ph] Apr. 22, 2016, 8 pages.

(Continued)

*Primary Examiner* — Matthew L Reames
(74) *Attorney, Agent, or Firm* — Cozen O'Connor

(57) ABSTRACT

Approaches useful to operation of scalable processors with ever larger numbers of logic devices (e.g., qubits) advantageously take advantage of QFPs, for example to implement shift registers, multiplexers (i.e., MUXs), de-multiplexers (i.e., DEMUXs), and permanent magnetic memories (i.e., PMMs), and the like, and/or employ XY or XYZ addressing schemes, and/or employ control lines that extend in a (Continued)

"braided" pattern across an array of devices. Many of these described approaches are particularly suited for implementing input to and/or output from such processors. Superconducting quantum processors comprising superconducting digital-analog converters (DACs) are provided. The DACs may use kinetic inductance to store energy via thin-film superconducting materials and/or series of Josephson junctions, and may use single-loop or multi-loop designs. Particular constructions of energy storage elements are disclosed, including meandering structures. Galvanic connections between DACs and/or with target devices are disclosed, as well as inductive connections.

27 Claims, 28 Drawing Sheets

(56) References Cited

U.S. PATENT DOCUMENTS

| | | | |
|---|---|---|---|
| 4,937,525 A | 6/1990 | Daalmans |
| 4,947,118 A | 8/1990 | Fujimaki |
| 4,956,642 A | 9/1990 | Harada |
| 5,128,675 A | 7/1992 | Harada |
| 5,162,731 A | 11/1992 | Fujimaki |
| 5,248,941 A | 9/1993 | Lee et al. |
| 5,398,030 A | 3/1995 | Sandell |
| 5,936,458 A | 8/1999 | Rylov |
| 5,982,219 A | 11/1999 | Kirichenko |
| 6,114,931 A | 9/2000 | Gevorgian et al. |
| 6,627,916 B2 | 9/2003 | Amin et al. |
| 6,784,451 B2 | 8/2004 | Amin et al. |
| 6,838,694 B2 | 1/2005 | Esteve et al. |
| 6,984,846 B2 | 1/2006 | Newns et al. |
| 7,133,888 B2 | 11/2006 | Kohn et al. |
| 7,335,909 B2 | 2/2008 | Amin et al. |
| 7,843,209 B2 | 11/2010 | Berkley |
| 7,876,248 B2 | 1/2011 | Berkley et al. |
| 8,098,169 B2 | 1/2012 | Abraham et al. |
| 8,098,179 B2 | 1/2012 | Bunyk et al. |
| 8,169,231 B2 | 5/2012 | Berkley |
| 8,190,548 B2 | 5/2012 | Choi |
| 8,195,596 B2 | 6/2012 | Rose et al. |
| 8,421,053 B2 | 4/2013 | Bunyk et al. |
| 8,772,759 B2 | 7/2014 | Bunyk et al. |
| 8,786,476 B2 | 7/2014 | Bunyk et al. |
| 8,933,695 B1 | 1/2015 | Kornev et al. |
| 9,170,278 B2 | 10/2015 | Neufeld |
| 9,406,026 B2 | 8/2016 | Bunyk et al. |
| 9,779,360 B2 | 10/2017 | Bunyk et al. |
| 2003/0016069 A1 | 1/2003 | Furuta et al. |
| 2003/0071258 A1 | 4/2003 | Zagoskin et al. |
| 2003/0224753 A1 | 12/2003 | Bremond et al. |
| 2005/0007096 A1 | 1/2005 | Dimino et al. |
| 2005/0047245 A1 | 3/2005 | Furuta et al. |
| 2005/0082519 A1 | 4/2005 | Amin et al. |
| 2005/0250651 A1 | 11/2005 | Amin et al. |
| 2005/0256007 A1 | 11/2005 | Amin et al. |
| 2006/0147154 A1 | 7/2006 | Thom et al. |
| 2006/0225165 A1 | 10/2006 | Maassen et al. |
| 2006/0248618 A1 | 11/2006 | Berkley |
| 2007/0052441 A1 | 3/2007 | Taguchi et al. |
| 2008/0176750 A1 | 7/2008 | Rose et al. |
| 2008/0215850 A1 | 9/2008 | Berkley et al. |
| 2008/0238531 A1 | 10/2008 | Harris |
| 2009/0078931 A1 | 3/2009 | Berkley |
| 2009/0082209 A1 | 3/2009 | Bunyk et al. |
| 2009/0121215 A1 | 5/2009 | Choi |
| 2009/0146599 A1 | 6/2009 | Zhou et al. |
| 2009/0206871 A1 | 8/2009 | Baumgardner et al. |
| 2009/0319757 A1 | 12/2009 | Berkley |
| 2012/0094838 A1 | 4/2012 | Bunyk et al. |
| 2015/0032994 A1 | 1/2015 | Chudak et al. |
| 2015/0276827 A1 | 10/2015 | Sharma et al. |
| 2016/0112031 A1 | 4/2016 | Abraham et al. |
| 2016/0267032 A1 | 9/2016 | Rigetti et al. |
| 2017/0162778 A1 | 6/2017 | Harris et al. |
| 2018/0336299 A1 | 11/2018 | Barzegar et al. |

FOREIGN PATENT DOCUMENTS

| | | | |
|---|---|---|---|
| JP | 2010187240 A | 8/2010 |
| JP | 2016538809 A | 12/2016 |
| SU | 539333 A1 | 12/1976 |
| WO | 2008138150 A1 | 11/2008 |
| WO | 2009039634 A1 | 4/2009 |
| WO | 2009120638 A2 | 10/2009 |
| WO | 2009149086 A2 | 12/2009 |
| WO | 2016183213 A1 | 11/2016 |
| WO | 2017192733 A2 | 11/2017 |

OTHER PUBLICATIONS

"A High-Level Look at Optimization: Past, Present and Future," e-Optimization.Community, May 2000, pp. 1-5.

Allen et al., "Blue Gene: A vision for protein science using a petaflop supercomputer," IBM Systems Journal 40(2) 310-327, 2001.

Averin et al., "Variable Electrostatic Transformer: Controllable Coupling of Two Charge Qubits," Physical Review Letters 91(5): 057003-1-057003-4, Aug. 1, 2003.

B. H. Eom et al., "Wideband, Low-Noise Superconducting Amplifier with High Dynamic Range", arXiv:1201.2392v1 [cond-mat. supr-con], 2012, 23 pages.

Blatter et al., "Design aspects of superconducting-phase quantum bits," Physical Review B 63:174511-1-174511-9, 2001.

Bocko et al., "Prospects for Quantum Coherent Computation Using Superconducting Electronics," IEEE Transactions on Applied Superconductivity 7(2):3638-3641, Jun. 1997.

Brennen et al., "Why should anyone care about computing with anyons?," arXiv:0704.2241v1 [quant-ph], pp. 1-12, Apr. 18, 2007.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

Butcher, J.R., "Advances in Persistent-Current Qubit Research: Inductively Coupled Qubits and Novel Biasing Methods," Final Report, Delft University of Technology, Jan. 14, 2002, 52 pages.

Choi, "Systems, Devices, and Methods for Analog Processing," U.S. Appl. No. 60/986,554, filed Nov. 8, 2007, 39 pages.

Cosmelli, C., "Controllable Flux Coupling for the Integration of Flux Qubits," arXiv:cond-mat/0403690v1 [cond-mat. supr-con]. Mar. 29, 2004, 10 pages.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Feynman, "Simulating Physics with Computers," International Journal of Theoretical Physics 21(6/7): 467-488, 1982.

Friedman et al., "Quantum superposition of distinct macroscopic states," Nature 406:43-46, Jul. 6, 2000.

Harris et al., "Sign and Magnitude Tunable Coupler for Superconducting Flux Qubits," arXiv:cond-mat/0608253v1 [cond-mat.supr-con], Aug. 11, 2006. 5 pages.

Harris, "Systems, Devices, and Methods for Controllably Coupling Qubits," USAN U.S. Appl. No. 12/017,995, filed Jan. 22, 2008, 33 pages.

Hioe and Goto, Quantum Flux Parametron—A Single Quantum Flux Superconducting Logic Device, World Scientific Publishing Co. Pte. Ltd., Singapore, pp. 23-43,1991.

Il'ichev et al., "Continuous Monitoring of Rabi Oscillations in a Josephson Flux Qubit," Physical Review Letters 91(9) 097906-1—097906-4, week ending Aug. 29, 2003.

International Preliminary Report on Patentability for PCT/US2017/030857, dated Nov. 6, 2018, 11 pages.

International Search Report and Written Opinion for PCT/US2019/032689 dated Sep. 16, 2019, 13 pages.

(56) References Cited

OTHER PUBLICATIONS

International Search Report for PCT/US2017/030857, dated Jul. 24, 2017, 3 pages.
International Search Report, dated Mar. 18, 2008, for PCT/CA2007/002192, 4 pages.
Johnson et al., "Scalable Control System for a Superconducting Adiabatic Quantum Optimization Processor," Superconductor Science & Technology (2010).
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Maassen van den Brink et al., "Mediated tunable coupling of flux qubits," New Journal of Physics 7:1-18, 2005.
Madou, Fundamentals of Microfabrication, Second Edition, CRC Press LLC, Boca Raton, Florida, 2002. (book details provided).
Makhlin et al., "Quantum-state engineering with Josephson-junction devices," Reviews of Modern Physics 73 (2):357-400, Apr. 2001.
Mooij et al., "Josephson Persistent-Current Qubit," Science 285:1036-1039, Aug. 13, 1999.
Nielsen et al., Quantum Computation and Quantum Information, Cambridge University Press, Cambridge, 2000, "7.8 Other implementation schemes," pp. 343-345.
Orlando et al., "Superconducting persistent-current qubit," Physical Review B 60(22):15398-15413, Dec. 1, 1999.
Plourde et al., "Entangling Flux Qubits with a Bipolar Dynamic Inductance," arXiv:quant-ph/0406049v1, Jun. 8, 2004, 4 pages.
Rose et al., "Systems, Devices and Methods for Interconnected Processor Topology," USAN U.S. Appl. No. 12/013,192, filed Jan. 11, 2008, 47 pages.
Shor, "Introduction to Quantum Algorithms," AT&T Labs—Research, arXiv:quant-ph/0005003 v2, pp. 1-17, Jul. 6, 2001.
Written Opinion for PCT/US2017/030857, dated Jul. 24, 2017, 10 pages.
Written Opinion, dated Mar. 18, 2008, for PCT/CA2007/002192, 5 pages.
Whittaker, J.D., et al., "A frequency and sensitivity tunable microresonator array for high-speed quantum," arXiv:1509.05811v2 [quant-ph], Apr. 22, 2016, 8 pages., Apr. 22, 2016.
Amin, et al., "Thermally assisted adiabatic quantum computation," arXiv:cond-mat/0609332v2, pp. 1-5, Mar. 2, 2007.
Berkley, et al., "A scalable readout system for a superconducting adiabatic quantum optimization system", arXiv, May 6, 2009, 18 pages.
Choudhury, "Handbook of Microlithography, Micromachining and Microfabrication vol. 1: Microlithography", The International Society for Optical Engineering, Bellingham, WA, 1999. (book details provided).
Clarke, et al., "Quiet Readout of Superconducting Flux States," Physica Scripta. T102:173-177, 2002.
Deutsch, "Quantum theory, the Church-Turing principle and the universal quantum computer," Appeared in Proceedings of the Royal Society of London A 400: 97-117, 1985.
Dolan, et al., "Optimization on the NEOS Server," from SIAM News 35(6): 1-5, Jul./Aug. 2002.
Filippov, et al., "Tunable Transformer for Qubits Based on Flux States," IEEE Transactions on Applied Superconductivity 13(2): 1-4, Jun. 2003.
Fourer, et al., "Optimization as an Internet Resource," Interfaces 31(2): 130-150, Mar.-Apr. 2001.
Fritzsch, et al., "SNS and SIS Josephson junctions with dimensions down to the sub-um region prepared by an unified technology," Supercond. Sci. Tech. 12: 880-882, 1999.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Ghiu, et al., "Asymmetric two-output quantum processor in any dimension," arXiv:quant-ph/0610138v1, pp. 1-8, Oct. 17, 2006.
Hillery, et al., "Approximate programmable quantum processors," arXiv:quant-ph/0510161v1, pp. 1-7, Oct. 20, 2005.
Hioe, et al., "Quantum Flux Parametron"—A Single Quantum Flux Superconducting Logic Device, World Scientific Publishing Co. Pte. Ltd., Singapore, 1991, pp. 23-41.
Hosoya, Mutsumi, et al., "Operation of a 1 -bit Quantum Flux Parametron shift register (latch) by 4-phase 36-GHz clock", IEEE Transactions On Applied Superconductivity, vol. 5, No. 2, 1995, pp. 2831-2834.
Inokuchi, "Analog Computation Using Quantum-Flux Parametron Devices," Physica C 357-360:1618-1621, 2001.
Johnson, M. W, et al., "A scalable collrol system for a superconducting adiabatic quantum optimization processor," arXiv:0907.3757v2 [quant-ph], Mar. 24, 2010, 14 pages.
Kaiser, et al., "Coherent Atomic Matter Waves: Proceedings of the Les Houches Summer School, Session LXXII in 1999," Springer-Verlag, New York, ISBN 286883499X, pp. 184-188, 294-295, 302-303.
Koch, et al., "Model for l/f Flux Noise in SQUIDs and Qubits," pp. 1-14, May 5, 2007.
Levinson, "Principles of Lithography", The International Society for Optical Engineering, Bellingham, WA, 2001. (book details provided).
Likharev, "Classical and Quantum Limitations on Energy Consumption in Computation," International Journal of Theoretical Physics 21(3/4):311-326, 1982.
Likharev, "Dynamics of Some Single Flux Quantum Devices: I. Parametric Qualron," IEEE Transactions on Magnetics MAG-13(1):242-244, 1977.
Likharev, et al., "Reversible Conveyer Computation in Array of Parametric Quantrons," IEEE Transactions on Magnetics MAG-21 (2):947-950, 1985.
Maibaum, et al., Systems, Methods and Apparatus for Superconducting Demultiplexer Circuits, U.S. Appl. No. 61/058,494, filed Jun. 3, 2008, 66 pages.
Mc Hugh, et al., "A quantum computer using a trapped-ion spin molecule and microwave radiation," arXiv:quant-ph/0310015v2, pp. 1-9, Apr. 13, 2004.
McKenney, et al., "Design considerations for a background limited 350 micron pixel array using lumped element superconducting microresonators", SPIE, Sep. 24, 2012, 10 pages.
Miller, "A Single-Flux-Quantum Demultiplexer," IEEE Transactions on Applied Superconductivity 7(2):2690-2692, 1997.
Miller, et al., "A Single-Flux-Quantum Demultiplexer," IEEE Transactions on Applied Superconductivity 7(2):2690-2692, 1997.
Nielsen, "Cluster-State Quantum Computation," arXiv:quant-ph/0504097v2, pp. 1-15, Jul. 1, 2005.
Niepce, D., "Fabrication and Characterisation of Thin-Film Superconducting Nanowire Superconductors for Novel Quantum Devices", Master's Thesis in Nanoscience, Chalmers University of Technology, ISSN 1652-8557, 2014, 66 pages.
Ryan, et al., "Characterization of complex quantum dynamics with a scalable NMR information processor," arXiv:quant-ph/0506085v2, pp. 1-4, Feb. 13, 2006.
Semenov, et al., "Classical and Quantum Operation Modes of the Reversible Logic Circuits," Department of Physics and Astronomy, Stony Brook University, Stony Brook, New York, Presentation, Dec. 2006, 29 pages.
Shirts, et al., "Computing: Screen Savers of the Word Unite!," Science Online 290(5498): 1903-1904, Dec. 8, 2000.
Shnirman, et al., "Quantum Manipulations of Small Josephson Junctions," Physical Review Letters 79(12) 2371-2374, Sep. 22, 1997.
Shoji, et al., "New fabrication process for Josephson tunnel junctions with (niobium nitride, niobium) double-layered electrodes," Appl. Phys. Lett. 41(11): 1097-1099, Dec. 1, 1982.
Swenson, L. J. et al., "Operation of a titanium nitride superconducting microresonator detector in the nonlinear regime," arXiv:1305.4281v1 [cond-mat.supr-con], May 18, 2013, 11 pages.
Thaker, et al., "Quantum Memory Hierarchies: Efficient Designs to Match Available Parallelism in Quantum Computing," arXiv:quant-ph/0604070v1, 12 pages, Apr. 10, 2006.

(56) References Cited

OTHER PUBLICATIONS

Van Zant, "Microchip Fabrication", Fourth Edition, McGraw-Hill, New York, 2000. (book details provided).
VLASOV, "Von Neumann Quantum Processors," arXiv:quant-ph/0311196v1, pp. 1-8, Nov. 27, 2003.
Williams, et al., "Explorations in Quantum Computing", Springer, New York, Dec. 12, 1997, Chapter 11, "How to Make a Quantum Computer," pp. 241-265.

SYSTEMS AND METHODS FOR SUPERCONDUCTING DEVICES USED IN SUPERCONDUCTING CIRCUITS AND SCALABLE COMPUTING

TECHNICAL FIELD

This disclosure generally relates to superconducting devices such as those used in superconducting circuits and scalable computing, for instance quantum computing, and particularly relates to the design of superconducting digital-to-analog converters (DACs) in quantum processors, and the programming or reading-out of logic elements such as qubits of a quantum processor.

BACKGROUND

Qubits

Qubits can be used as fundamental units of information for a quantum computer. Qubits can refer to the actual physical device in which information is stored, and it can also refer to the unit of information itself, abstracted away from its physical device. Examples of qubits include quantum particles, atoms, electrons, photons, ions, and the like.

Qubits generalize the concept of a classical digital bit. A qubit contains two discrete physical states, which can also be labeled "0" and "1". Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of 2N states.

In standard notation, the basis states of a qubit are referred to as the |0> and |1> states. During quantum computation, the state of a qubit, in general, is a superposition of basis states so that the qubit has a nonzero probability of occupying the |0> basis state and a simultaneous nonzero probability of occupying the |1> basis state. Mathematically, a superposition of basis states means that the overall state of the qubit, which is denoted |Ψ>, has the form $|\psi\rangle = a|0\rangle + b|1\rangle$, where a and b are coefficients corresponding to the probabilities $|a|2$ and $|b|2$, respectively. The coefficients a and b each have real and imaginary components, which allow the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the |0> basis state or the |1> basis state thus regaining its similarity to a conventional bit. The actual state of the qubit after it has collapsed depends on the probabilities $|a|2$ and $|b|2$ immediately prior to the readout operation.

Superconducting Qubits

There are many different hardware and software approaches under consideration for use in quantum computers. One hardware approach uses integrated circuits formed of superconducting materials, such as aluminum or niobium.

Superconducting qubits are a type of superconducting device that can be included in a superconducting integrated circuit. Typical superconducting qubits, for example, have the advantage of scalability and are generally classified depending on the physical properties used to encode information including, for example, charge and phase devices, phase or flux devices, hybrid devices, and the like. Charge devices store and manipulate information in the charge states of the device, where elementary charges consist of pairs of electrons called Cooper pairs. A Cooper pair has a charge of 2e and consists of two electrons bound together by, for example, a phonon interaction. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed.

Examples of flux qubits include rf-SQUIDs, which include a superconducting loop interrupted by one Josephson junction, or a compound Josephson junction (where a single Josephson junction is replaced by two parallel Josephson junctions), or persistent current qubits, which include a superconducting loop interrupted by three Josephson junctions, and the like. Examples of qubits include hybrid charge-phase qubits.

The qubits may be associated with a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some instances, charge-based readout and local bias devices may be used. Conventional readout device(s) include dc-SQUID magnetometers inductively connected to a respective qubits within a topology. The readout device may provide a voltage or current. The dc-SQUID magnetometers typically are formed by a loop of superconducting material interrupted by at least one Josephson junction.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors are described in U.S. Patent Publication No. 2006-0225165, U.S. patent application Ser. No. 12/013,192, and U.S. Provisional Patent Application Ser. No. 60/986,554 filed Nov. 8, 2007 and entitled "Systems, Devices and Methods for Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology.

In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in U.S. Patent Publication No. 2006-0147154 and U.S. patent application Ser. No. 12/017, 995. Respective coupling strengths of the coupling devices may be tuned between zero and a maximum value, for example, to provide ferromagnetic or anti-ferromagnetic coupling between qubits.

Regardless of the specific hardware being implemented, managing a single qubit requires control over a number of parameters. Conventionally, this requirement necessitated outside communication (that is, communication from outside of the processor architecture) with individual qubits. However, since overall processing power increases with the number of qubits in the system, high capacity processors that exceed the abilities of conventional supercomputers must manage a large number of qubits and, thus, the conventional approach of employing outside control over multiple parameters on individual qubits requires a complicated system for programming qubit parameters.

Thus, the scalability of quantum processors is limited by the complexity of the qubit parameter control system and there is a need in the art for devices that enable a scalable qubit parameter control system.

Digital-to-Analog Converters (DACs)

Quantum processors provide a plurality of programmable devices for performing computations with quantum effects. Programmable devices include qubits, couplers (which programmably couple qubits), and components thereof. Programmable devices are programmed via signals applied to influence their operation—for example, a biasing signal may be applied to a flux qubit to affect its flux during computation.

Such signals often require conversion and/or storage prior to being applied to programmable devices. For example, a classical computer may generate digital signals for the quantum processor, and those digital signals may be converted to analog form via one or more digital-to-analog converter (DAC). The converted analog signal may be applied to the programmable device. As another example, a signal (which may be digital or analog) may be received by the quantum processor at one time before or during a computation and stored via a DAC until the signal is to be applied to a programmable device at a later time. DACs have many applications, and may be used for one or more of these purposes (i.e., conversion and/or memory) and/or for other purposes. Examples of applications of DACs for these and other purposes are described in greater detail in, for example, U.S. Pat. Nos. 7,876,248 and 8,098,179.

Superconducting quantum processors often comprise a plurality of DACs for these and other functions. Such DACs include superconducting DACs which store a flux (sometimes referred to as Φ-DACs), which generally comprise a storage inductor (e.g., a superconducting magnetic coil) and a programmable coupling element. Φ-DACs take advantage of the flux rate of change of the circuit (e.g., of the storage inductor) to store energy in their magnetic fields, thereby generating an effective inductance (sometimes referred to as a magnetic inductance).

Φ-DAC designs can impose various costs on the design of the processor. For example, magnetic storage inductors which can store sufficient flux for a typical design are often relatively large (and may require several fabrication layers using current techniques), which may constrain the space available for other components on the processor. Further, the magnetic field generated by the Φ-DAC may be powerful and require significant shielding. Even when shielded, the Φ-DAC will likely result in cross-talk with other flux-sensitive devices on the processor. Further still, at least some Φ-DAC designs are particularly sensitive to fabrication variability. Examples of Φ-DAC designs are described in greater detail in, for example, Johnson et al., "A scalable control system for a superconducting adiabatic quantum optimization processor", arXiv:0907.3757; and Bunyk et al., "Architectural considerations in the design of a superconducting quantum annealing processor", arXiv:1401.5504.

There is thus a general desire for systems and methods for providing superconducting DACs which ameliorate at least some of these deficiencies.

Quantum Flux Parametron

A quantum flux parametron (QFP) is a superconducting Josephson junction device similar in some respects to a compound rf-SQUID. A particular potential energy curve may be generated with a QFP device. This potential energy curve may resemble a "W" where the central peak or "barrier" is adjustable in height, as are the independent depths of the two wells on either side of the central barrier. Although the word "quantum" appears in the name of the QFP device, the device is generally operated in a classical manner. In short, quickly raising the height of the central barrier is classically believed to greatly disrupt the energy configuration of the system. Thus, damping resistors are traditionally incorporated into the QFP circuit to help dissipate energy and return the system to a stable energy configuration. These damping resistors dissipate excess energy in the form of heat, a process that can have negative effects on any system that is particularly sensitive to thermal noise. Thus, conventional QFP circuits are typically unsuitable for use with devices that are sensitive to thermal noise, such as the elements of a superconducting quantum processor.

Scalability

The data rate of a non-dissipative readout (NDRO) in a superconducting processor (such as the NDRO described in U.S. Pat. No. 8,169,231) is constant regardless of the processor size. Consequently, the approach does not scale to large processor sizes, for example, a quantum processor having a large number of qubits or a classical superconducting processor having a large number of devices.

Though the data rate can be increased by adding more NDRO lines and associated hardware, the approach is not readably scalable to large numbers of qubits.

Additional NDRO lines increase the thermal load on the refrigerator (i.e., fridge), raising a base temperature of the fridge. The increased power driven on-chip can increase the chip's heat load. Since performance of the processor can depend on low chip temperature, there can be a trade-off between processor performance and readout speed. Furthermore, adding more lines increases the cost of the hardware.

The performance of a superconducting quantum processor can be limited by the number and bandwidth of input lines. For example, in some existing implementations, the superconducting quantum processor can be accessed via approximately 200 lines each having a bandwidth of 30 MHz. The number and bandwidth of the input lines can, at least in part, determine the rate at which the system can encode new problems on the quantum processor.

Increasing the number and bandwidth of lines is not a readily scalable approach. Adding more lines can create a number of demands on the system including the need for a larger sample space, and the need for more contact pads on the periphery of the processor chip. Increasing the number of lines can also increase the thermal load on the processor. Moreover, an increase in the number of lines can open up more pathways for non-thermal photons.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

Described herein are a number of approaches useful to operation of processors with ever larger numbers of logic devices (e.g., qubits), and useful in addressing those logic devices in a scalable manner. Many of the approaches described herein advantageously take advantage of QFPs, for example to implement shift registers, multiplexers (i.e., MUXs), de-multiplexers (i.e., DEMUXs), and permanent magnetic memories (i.e., PMMs), and the like. Many of the approaches described herein employ XY or XYZ addressing schemes, which provide for scalability as the number of distinct logic devices on a processor chip or assembly of processor chips grows. Many of these described approaches are particularly suited for implementing input to and/or output from (i.e., read out) such processors.

In superconducting circuits, the QFP may be implemented as a magnetic flux-based logic device. It follows that QFPs may be used to implement superconducting shift registers, superconducting memory arrays, superconducting adders, superconducting flip-flops, and other logic-based circuits.

From the quantum mechanical perspective, it is possible to adjust the height of this central barrier slowly enough that the system is not excited beyond the desired ground state. This is an example of adiabatic evolution in a quantum system. Thus, while conventional damped QFP devices are designed for operation at high switching speeds (greater than ~20 GHz), the present systems, methods and apparatus provide undamped QFP-like devices for use in superconducting circuits where heat dissipation must be controlled. Operation of the present systems, methods and apparatus will generally be controlled adiabatically. Throughout the remainder of this specification and the appended claims, the terms "adiabatic", "adiabatically" and "adiabatic frequency" are used to describe frequencies, f, that satisfy:

$$f \leq \frac{1}{2\pi\sqrt{LC}}$$

where L is the loop inductance and C is the capacitance of the Josephson junction. Those of skill in the art will appreciate that for most of the exemplary circuits described herein, switching speeds will be less than about 20 GHz.

Thus, the present disclosure describes input/output systems and methods that are able to scale to large processor sizes, and provide improved performance, by increasing the rate at which data can be input and/or output to the processor without increasing the number of input/output lines to the processor.

The superconducting readout system may further include: a digital electronics subsystem that generates and detects a baseband signal, the digital electronics subsystem comprising: a Field Programmable Gate Array (FPGA); at least one Digital-to-Analog Converter (DAC) communicatively coupled to an output of the FPGA; and at least one Analog-to-Digital Converter (ADC) communicatively coupled to an input of the FPGA.

A system may be summarized as including a first set of digital-to-analog converters (DACs), each of the DACs of the first set of DACs including a respective loop of material and a respective pair of Josephson junctions that interrupt the respective loop of material and are electrically coupled in parallel with one another in the respective loop of material; a first quantum flux parametron (QFP) based shift register comprising a sequence of a plurality of QFP-based shift register elements, the first QFP-based shift register one of magnetically or galvanically coupleable to the DACs of the first set of DACs; a power line that serially couples the DACs of the first set of DACs; and a trigger line that serially couples the DACs of the first set of DACs, wherein: each of the DACs of the first set of DACs is independently addressable by a triplet of three signals a successive number of times to store a variable number of flux quanta, the triplet of three signals including a first signal received via the QFP-based shift register elements of the first QFP-based shift register, a second signal received via the power line, and a third signal received via the trigger line.

The system may further include an inductor ladder circuit that superconducts at a critical temperature and that includes a plurality of inductors, wherein each of the QFP-based shift register element of the first QFP-based shift register is magnetically coupled to one of the DACs of the first set of DACs via the inductor ladder circuit.

The system may further include a first set of QFP amplifiers that galvanically couple to respective ones of the DACs of the first set of DAC as a respective flux amplifier. Each of the QFP amplifiers of the first set of QFP amplifiers may include a respective loop of material that superconducts at a critical temperature and a respective pair of Josephson junctions that interrupt the respective loop and are electrically coupled in parallel with one another in the loop of material.

The system may further include an inductor ladder circuit that superconducts at a critical temperature and that includes a plurality of inductors, wherein each of the QFP amplifiers of the first set of QFP amplifiers is coupled between a respective one of the DACs of the first set of DACs and the QFP-based shift register elements of the first QFP-based shift register via the inductor ladder circuit. The first QFP-based shift register may include at least three QFP register elements per DAC of the first set of DACs. Each of the QFP register elements of the first QFP-based shift register may include a respective loop of material that superconducts at a critical temperature and a respective pair of Josephson junctions that interrupt the respective loop and are electrically coupled in parallel with one another in the loop of material. Each of the QFP register elements of the first QFP-based shift register may include a respective galvanic interface to one of a plurality of address lines.

The system may further include a plurality of additional sets of DACs; and a plurality of additional QFP-based shift registers.

The system may further include control circuitry communicatively coupled to apply signals to the power line, the trigger line and an address line. The control circuitry sequentially may apply signals to the power line, the trigger line and the address line to load single flux quanta (SFQ) to selected ones of the DACs.

The control circuitry may resets all of the DACs of the first set of DACs; apply a clockwise persistent current to a first number of the QFP-based shift register elements which are coupled to the DACs into which quantums of flux are to be added; apply a counter-clockwise persistent current to a second number of the QFP-based shift register elements which are coupled to the DACs into which quantums of flux are not to be loaded; and for a first number of times, apply a signal to the trigger line, where the first number of times is at least proportional to a total number of quantums of flux to be added. The first number of times may be equal to the total number of quantums of flux to be loaded.

The control circuitry may sort all of the DACs based on a number of quantums of flux to be loaded to the DACs; reset all of the DACs; apply a clockwise persistent current to a number of the QFP-based shift register elements which are coupled to the DAC stages into which at least one quantum of flux is to be loaded; a counter-clockwise persistent current to a number of the QFP-based shift register elements which are coupled to the DACs into which less than one quantum of flux is to be loaded; apply a signal to the trigger line; apply a clockwise persistent current to a number of the QFP-based shift register elements which are coupled to the DACs into which at least two quantums of flux are to be loaded; apply a counter-clockwise persistent current to a number of the QFP-based shift register elements which are coupled to the DACs into which less than two quantums of flux are to be loaded; and apply a signal to the trigger line.

The control circuitry may sort all of the DAC stages based on a number of quantums of flux to be loaded to the DACs; reset all of the DACs of all of the DAC stages; and for an integer number i times from i equals 1 to a maximum number of quantums of flux n to be programmed: apply a clockwise persistent current to a number of the QFP-based shift register elements which are coupled to the DACs into which at least i quantums of flux are to be loaded; apply a counter-clockwise persistent current to a number of the QFP-based shift register elements which are coupled to the DACs into which less than i quantums of flux are to be loaded; and apply a signal to the trigger line. The maximum number of quantums of flux n may be between 18 and 22. To reset all of the DACs of the first set of DACs, the control circuitry repeatedly may apply a signal to the trigger line.

The computing may further include a second set of DACs, each of the DACs of the second set of DACs including a respective loop of material that superconducts at a critical temperature and a respective pair of Josephson junctions that interrupt the respective loop and are electrically coupled in parallel with one another in the loop of material; a second QFP-based shift register comprising a sequence of a plurality of QFP-based shift register elements, the QFP-based shift register elements of the second QFP-based shift register one of magnetically or galvanically coupleable to the DACs of the second set of DACs; and each of the DACs of the second set of DACs is independently addressable by a triplet of three signals a successive number of times to store a variable number of flux quanta, the triplet of three signals including a first received via the QFP-based shift register elements of the second QFP-based shift register, a second signal, and signal a third signal. The respective loop of material of each of the DACs may superconduct at least at a critical temperature and all of the DACS and QFP-based shift register reside on a single chip.

A system may be summarized as including a number of quantum flux parametrons (QFPs); at least one pair of quantum flux parametron digital-to-analog converters (QFP-DACs); a current bias line that applies a current bias to both of the QFP-DACs of the at least one pair of the QFP-DACs without any bias resistors; and for each QFP of the number of QFPs, a respective first number of quantum flux parametron-latches (QFP-latches) selectively operable to communicatively couple flux between the QFP and a first one of the QFP-DACs of the at least one pair of QFP-DACs and a respective second number of QFP-latches selectively operable to communicatively couple flux between the QFP and a second one of the QFP-DACs of the at least one pair of QFP-DACs. Each of the QFPs may include a respective first loop of material interrupted by a respective second loop of material, the first and the second loops of material which superconductive at a critical temperature, and having a respective first and a respective second interface, the second loop of material interrupted by two Josephson junctions, the first inductive interface positioned to communicatively couple flux with the first one of the respective first number of QFP-latches and the second inductive interface positioned to communicatively couple flux with the first one of the respective second number of QFP-latches. A second one of the first number of QFP-latches and a second one of the second number of QFP-latches may each include a respective Josephson junction loop of material interrupted by two Josephson junctions. Each of the QFPs may include a respective loop with a first interface positioned to communicatively couple flux to a first one of the respective first number of QFP-latches and a second interface positioned to communicatively couple flux to a first one of the respective second number of QFP-latches.

Each of the first one of the respective first number of QFP-latches may include a respective loop with a respective second interface positioned to communicatively couple flux to a second one of the respective first number of QFP-latches, and each of the first one of the respective second number of QFP-latches may include a respective loop with a respective second interface positioned to communicatively couple flux to a second one of the respective second number of QFP-latches. The first one of each of the first number of QFP-latches may be responsive to a respective first latch signal and the first one of each of the second number of QFP-latches may be responsive to a logical inverse of the respective first latch signal. The first one of each of the first number of QFP-latches may be responsive to a respective first offset signal and the first one of each of the second number of QFP-latches may be responsive to the respective first offset signal. The first one of each of the first number of QFP-latches may be responsive to a respective first address signal and the first one of each of the second number of QFP-latches may be responsive to a logical inverse of the respective address signal. The first one of each of the first number of QFP-latches may be responsive to a respective first latch signal and the first one of each of the second number of QFP-latches may be responsive to the respective first latch signal. Each of the least one pair of QFP-DACs may be responsive to a respective second latch signal.

Each of the QFP-DACs may include a respective primary loop of material, a latch loop of material interrupted by a first pair of Josephson junctions and a latch interface, and a reset loop of material interrupted by a second pair of Josephson junctions an a reset interface, the primary loop of material interrupted by the latch loop of material and interrupted by the reset loop of material, the primary loop of material including a first interface positioned to communicatively couple with one QFP-latch of a respective one of the first or the second number of QFP-latches, and at least a second interface for one of input or output. The QFP-DACs may each be responsive to a respective second latch signal. The QFP-DACs may each be responsive to a respective first tip signal. The each of the QFP-DACs may be responsive to a respective reset signal. The first one of each of the QFPs may be responsive to a respective offset signal.

The system may further include control circuitry communicatively coupled to control apply signals to the QFP-DACs and the QFP-latches. The control circuitry may apply signals to the QFP-latches to load information into the DACs. The control circuitry may apply signals to the QFP-latches to operate as a quantum flux parametron demultiplexer (QFP-Demux). The control circuitry may apply signals to the QFP-latches to load information from the DACs. The control circuitry may apply signals to the QFP-latches to operate as a quantum flux parametron multiplexer (QFP-Mux). All of the QFPs QFP-DACs and QFP-latches may form a non-dissipative programmable magnetic memory (PMM) that resides on a single chip.

There exists a need to be able to process at least some problems having size and/or connectivity greater than (and/or at least not fully provided by) the working graph (i.e., physical structure or topology) of an analog processor. Computational systems and methods are described which, at least in some implementations, allow for the computation of at least some problem graphs which have representations which do not fit within the working graph of an analog processor (e.g., because the problem graphs require more computation devices and/or more/other couplers than the processor provides).

An aspect of the present disclosure provides a quantum processor comprising a plurality of programmable devices. The programmable devices comprise superconducting qubits and one or more couplers for communicatively coupling qubits. The quantum processor comprises a first digital-analog converter (DAC) operable to drive a current in a target device of the plurality of programmable devices. The first DAC is coupleable to the target device and comprises a first superconducting loop. In operation the first superconducting loop has a first charge carrier density. The DAC also comprises a first energy storage element interrupting the first superconducting loop. In operation the energy storage element has a second charge carrier density which is less than the first charge carrier density, thereby providing a first kinetic inductance.

In some implementations, the first superconducting loop comprises a first superconducting material having a first effective penetration depth and the first energy storage element comprises a second superconducting material having a second effective penetration depth, the second effective penetration depth greater than the first effective penetration depth.

In some implementations, the first energy storage element comprises a superconducting film of the second superconducting material, the superconducting film having a thickness less than a thickness of the first superconducting material of the superconducting loop. The thickness of the superconducting film may be at most three times, and/or at most one-half, the second penetration depth.

In some implementations, the superconducting film is disposed entirely within a layer of the quantum processor, the superconducting film thereby being substantially planar. In some implementations, the superconducting film meanders within a planar area having an area length in a first dimension and an area width in a second dimension. The superconducting film extends in a plurality of lengthwise portions extending across the area length in the first dimension. Each lengthwise portion is spaced apart from adjacent lengthwise portions in the second dimension by a distance less than the area width and is electrically connected to adjacent lengthwise portions by widthwise portions extending in the second dimension.

In some implementations, the second superconducting material is selected from a group consisting of: NbN, NbTiN, TiN, and granular aluminum.

In some implementations, the first energy storage element comprises a plurality of Josephson junctions interrupting the first superconducting loop in series. The first DAC may be galvanically coupled to the target device by a galvanic coupling comprising a shared Josephson junction. The first DAC may be magnetically coupled to the target device and the $R_N A$ for each of the plurality of Josephson junctions deviates from a target $R_N A$ value, where $R_N$ is a per-junction Josephson resistance and A is a per-junction area, by no more than a threshold amount.

In some implementations, the quantum processor comprises a second DAC. The second DAC comprises a second superconducting loop and a second energy storage element interrupting the second superconducting loop and providing a second kinetic inductance. The second superconducting loop is galvanically coupled to the first superconducting loop of the first DAC. The first and second superconducting loops comprise a shared portion common to the first and second superconducting loops. The shared portion comprises a shared energy storage element which, in operation, provides a kinetic inductance proportional to at least one of the first and second kinetic inductances. In some implementations, a width of the shared portion is greater than a width of the first and second energy storage elements, where width is measured orthogonally to a direction of current and thickness.

In some implementations, the first DAC comprises a coupling element interrupting the first superconducting loop and the first DAC is directly coupled to the target device via a coupling element. The second DAC is indirectly coupled to the target device via the first DAC. The first DAC is operable to represent a most significant digit of an input string and the second DAC is operable to represent a less significant digit of the input string.

In some implementations, the first energy storage element comprises a first plurality of Josephson junctions interrupting the first superconducting loop in series and the second energy storage element comprises a second plurality of Josephson junctions interrupting the second superconducting loop in series. The shared portion comprises a third plurality of Josephson junctions. At least one of the Josephson junctions of the third plurality of Josephson junctions has a greater area than each Josephson junction of the first and second pluralities of Josephson junctions. In some implementations, the least one of the Josephson junctions of the third plurality of Josephson junctions has an area at least twice as large as a respective area of at least one of the Josephson junctions of the first and second pluralities of Josephson junctions.

In some implementations, the first superconducting loop is galvanically coupled to the target device.

A quantum processor may be summarized as including a plurality of programmable devices comprising superconducting qubits and one or more couplers for communicatively coupling qubits; and a first digital-analog converter (DAC) operable to drive a current in a target device of the plurality of programmable devices, the first DAC coupleable to the target device and comprising: a first superconducting loop, in operation the first superconducting loop having a first charge carrier density; a first energy storage element interrupting the first superconducting loop, in operation the energy storage element having a second charge carrier density less than the first charge carrier density, thereby providing a first kinetic inductance. The first superconducting loop may include a first superconducting material having a first effective penetration depth and the first energy storage element may include a second superconducting material having a second effective penetration depth greater than the first effective penetration depth. The first energy storage element may include a superconducting film of the second superconducting material, the superconducting film having a thickness less than a thickness of the first superconducting material of the superconducting loop. The thickness of the superconducting film may be at most three times the second penetration depth. The thickness of the superconducting film may be at most one-half the second penetration depth. The superconducting film may be disposed entirely within a layer of the quantum processor, the superconducting film thereby being substantially planar.

The superconducting film may meander within a planar area having an area length in a first dimension and an area width in a second dimension, the superconducting film extending in a plurality of lengthwise portions extending across the area length in the first dimension, each lengthwise portion spaced apart from adjacent lengthwise portions in the second dimension by a distance less than the area width and electrically connected to adjacent lengthwise portions by widthwise portions extending in the second dimension. The second superconducting material may be selected from a group consisting of: NbN, NbTiN, TiN, and granular aluminum. The first energy storage element may include a plurality of Josephson junctions interrupting the first superconducting loop in series. The first DAC may be galvanically coupled to the target device by a galvanic coupling, the galvanic coupling including a shared Josephson junction. The first DAC may be magnetically coupled to the target device and the $R_N A$ for each of the plurality of Josephson junctions may deviate from a target $R_N A$ value, where $R_N$ is a per-junction Josephson resistance and A is a per-junction area, by no more than a threshold amount.

The quantum processor may include a second DAC, the second DAC including a second superconducting loop and a second energy storage element interrupting the second superconducting loop and providing a second kinetic inductance; wherein: the second superconducting loop is galvanically coupled to the first superconducting loop of the first DAC; the first and the second superconducting loops comprise a shared portion common to the first and the second superconducting loops; and the shared portion comprises a shared energy storage element which, in operation, provides a shared kinetic inductance proportional to at least one of the first and the second kinetic inductances. A width of the shared portion may be greater than a width of the first and the second energy storage elements, where width is measured orthogonally to a direction of current and thickness. A first area of the shared portion may be coupled to one or more superconductors having a lesser kinetic inductance less than the first kinetic inductance, wherein an uncoupled area of the shared portion is at least partially defined by the superconductors to provide the shared kinetic inductance. The shared energy storage element, in operation, may provide the shared kinetic inductance proportional to the first kinetic inductance, and the first DAC, in operation, may represent one or more more-significant digits than the second DAC.

The first DAC may include a coupling element interrupting the first superconducting loop and the first DAC is directly coupled to the target device via a coupling element; and The second DAC may be indirectly coupled to the target device via the first DAC; wherein the first DAC is operable to represent a most significant digit of an input string and the second DAC is operable to represent a less significant digit of the input string.

The first energy storage element may include a first plurality of Josephson junctions interrupting the first superconducting loop in series; the second energy storage element may include a second plurality of Josephson junctions interrupting the second superconducting loop in series; and the shared portion may include a third plurality of Josephson junctions, at least one of the Josephson junctions of the third plurality of Josephson junctions having a greater area than each Josephson junction of the first and the second pluralities of Josephson junctions. The at least one of the Josephson junctions of the third plurality of Josephson junctions may have an area at least twice as large as at least one of the Josephson junctions of the first and the second pluralities of Josephson junctions. The first superconducting loop may be galvanically coupled to the target device.

BRIEF DESCRIPTION OF THE SEVERAL
VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
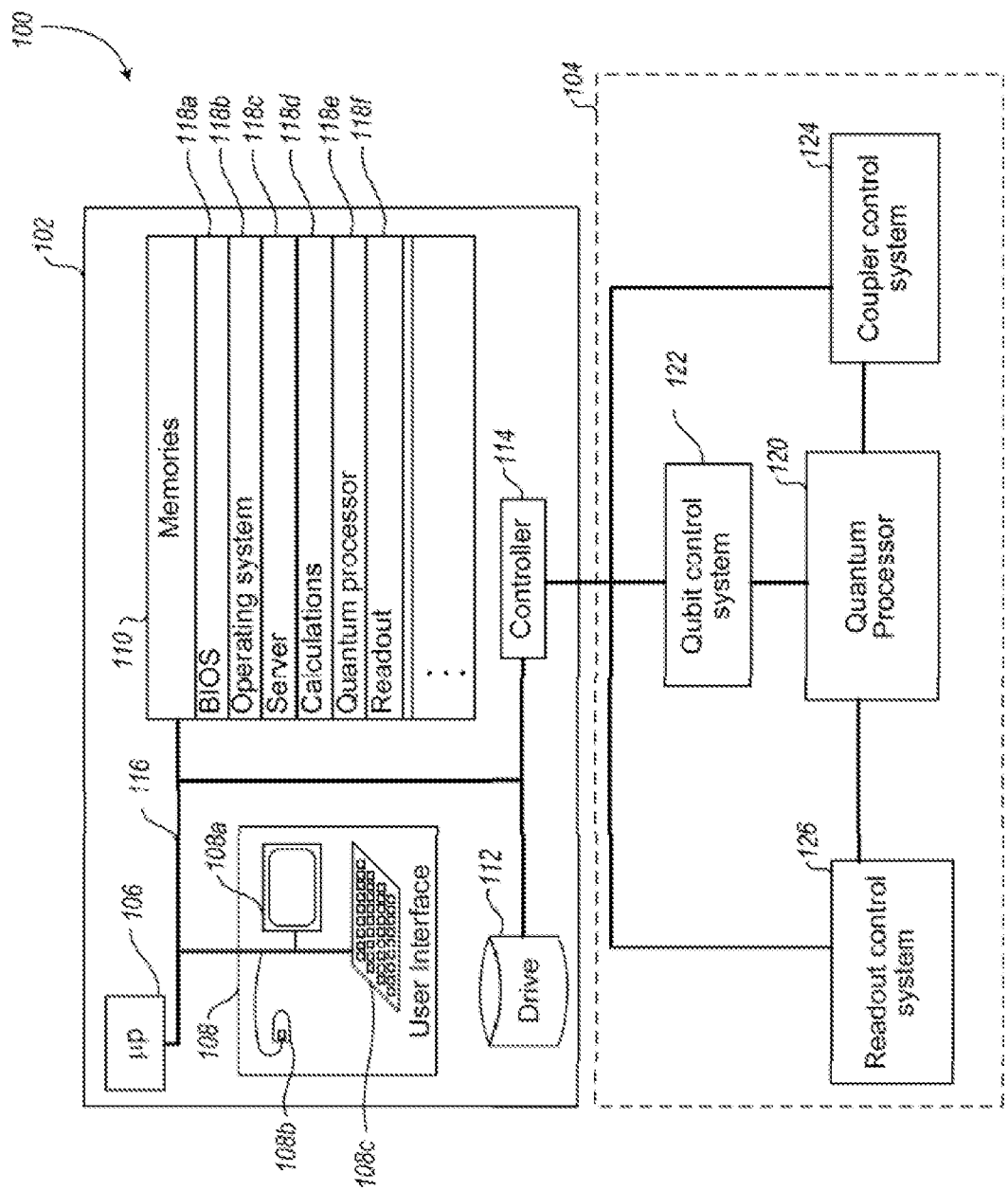
FIG. 1 is a schematic diagram of a hybrid computing system, including a digital computer and a quantum computer, that may incorporate various logic devices and/or implement various addressing approached described herein, according to at least one illustrated implementation.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, communications networks, superconductive circuits and/or resonators have not been shown or described in detail to avoid unnecessarily obscuring descriptions of the implementations. Throughout this specification and the appended claims, the words "element" and "elements" are used to encompass, but are not limited to, all such structures, systems, and devices associated with computer systems, server computers, communications networks, superconductive circuits and resonators.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations. As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Furthermore, certain figures herein depict various voltage and current waveforms. These waveforms are intended to be illustrative for purposes of understanding operation of embodiments, and are not intended to be drawn to scale and/or to precisely and accurately depict waveform behavior in terms of shape, amplitude, duty cycle, frequency, distortion, or other characteristics.

In classical electrical circuits, complicated and elaborate operations may be carried out by a particular arrangement of simple switching devices, such as transistors. Examples of such arrangements include shift registers, memory arrays, adders, flip-flops, and the like. In the evolving field of superconducting electronics, and in particular superconducting quantum computing, it is essential to develop circuits that implement superconducting analogues of each of these arrangements. These arrangements may similarly be constructed using simple switching devices; however classical switching devices such as the transistor are not appropriate in the superconducting regime. Thus, in many superconducting systems it is important to establish a basic superconducting logic device with which many other circuits and operations may be realized.

An application of superconducting electronics that is of particular interest is in the field of quantum computing. Superconducting circuits are capable of exploiting quantum effects on a macroscopic scale, providing a mechanism for the implementation of quantum computation that is much more manageable than some of the alternatives. As discussed, the fundamental unit of quantum computation is the qubit. Superconducting qubits may come in a variety of forms, including the superconducting flux qubit. A superconducting flux qubit may be realized in the form of a superconducting loop that contains at least one switching device known as a Josephson junction. A quantum processor may then comprise any number of such superconducting flux qubits. Thus, in implementing such a quantum processor, techniques for fabricating large numbers of superconducting flux qubits may be developed, as well as a solid understanding of the operation of such devices. The present systems, methods and apparatuses describe the use of the basic superconducting flux qubit structure as a superconducting switching device in a quantum processor. In an exemplary embodiment, an arrangement of superconducting flux qubits may be implemented as a superconducting flux-based shift register in a superconducting quantum processor.

This disclosure relates to superconducting quantum processors comprising superconducting digital-analog converters (DACs). The DACs comprise energy storage elements which use kinetic inductance to store energy. Single-loop and multi-loop (or "cascading") DAC designs are disclosed in various implementations. Implementations of thin-film energy storage elements and Josephson-junction-based energy storage elements providing kinetic inductance are disclosed, including implementations with meandering layouts and/or galvanic couplings.

Although the term DAC is used throughout, it will be understood that the described devices may be used for a variety of purposes which are not necessarily restricted to converting digital signals to analog signals (and, in some implementations, do not involve such conversion at all). For example, as described above, superconducting DACs may be used by quantum processors to store a signal for a period of time (e.g., thereby operating as a form of memory).

To assist the understanding of the reader, the operation of an example superconducting quantum processor is discussed below. This provides a context in which a superconducting DAC may operate and illustrates at least some exemplary functions of such a DAC.

Exemplary Hybrid Computing System

FIG. 1 shows a hybrid computing system 100 according to at least one exemplary implementation, including a classical or digital computer 102 and a quantum computer 104, that may incorporate various logic devices and/or implement various addressing approaches described herein.

Digital computer 102 comprises one or more digital processors 106, for example one or more single- or multi-core microprocessors, central processor units (CPU), graphical processor units (GPUs), digital signal processors (DSPs), or application specific integrated circuits (ASICs). The digital computer 102 may include one or more user interface components, for example one or more displays 108a, pointer devices 108b (e.g., computer mouse, trackball), and keypads or keyboards 108c, collectively 108. The digital computer 102 may include one or more nontransitory computer- or processor-readable media, for example one or more memories (e.g., volatile memory, static memory, read only memory (ROM), random access memory (RAM)) 110 and/or one or more storage devices (e.g., magnetic hard disk drives (HDDs), optical disk drives, solid state drives (SSD), and/or Flash drives) 112. The digital computer 102 may include one or more quantum computer control subsystems 114 that interfaces with the quantum computer 104. The processor(s) 106, memories 110, storage 112 and quantum computer control subsystems 114 may be communicatively coupled via one or more communications channels, for instance one or more buses (e.g., power buses, communications buses, instruction buses, address buses) 116.

The nontransitory computer- or processor-readable media, for example one or more memories 110, stores processor-executable instructions and data which, when executed by one or more processors 106, causes the processors 106 to execute one or more of the various algorithms described herein. The processor-executable instructions and data may, for example, include a basic input and output system set of instructions or "module" 118a which configure the digital computer 102 for operation on boot up. The processor-executable instructions and data may, for example, include an operating system set of instructions or "module" 118b which configures the digital computer 102 for operation, for instance providing various file management services and user interface services. The processor-executable instructions and data may, for example, include a server set of instructions or "module" 118c which configures the digital computer 102 for operation as a server to provide access by other computers to information and services. The processor-executable instructions and data may, for example, include a calculations set of instructions or "module" 118d which configures the digital computer 102 to preform various calculations associated with converting problems into a problem graph and/or post-processing of potential solutions generated by the quantum computer 104. The processor-executable instructions and data may, for example, include a quantum processor set of instructions or "module" 118d which configures the digital computer 102 to map problems from a problem graph to a hardware graph for embedding in a quantum processor 120 of the quantum computer 104 for execution. The processor-executable instructions and data may, for example, include a read out set of instructions or "module" 118f which configures the digital computer 102 to perform various read out functions associated with reading out potential solutions to problems from the quantum computer 104.

The quantum computer 104 comprises the quantum processor 120, which typically includes a plurality of qubits and a plurality of couplers, each coupler selectively operable to couple a respective pair of the qubits. The quantum computer 104 includes a qubit control system 122, operatively coupled to control each of the qubits, for example via various interfaces, i.e., inductive interfaces that selectively couple a flux to the qubit. The quantum computer 104 includes a coupler control system 124, operatively coupled to control each of the couplers, for example via various interfaces, i.e., inductive interfaces that selectively couple a flux to the coupler to set a strength of coupling or "coupling strength" of the coupler. The quantum computer 104 includes a read out control system 126, operatively coupled to control various interfaces operable to read out a state of each of the qubits.

Various respective systems, components, structures and algorithms for implementing such are described herein. Many of the described systems, components, structures and algorithms may be implemented individually, while some may be implemented in combination with one another.

Quantum Flux Parametron (QFP)-Based Shift Registers

An existing system relies on X-Y-Z addressing scheme to address DACs, with Z denominated for convenience as power (all DAC stages in a C2 size processor are connected in series), and X and Y signals are denominated for convenience as address (ADDR) and trigger (TRIG). Powering up a C2 block, asserting ADDR and toggling TRIG several times writes corresponding number of pulses into one uniquely selected DAC stage. This addressing scheme can handle several thousand qubits level (e.g., 8,000 or 16,000). To move on the next complexity level with, for example 100,000 qubits and beyond, a way to serially load data into PMM can be employed, using only a couple of lines to write long bit streams into DACs. SFQ-based shift registers dissipate too much power on-chip, thus, it would be preferred to employ a QFP-based scheme.

Figure 2:
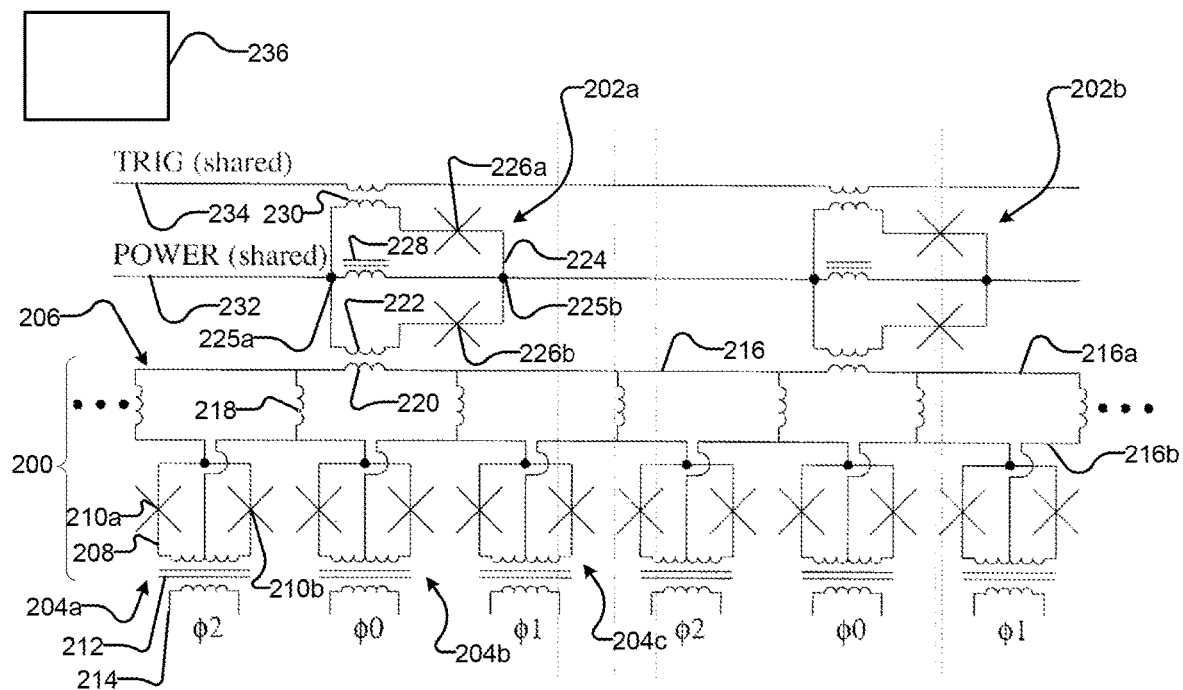
FIG. 2 is a schematic diagram illustrating a quantum flux parametron (QFP)-based shift register communicatively coupled to a set of digital-to-analog converters (DACs), according to at least one illustrated implementation.
Figure 3:
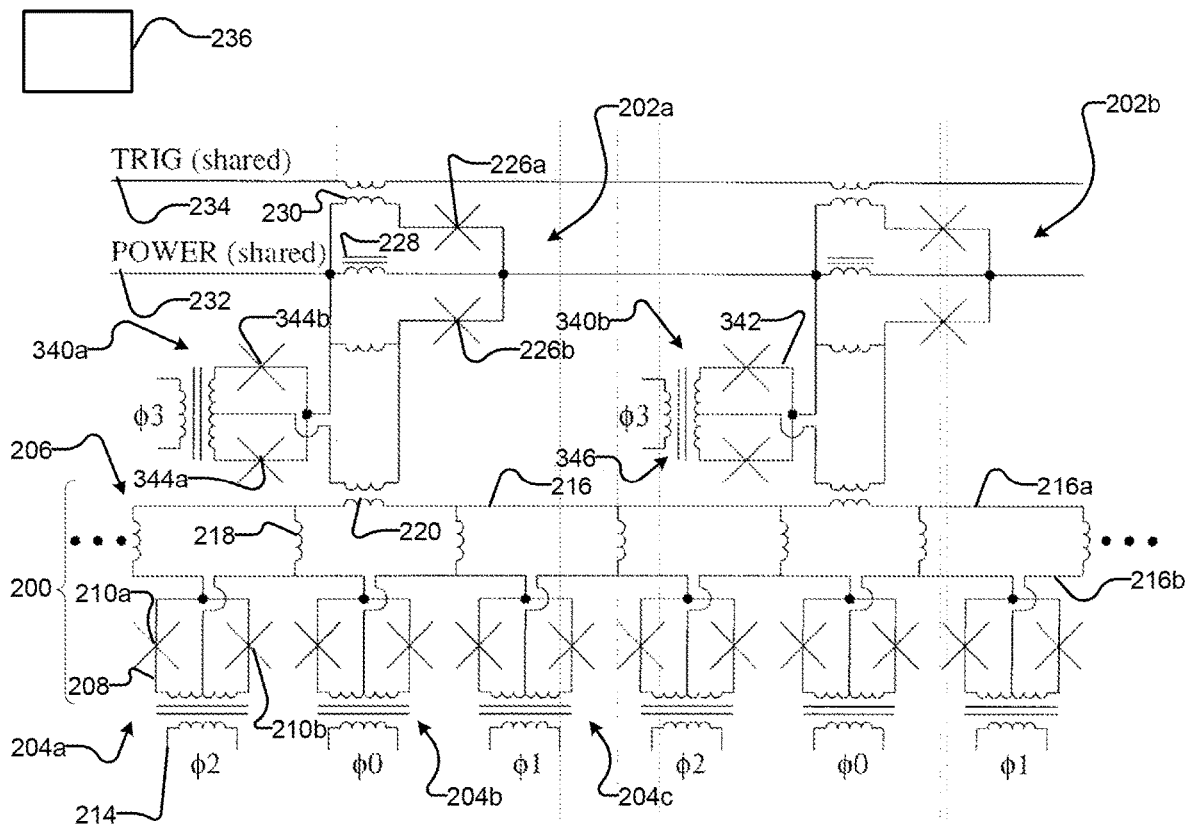
FIG. 3 is a schematic diagram illustrating a quantum flux parametron (QFP)-based shift register communicatively coupled to a set of digital-to-analog converters (DACs) via a number of intermediary QFPs, according to at least one illustrated implementation.

In at least one existing approach, each of ADDR and TRIG provide about ¼ of $\Phi_0$ (where $\Phi_0$ is the superconducting magnetic flux quantum), and a DAC stage which is selected (where ADDR and TRIG coincide in direction of flux, and the DAC stage is powered up) sees about ½ of $\Phi_0$ total signal when it switches, inserting another single flux quantum (SFQ) into the corresponding DAC storage inductor. In principle, one of these signals (e.g., ADDR) can be fed not from a dedicated room temperature line, but by a QFP stage magnetically, or galvanically if it is connected to a QFP shift register magnetically, coupled to half of the DAC stage. Two possible arrangements are illustrated in FIGS. 2 and 3. In particular, FIG. 2 shows a DAC magnetically coupled to a QFP-SR stage, while FIG. 3 shows an additional QFP galvanically coupled to a DAC, which serves as a flux amplifier, providing more signal into the DAC at the expense of extra junctions/body footprint. Since all DACs are connected in series (via POWER line), it may be preferable if the QFP Shift register (QFP-SR) has galvanic connections between stages, which may improve margins in the presence of possible flux offsets, and there should be a (less efficient) magnetic connection somewhere between DACs and QFP-SR.

FIG. 2 shows a quantum flux parametron (QFP)-based shift register 200 which is communicatively coupled to a set of digital-to-analog converters (DACs) 202a, 202b (only two shown, collectively 202), according to at least one illustrated implementation.

The QFP-based shift register contains a plurality of QFP-based shift register elements 204a, 204b, 204c (only three called out, collectively 204) and an inductor ladder circuit 206 that couples either inductively or galvanically to the DACs 202a, 202b of the set of DACs 202.

The QFP-based shift register elements 204 are respective QFPs, each including a respective loop of material 208, a pair of Josephson junctions 210a, 210b (two called out, collectively 210) that interrupt the respective loop of material 208, and a respective interface 212, for example an inductive interface. The loop of material 208 can be one that superconducts at a critical temperature. The interface 212 can be positioned to communicatively couple signals (e.g., flux) from address lines 214 (only one called out). The QFP based shift register 200 preferably includes at least three QFP register elements 204a, 204b, 204c, per DAC 202a of the set of DACs 202.

The inductor ladder circuit 206 includes a conductive path of material 216 with a pair of rails 216a, 216b and a plurality of inductors 218 (only one called out) in parallel with one another coupled across the rails 216a, 216b as "rungs". The inductor ladder circuit 206 also includes a number of interfaces (e.g., inductive interfaces) 220 (only one called out) positioned to communicatively couple a signal (e.g., flux) to respective DACs 202a, 202b via a complementary interface 222 (only one called out) of the DAC 202a. The conductive path of material 216 can be one that superconducts at a critical temperature.

Each of the DACs 202a, 202b of the set of DACs 202 includes a respective loop of material 224 (only one called out) and a respective pair of Josephson junctions 226a, 226b (only one pair called out) that interrupt the respective loop of material 224, the Josephson junctions 226a, 226b electrically coupled in parallel between electrical connections 225a and 225b of loop of material 224 with power line 232. Each of the DACs 202a, 202b of the set of DACs 202 includes a number of interfaces 222, 228, 230, for example inductive interfaces, to couple signals thereto. Each of the DACs 202a, 202b of the set of DACs 200 is independently addressable by a triplet of three signals, a successive number of times, to store a variable number of flux quanta. The triplet of three signals includes a first signal received via the QFP-based shift register elements 204 of the QFP-based shift register 200, a second signal received via a power line 232, and a third signal received via a trigger line 234.

Control circuitry 236 is communicatively coupled to apply signals to the power line 232, the trigger line 234 and the address lines 214. The control circuitry 236 applies signals to the power line 232, the trigger line 234 and the address lines 214 to load information (e.g., a number of flux quanta) to selected ones of the DACs 202a, 202b.

While illustrated as a first set of DACs 202 and first shift register 200, additional sets of DACs and additional associated shift registers can be employed.

FIG. 3 shows a QFP-based shift register 200 which is communicatively coupled to a set of DACs 202a, 202b (only two shown, collectively 202) via a number of intermediary QFPs 340a, 340b (only two shown, collectively 340), according to at least one illustrated implementation.

Many of the structures illustrated in FIG. 3 are similar or even identical to those illustrated in FIG. 2, and are thus denominated with the same reference numbers. In the interest of conciseness and hence clarity, only significant differences between FIG. 3 and FIG. 2 are discussed immediately below.

The intermediary QFPs 340a, 340b operate as QFP flux amplifiers that galvanically couple to respective DACs 202a, 202b of the first set of DAC 202. Each of the QFPs 340a, 340b includes a respective loop of material 342 (only one called out) and a respective pair of Josephson junctions 344a, 344b (only one pair called out) that interrupt the respective loop 342. Each of the QFPs 340a, 340b includes a respective interface (e.g., inductive interface) 346 (only one called out) to communicatively couple signals thereto. The respective loop of material 342 may superconduct at a critical temperature. Each of the QFPs 340a, 340b is communicatively coupled (e.g., galvanically or inductively) between a respective one of the DACs 202a, 220b and QFP-based shift register elements 204a, 204b, 204c of the QFP based shift register 200 via an inductor ladder circuit 206.

Figure 4:
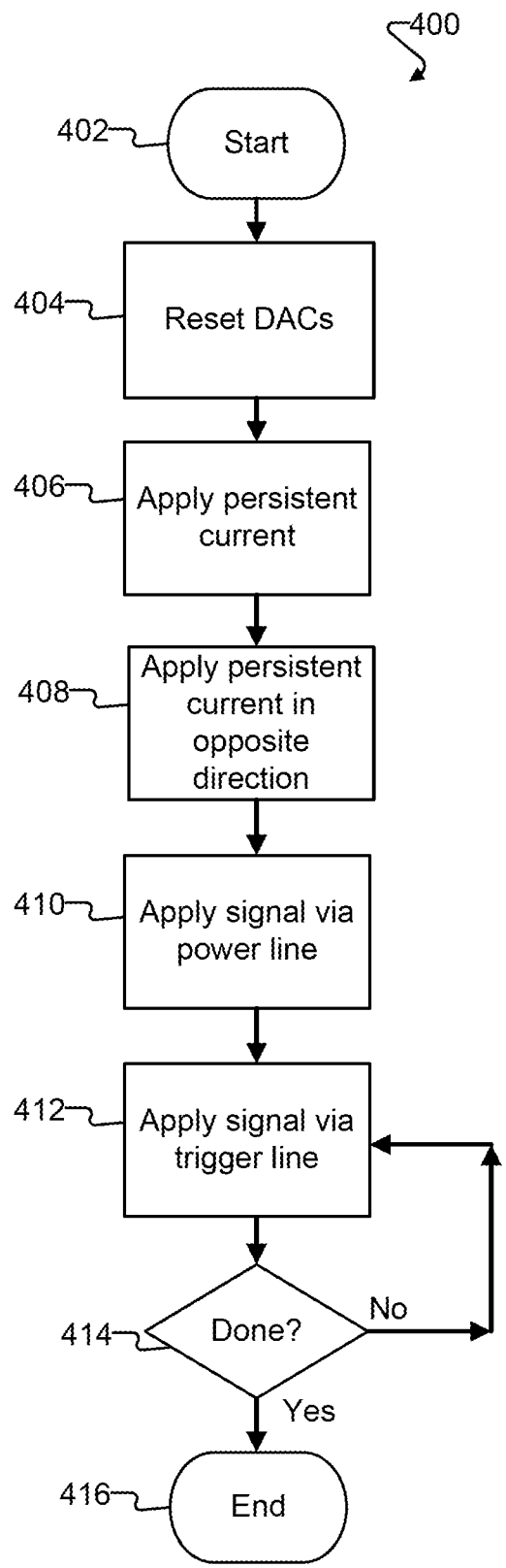
FIG. 4 is a flow diagram showing a method of operation of a circuit employing a QFP-based shift register of FIG. 2 or 3, according to at least one illustrated implementation.

FIG. 4 shows a method 400 of operation of a circuit employing a QFP-based shift register, according to at least one illustrated implementation. The method 400 can, for example, be employed with the QFP-based shift register 200 of FIG. 2 or the QFP-based shift register 300 of FIG. 3.

The method 400 starts at 402, for example in response to application of power, submission of a problem, a request or an invocation, for example by a calling routine or program.

At 404, control circuitry resets all of the DACs of the first set of DACs. To reset all of the DACs, the control circuitry may repeatedly cause application of a signal to or via the trigger line to release all flux in storage inductors.

At 406, the control circuitry causes an application of a persistent current in a first direction (e.g., clockwise) to a first number of the QFP-based shift registers which are coupled to respective DAC stages into which quantums of flux are to be added. At 408, the control circuitry causes an application of a persistent current in an opposite direction (e.g., counter-clockwise) to a second number of the QFP-based shift registers which are coupled to respective DAC stages into which quantums of flux are not to be loaded.

At 410, the control circuitry causes an application of a signal to the power line. At 412, for a first number of times, the control circuitry causes an application of a signal to the trigger line, where the first number of times is at least proportional to a total number of quantums of flux to be added. Typically, the first number of times is equal to the total number of quantums of flux to be loaded. Thus, the trigger line TRIG may be pulsed with a polarity which adds to clockwise current in selected QFP stages, and subtracts from counter-clockwise current in unselected stages, a total number of times equal to the number of pulses to written, increasing the number of SFQ quanta in storage inductors. If, at 414, the control circuitry determines a signal has not yet been applied to the trigger line for the first number of times, then the method 400 returns to 412.

When, at 414, the control circuitry determines that a signal has been applied to the trigger line for the first number of times, then the method 400 terminates at 416, until called or invoked again. Alternatively, the method 400 can continually operate.

Figure 5:
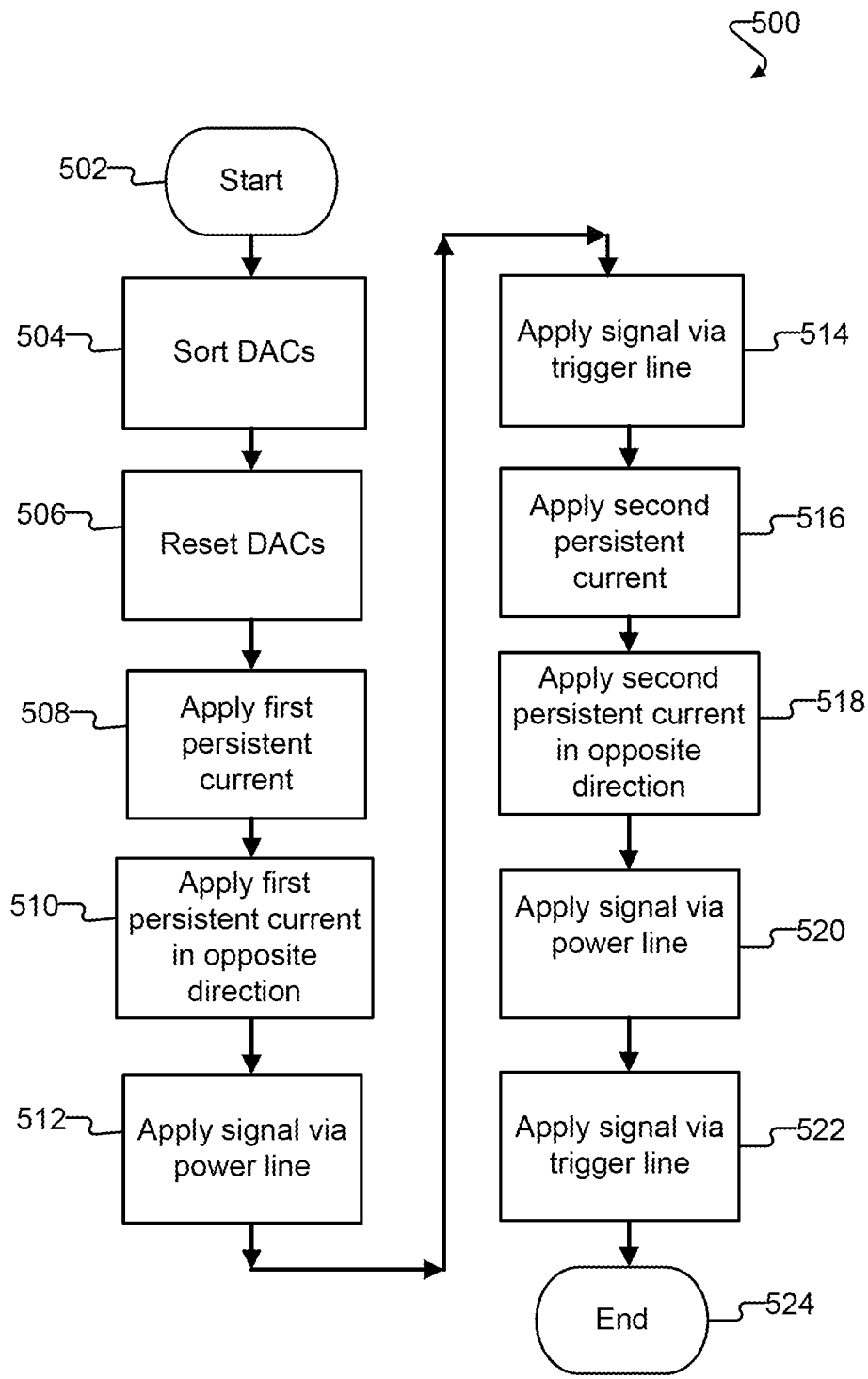
FIG. 5 shows a method of operation of a circuit employing a QFP-based shift register, which can be a specific implementation of the method of FIG. 4, according to at least one illustrated implementation.

FIG. 5 shows a method 500 of operation of a circuit employing a QFP-based shift register, according to at least one illustrated implementation. The method 500 can be a specific implementation of the method 400 (FIG. 4). The method 500 can, for example, be employed with the QFP-based shift register 200 of FIG. 2 or the QFP-based shift register 300 of FIG. 3.

The method 500 starts at 502, for example in response to application of power, submission of a problem, a request or an invocation, for example by a calling routine or program.

At 504, control circuitry sorts all of the DACs based on a number of quantums of flux to be loaded to the DACs. At 506, the control circuitry causes a reset of all of the DACs. To reset all of the DACs, the control circuitry may repeatedly cause application of a signal to or via the trigger line.

At 508, the control circuitry causes an application of a persistent current in a first direction (e.g., clockwise) to a number of the QFP-based shift registers which are coupled to respective DAC stages into which at least one quantum of flux is to be loaded. At 510, the control circuitry causes an application of a persistent current in an opposite direction (e.g., counter-clockwise) to a number of the QFP based shift register stages which are coupled to respective DACs into which less than one quantum of flux is to be loaded. At 512, the control circuitry causes an application of a signal to or via the power line. At 514, the control circuitry causes an application of a signal to or via the trigger line.

At 516, the control circuitry subsequently causes an application of a persistent current in the first direction to a number of the QFP-based shift registers which are coupled to respective DACs into which at least two quantums of flux are to be loaded. At 518, the control circuitry causes an application of a persistent current in the opposite direction to a second number of the QFP-based shift registers which are coupled to respective DACs into which less than two quantums of flux are to be loaded. At 520, the control circuitry causes an application of a signal to the power line. At 522, the control circuitry subsequently causes an application of a signal to or via the trigger line.

The method 500 terminates at 524, for example until called or invoked again.

Figure 6:
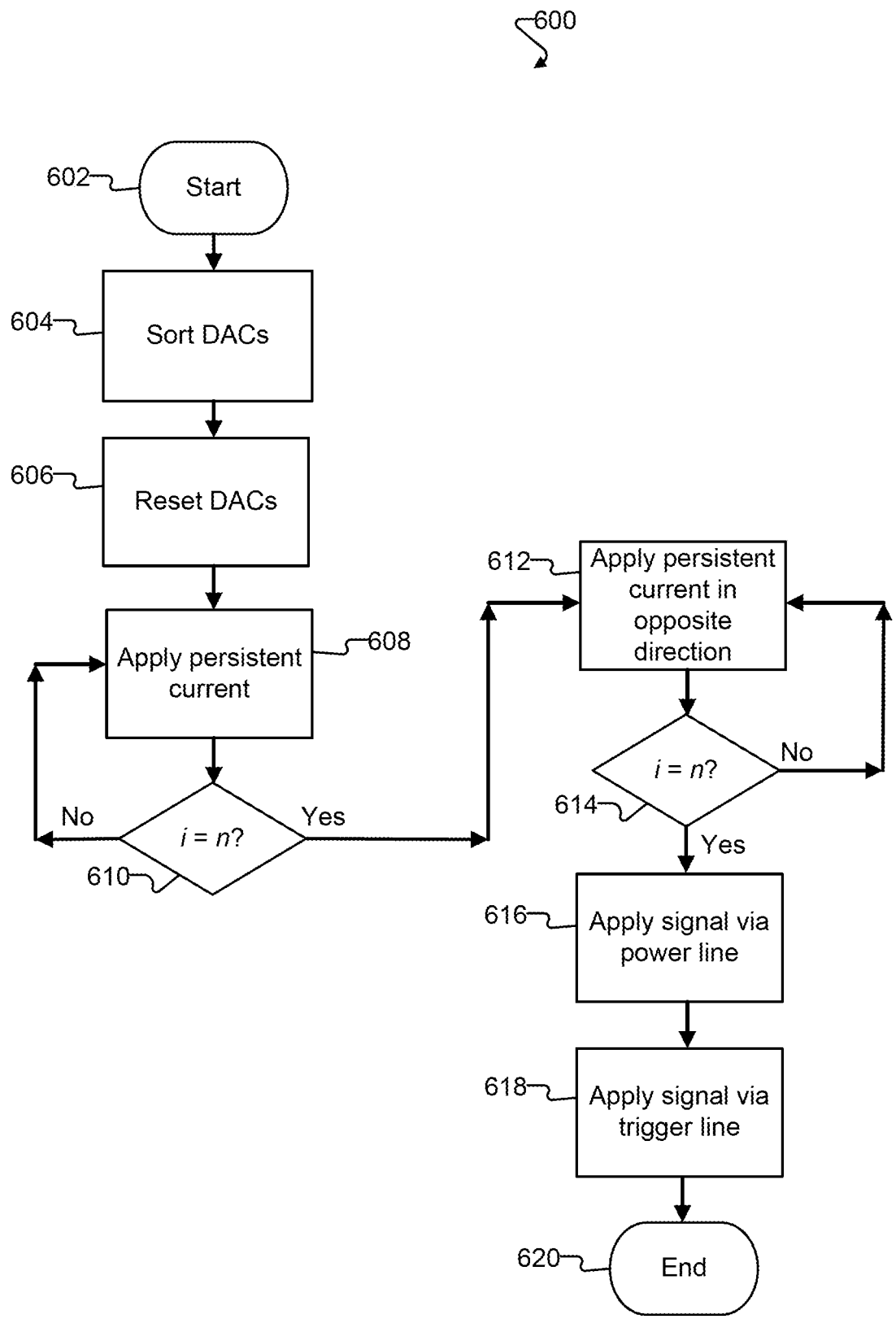
FIG. 6 shows a method of operation of a circuit employing a QFP-based shift register, which can be a generalization of the method of FIG. 4, according to at least one illustrated implementation.

FIG. 6 shows a method 600 of operation of a circuit employing a QFP-based shift register, according to at least one illustrated implementation. The method 600 can be a generalization of the method 400 (FIG. 4). The method 600 can, for example, be employed with the QFP-based shift register 200 of FIG. 2 or the QFP-based shift register 300 of FIG. 3.

To save on programming time (e.g., programming tens of thousands of qubits, 8 DACs per qubit, 16 DAC stages per qubit) the DAC stages can first be sorted by the number of pulses to be added to the respective stage (up to a maximum of single flux quanta (MAXSFQ) of, for example, about 20. Thus, there likely will be many stages with the same target number of pulses. For example, some stages may need 1 pulse, some may need 2 pulses, some other stages may need 3 pulses, etc., all the way to some stage needing 20 pulses. First, stages needing at least one pulse are selected and TRIG is pulsed once. The new pattern deselects stages which needed just one SFQ, and TRIG is pulsed twice. Notably, all others stages need 3 or more SFQ. This continues until only stages that need 20 SFQ remain, and these are subsequently selected and filled. This process in the worst case scenario requires up to MAXSFQ reprogramming cycles for the whole QFP-SR to write a new "serial program" onto the processor. This process can be further sped up by breaking QFP-SR into shorter sections, with slightly more lines going to room temperature.

The QFP-SR can also be used for qubit read-out with NDRO, rather than employing a separate structure to bring data in close to qubits to program their DACs. For reliability, a grid or array of shift register stages may be employed instead of one single long shift register. Thus, there are multiple possible paths through the QFP-SR to reach every point, and the QFP-SR can tolerate some percentage of failed devices.

The method 600 starts at 602, for example in response to application of power, submission of a problem, a request or an invocation, for example by a calling routine or program.

At 604, control circuitry sorts all of the DAC stages based on a number of quantums of flux to be loaded to the DACs. At 606, the control circuitry causes a reset of all of the DACs. To reset all of the DACs, the control circuitry may repeatedly cause application of a signal to or via the trigger line.

For an integer number i times from i equals 1 to a maximum number of quantums of flux n to be programmed, the control circuitry causes an application of a persistent current in a first direction (e.g., clockwise) to a number of the QFP-based shift registers which are coupled to respective DAC stages into which at least i quantums of flux are to be loaded at 608. If, at 610, the control circuitry determines that i<n, then control of method 600 returns to 608. If, at 610, the control circuitry determines that i=n, the control of method 600 proceeds to 612.

The control circuitry also causes an application of a persistent current in an opposite direction (e.g., counterclockwise) to a number of the QFP-based shift registers which are coupled to respective DACs into which less than i quantums of flux are to be loaded at 612. If, at 614, the control circuitry determines that i<n, then control of method 600 returns to 612. If, at 614, the control circuitry determines that i=n, the control of method 600 proceeds to 616.

At 616, the control circuitry causes an application of a signal to or via the power line. At 618, the control circuitry causes an application of a signal to or via the trigger line. The maximum number of quantums of flux n may, for example, be between 18 and 22.

The method 600 terminates at 620, for example until called or invoked again.

Quantum Flux Parametron (QFP) Digital-to-Analog Converters (DACs)

It may be desirable to achieve 4-bit control on all parameters, somewhat reduced thermal occupation of excited states compared with previous quantum processor designs, more reliable permanent magnet memory (PMM), and higher overall energy scales. At large integration scales, performance may be limited by the 4-bit control, thermal occupation, and nonlinearities on qubit Ip (which forces an increase thermal occupation by reducing energy scales to compensate and slow down processor running time).

Various significant changes to the architecture are described herein to improve qubit performance (e.g., shrink length leading to improved non-linearity of qubit Ip and faster devices), speed up calibration (e.g., no power dissipation on chip from readouts or PMMI), and improve control precision (e.g., higher max-SFQ-DACs). The described platform provides a basis on which to speed up operation by employing high bandwidth lines, and via parallelized programming and readout as Input/Output (I/O) lines are freed up and/or as I/O lines are added.

Such an approach may result in much faster programming, calibration, readout, higher control precision, and larger processors. Further, with reduced power dissipation on chip, low frequency flux noise will be reduced, since free spins with an internal energy splitting of greater than for example 100 mK will no longer have thermal energy available to switch state; in other words the 1/f corner should move to lower frequency. This, combined with shorter qubits on a quantum processor chip, may enable higher control precision without having to significantly reduce fabrication noise.

While the above described performance improvements may be gained by lower temperature and shorter qubits, there are more reasons for employing the approaches described herein. Both problem solving and calibration time are principal areas for improvement. Calibration and problem solving time depend in different ways on: 1) dc SQUID readout time; 2) number of dc SQUIDs that can be read in parallel; 3) cooldown time after dc SQUID read; 4) cooldown time after PMM programming; and 5) equilibrium temperature on chip.

DAC lock-in style measurements can be employed for quantum flux parametron-DAC (QFP-DAC) calibration and offset flux measurements, roughly one third of the full calibration). For this one third of the calibration, the fourth and fifth item above will dominate the time on previous quantum processor architectures. An improved PMM may address this problem.

The remaining part of the calibration is time-limited by readouts and cooling after readouts. At least one approach described herein solves the cooling after readout limit and can also reduce the readout time.

The designs described herein may facilitate parallel calibration and parallel readout, allowing quantum processors with 1000 qubits or more to be calibrated and operable in finite time.

Problem solving time at all moderate integration scales will depend on qubit length (sets energy scale), temperature (item five above; via required repetitions), and at the smaller scales it will depend on readout time, and in some parametric ranges PMM programming time.

Various embodiments of a QFP-Demux and DAC are described herein, which should perform as well as existing SFQ-DACs but advantageously dissipate no power, thus removing several significant portions of current cycle time. This QFP-DAC/DEMUX does not actually improve loading time, and in fact it is slightly slower for the same I/O lines. Improvements to I/O lines and parallel loading is the one way to speed this up. Final parametric design of the QFP-DAC/DEMUX is driven significantly by fabrication capabilities.

A new readout scheme is also described, which should allow reading qubits out in parallel, as well as reading qubits out at a much higher rate than existing designs (e.g., about 100× faster). Design parameters in this readout scheme are set out.

To deal with the supposed requirement, lock-in measurements can be run on the DAC where a DAC has to quickly flip the state, a non-dissipative PMM scheme is proposed in this section which removes the need for the 10 s of ms cooling between the measurements now needed and makes the measurement limited by Input/Output (I/O) bandwidth or readout time.

Figure 7A:
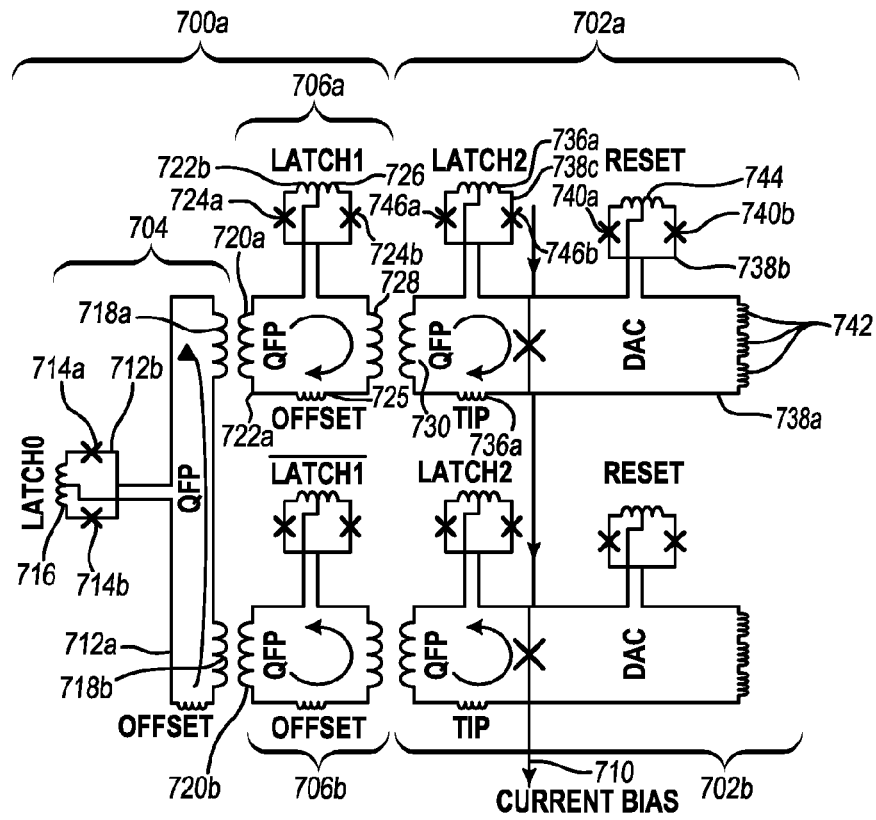
FIG. 7A shows a latch controlled quantum flux parametron demultiplexer (QFP-Demux) circuit coupled to digital-to-analog converters (DACs), according to at least one illustrated implementation.

The circuit illustrated in FIG. 7A generates the multiple flux quanta required for the DACs from the QFPs for use with a QFP demultiplexer tree. FIG. 7A shows part of the final branch of the demultiplexer tree addressed by LATCH1 and $\overline{\text{LATCH1}}$ The OFFSET signal is chosen to be the "off" direction of the QFP and is larger than the flux coupled between QFPs. Operation in this small circuit is: Set OFFSET to 0, apply LATCH1, Set offset to large value, apply $\overline{\text{LATCH1}}$. When a LATCH signal is applied, that means one moves it from $\Phi 0/2$ to $\Phi 0$, and when one is not applied it stays at $\Phi 0/2$. This can easily be achieve with only one line per level of the demux tree with an additional shared LATCH "offset" line (except the LATCH "offset" is time dependent).

Then, LATCH2 is asserted with no input at TIP. In principle, one could combine the last two QFP stages. Only one of the left hand parts of the QFP-DACs now has a positive (negative) flux quantum in it, and the rest have negative (positive) flux quanta. An input bias current is applied to the current bias shared by all DAC junctions. This can be done since only one DAC will switch at a time. Finally, a tipping pulse is applied which adds to the signal in the selected DAC and subtracts from all others. The selected DAC will have its critical current exceeded momentarily, thus shuffling the flux quanta from the QFP DAC loop into the DAC. The others will not. The LATCH2/TIP cycle can be repeated to load as many flux quanta as desired into the DAC without having to re-run the demultiplexer tree.

Since the quantum flux parametron QFP-DAC requires no power on chip, the current Ic of all junctions can be increased almost for free, although such might require a new trilayer at some point to limit growth of demux/DACs as the DAC become junction size limited. This allows reduction of inductances of DACs, shrinking the footprint of the DACs and shrinking qubit length. Such can advantageously lead to better qubits and faster processors. Notably, another metal layer or trilayer may be needed in order to implement the smaller DACs. An improved reset approach, discussed herein, may facilitate the concurrent decrease in DAC step size and improvement in precision.

Quantum flux parametron digital-to-analog converters (QFP DACs) advantageously facilitate the use of very small signals (QFP signal) into a multi-flux-quantum DAC. Such may advantageously be employed, for example, in large adiabatic quantum processors, or any quantum processor where quasi-dc magnetic fields are employed. Such can be employed with high bandwidth lines to run at multiple-GHz update rates, for example in a finite sized tree with DACs updated at hundreds of MHz rates.

FIG. 7A shows a latch controlled quantum flux parametron demultiplexer (QFP demux) circuit 700a coupled to QFP-digital-to-analog converters (QFP-DACs) 702a, 702b, according to at least one illustrated implementation. In particular, FIG. 7A shows a last stage of a QFP demux tree.

The latch controlled QFP demux circuit 700a includes a number of QFPs 704 (one shown), and for each QFP 704, a number (e.g. two) of sets or sequences of quantum flux parametron latches (QFP-latches) 706a, 706b (each sequence illustrated in FIG. 7A with only one QFP-latch). Each set or sequence of QFP-latches 706a, 706b is selectively operable to communicatively couple flux between the QFP 704 and a respective one of a first QFP-DAC 702a and a second QFP-DAC 702b of the respective pair of QFP-DACs 702a, 702b. A current bias line 710 is positioned to apply a current bias to at least both of the QFP-DACs 702a, 702b of the pair of the QFP-DACs 702, advantageously without any bias resistors.

The QFP-DACs 702 include an asymmetric DC SQUID (illustrated on the right hand side of FIG. 7A) connected by a current bias. It may be possible to remove the current bias and use a magnetic bias into a CJJ. Without that, the current bias needs no bias resistors advantageously resulting in no heat, but does require biasing all QFP-DACs 702 in series. Notably, the bias line 710 can be used to address different trees as well.

The QFP 704 can serve as an input or a node in a tree structure, between branches of the tree structure. The QFP 704 includes a first loop of material 712a, a second loop 712b of material that interrupts the first loop of material 712a, and a pair of Josephson junctions 714a, 714b that interrupt the second loop of material 712b. The second loop 712b includes an interface (e.g., inductive interface) 716 that receives a signal, for example signal denominated as LATCH0. The first loop of material 712a includes a pair of interfaces (e.g., inductive interfaces) 718a, 718b positioned to communicatively couple a signal (e.g., flux) to interfaces 720a, 720b of respective first QFP latches 706a, 706b of the first set or sequence and the second set or sequence of QFP latches 706a, 706b (only one shown in each set or sequence). The first and second loops of material 712a, 712b of the QFP 704 can, for example, be a material that is superconductive at or below a critical temperature.

The first QFP latches 706a, 706b of the first and second set or sequence of QFP latches 706a, 706b each include a first loop of material 722a (only one called out in FIG. 7A), a second loop of material 722b (only one called out in FIG. 7A) that interrupts the first loop of material 722a, and a pair of Josephson junctions 724a, 724b (only one pair called out in FIG. 7A) that interrupt the second loop of material 722b. The first loop includes an interface (e.g., inductive interface) 725 that receives a signal, for example signal denominated as OFFSET. The second loop 722b includes an interface (e.g., inductive interface) 726 that receives a signal, for example a signal denominated as LATCH1 or $\overline{\text{LATCH1}}$. Opposite current flows (e.g., clockwise and counterclockwise, as illustrated by arrows in the first loops 722a of the first QFP latches 706a, 706b) can be established in the first loops 722a by applying opposite signals LATCH1 or $\overline{\text{LATCH1}}$ to the interfaces 726 of the second loops 722b of the first QFP latches 706a, 706b. The first loop of material 722a includes a further interface (e.g., inductive interface) 728 (only one called out in FIG. 7A) positioned to communicatively couple a signal (e.g., flux) to interfaces 730 (only one called out in FIG. 7A) of either respective second QFP latches of the sets or sequences of QFP latches 706a, 706b or of the QFP-DACs 702a, 702b. The first and second loops 722a, 722b of material of the first QFP latch 706a, 706b can, for example, be a material that is superconductive at or below a critical temperature.

The QFP-DACs 702a, 702b each include a first loop of material 738a (only one called out in FIG. 7A), a second loop of material 738b (only one called out in FIG. 7A) that interrupts the first loop of material 738a, and a pair of Josephson junctions 740a, 740b (only one pair called out in FIG. 7A) that interrupt the second loop of material 738b. The first loop 738a includes a number of interfaces (e.g., three inductive interfaces) 742, for example to read out a signal stored in the QFP-DACs 702a, 702b. The second loop 738b includes an interface (e.g., inductive interface) 744 that receives a signal, for example a signal denominated as RESET, operable to reset a value of the QFP-DACs 702a, 702b. The sets or sequences of QFP latches 706a, 706b are operable to demux a signal received via the QFP 704 into the QFP-DACs 702a, 702b, which can eventually be read out of the QFP-DACs 702a, 702b. The first and second loops of material of the QFP-DACs 702a, 702b can, for example, be a material that is superconductive at or below a critical temperature.

The QFP-DACs each include a third loop of material 738c (only one called out in FIG. 7A) that interrupts the first loop of material 738a, and a pair of Josephson junctions 746a, 746b (only one pair called out in FIG. 7A) that interrupt the third loop of material 738c. The first loop 738a includes an interface (e.g., inductive interface) 736a that receives a signal, for example signal denominated as TIP. The third loop 738c includes an interface (e.g., inductive interface) 736b that receives a signal, for example a signal denominated as LATCH2. Opposite current flows (e.g., clockwise and counterclockwise, as illustrated by arrows in the first loops 738a of the QFP-DACs 702a, 702b) can be established by establishing opposite current flows in the first loops 722a of the QFP latches 706a, 706b. The first, second, and third loops of material 738a, 738b, 738c of the QFP-DACs 702a, 702b can, for example, be a material that is superconductive at or below a critical temperature.

Figure 7B:
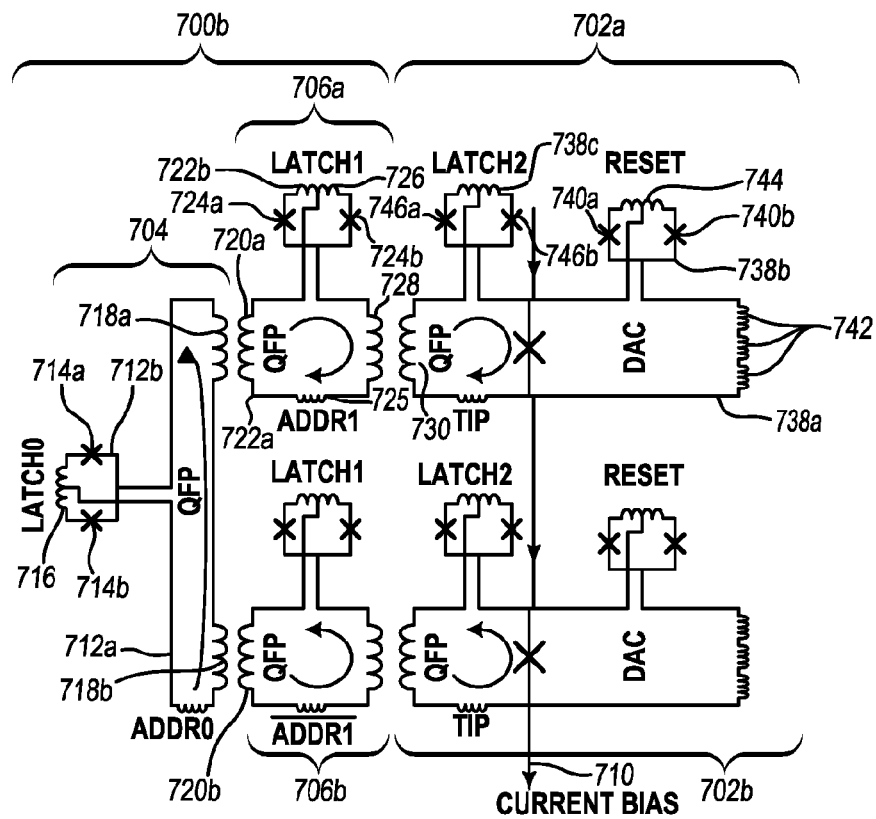
FIG. 7B shows a body flux (address) controlled quantum flux parametron demultiplexer (QFP-Demux) circuit coupled to digital-to-analog converters (DACs), according to at least one illustrated implementation.

FIG. 7B shows a body flux (address) controlled quantum flux parametron demultiplexer (QFP-Demux) circuit 700b coupled to digital-to-analog converters (DACs), according to at least one illustrated implementation. In particular, FIG. 7B shows a last stage of a QFP demux tree.

Many of the structures illustrated in FIG. 7B are similar or even identical to those illustrated in FIG. 7A, and are thus denominated with the same reference numbers. In the interest of conciseness and hence clarity, only significant differences between FIG. 7B and FIG. 7A are discussed immediately below.

In contrast to the implementation of FIG. 7A, the implementation of FIG. 7B applies the same LATCH1 signal to both first QFP latches 706a, 706b, and instead of applying the same OFFSET signal to both first QFP latches 706a, 706b, controls the direction of current flow by applying opposite address signals denominated as ADDR1 and $\overline{\text{ADDR1}}$ to first QFP latches 706a, 706b via address lines.

Note that the demultiplexer works as well in broadcast mode, and also one can generate signals starting in the middle of the tree using the OFFSET line. One can load positive and negative pulses. Reset is accomplished in the same way as with a SFQ-DAC. Optionally, all of the QFP-DACs can be unloaded by over-biasing the Josephson junction of the QFP-DAC, and then causing the bias current to fluctuate while the Josephson junctions of the QFP-DACs are suppressed to allow escape of metastable magnetic flux quanta. Enough fluctuations of the bias current may result in a known state.

The QFP demux can be collapsed by approximately 5 bits by using direct addressing (see FIG. 7B). For example, five address lines can be summed logarithmically into a QFP body. This may be advantageously employed to handle the physically large part of the tree (e.g., the first few addresses).

In some implementations, the QFP-DAC is run in uncontrolled MFQ mode to increase loading speed by unshunting the DAC junction and over current biasing during tipping. This may, for example, be useful for QFP-DACs used just as nonlinear amplifiers in the readout chain.

The implementation of LATCH and $\overline{\text{LATCH}}$ pairs is optimally done via a global LATCHOFFSET line (not shown in FIG. 7B) and a single LATCH per tree level.

The LATCH addressed demultiplexer can be run as a multiplexer, which could be used for readout.

Further, if truly line limited, the compound Josephson junctions (CJJs) of the QFP DAC could intentionally be asymmetrized, allowing omission of the global offset line in the LATCH addressed implementation (FIG. 7A). Such would, however, result in reduced margins since one cannot toggle the "offset" on and off anymore.

As designed, the QFP demux circuit can have a loading bandwidth of one third to one half that of a comparable SFQ demux circuit.

A new reset approach can be implemented as part of the QFP demux circuit of FIGS. 7A and/or 7B. In particular, such can employ four shunted junctions in parallel with each loop, biased equally to provide an improved reset than might otherwise be realized. This can be effectively thought of as a DC SQUID where both the junctions and the main loop are suppressed. Suppression of the junctions removes asymmetry issues and beta limited modulation. It appears to be somewhat better than a normal shunted reset in the presence of asymmetry. With the QFP-DAC, MAX-SFQ may be able to be significantly over-designed without any penalty and, thus, may reduce the reset junction sizes and win more reliable reset that way. The benefit of this reset is that it resets to zero flux quanta even for significant asymmetry in the loop while the shunted two junction reset has a final state dependent on asymmetry of the two junctions.

The use of sufficiently short power pulses for fast lock-in style measurements may facilitate a reduction in the typical cooling time employed with permanent magnetic memory, for example from tens of milliseconds to tens of microseconds.

Figure 8:
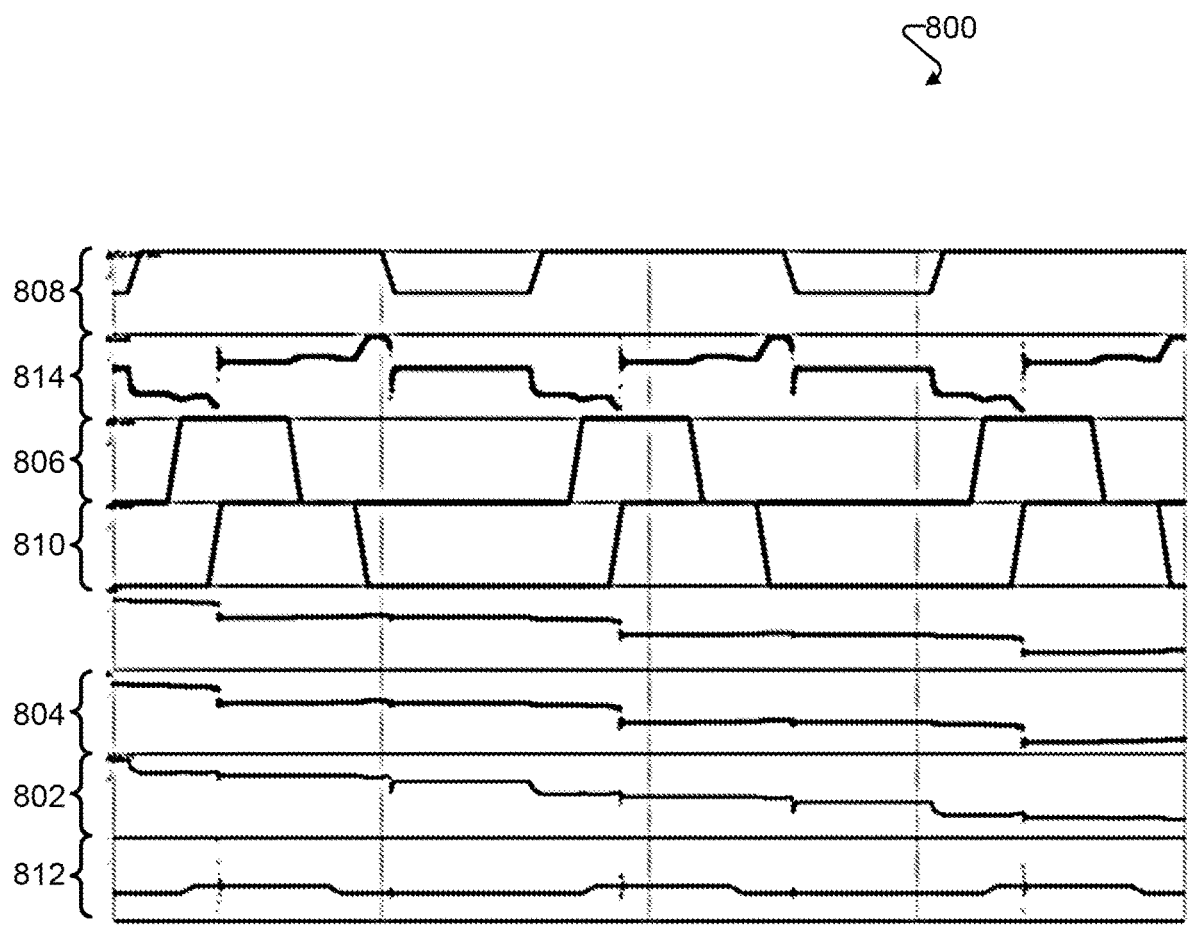
FIG. 8 is a graph of a plot of signals associated with the latch controlled QFP-Demux circuit of FIG. 7A, according to at least one illustrated implementation.

FIG. 8 shows a plot 800 of signals associated with the latch controlled QFP demux circuit of FIG. 7A.

In particular, the plot 800 is a WRSPICE simulation of the QFP-DAC without the demux; the demux is simulated as a flux input.

The plot 800 shows the value of the phase 802 and the current 804 near the bottom of the plot 800, as three pulses are loaded into the QFP-DAC. The plot 800 also shows the value of a fake demux input signal 806, the latch signal 808, and tipping pulse 810, and the bias current 812. The plot 800 also shows the value of the QFP junction phase 814. Note the reset is noisy on the QFP-DAC because the correct input signal was not applied via the tip line to make the QFP-DAC run reversibly, thus the QFP-DAC loading is not adiabatic. If the input signal (fake last demux stage) is reversed, no flux is pumped into the loop.

Multi Junction Superconductive Quantum Interface Device (SQUID) Flux-Pump Useful for Multi-Phase Flux DAC Addressing with No Galvanic Select An existing architecture uses an X-Y-Z addressing scheme to select DACs for programming. One of these lines, sometimes denominated as the POWER line, is galvanically connected to the DAC SQUID loop. However, the galvanic connection from the POWER line to the DACs makes awkward some alternative intra-DAC coupling schemes such as, for example, galvanically shared inductance, such as one might otherwise be able to do if using a Josephson DAC, or DAC constructed from a high kinetic inductance material.

The other two lines, denominated as ADDRESS and TRIGGER, are degenerate in their action on selecting the DAC, meaning that when the sum of their biases crosses a threshold value, selection of that DAC is enabled (contingent on POWER). At the operating point, the POWER signal is not orthogonal from ADDRESS and TRIGGER lines. The operating margins using three relatively non-orthogonal biases in this way are in some sense reduced over what they might be were one to use X-Y addressing, and this approach would, thus, not scale well to higher dimensional addressing schemes, with the available operating margins decreasing something like 1/(number of addressing dimensions).

Both of these problems are ameliorated to some extent by the addressing scheme described below, as: (1) no galvanic connection to the DAC by addressing circuit is required; and (2) the control signals of a flux pump are relatively more orthogonal.

Figure 9:
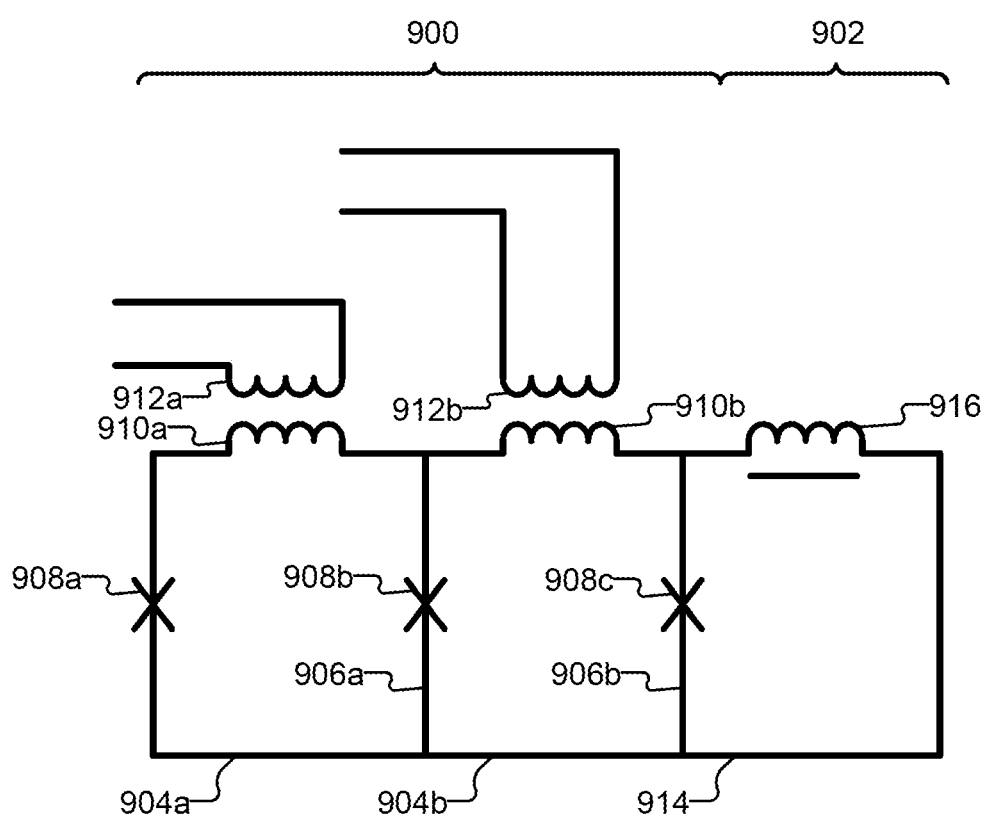
FIG. 9 shows a three-junction two-loop flux pump addressing a digital-to-analog converter (DAC), according to at least one illustrated implementation.

FIG. 9 shows a three-junction two-loop flux pump circuit 900 addressing a digital-to-analog converter (DAC) 902, according to at least one illustrated implementation.

The illustrated three-junction two-loop flux pump circuit 900 includes two loops 904a, 904b (collectively 904). Each of the loops 904 has a shared portion 906a, 906b (collectively 906) shared by a successively adjacent one of the loops 904. The three-junction two-loop flux pump circuit 900 includes three Josephson junctions 908a, 908b, 908c. Each of the shared portions 906 of the loops 904 shared by the successively adjacent one of the loops 904 is interrupted by a respective one of the Josephson junctions 908a, 908b, 908c. Each of the loops 904 of the three-junction two-loop flux pump 900 has a respective storage inductance 910a, 910b.

Two interfaces 912a, 912b are positioned with respect to respective storage inductances 910a, 910b of the loops 904 to selectively communicatively couple a flux $\Phi_{xa}$, $\Phi_{xb}$ therewith. Each loop 904 may be comprised of a material that superconducts at least at a critical temperature.

A DAC 902 is coupled to an end most one of the loops 904b of the first multi junction SQUID flux-pump circuit 900. The loop of The DAC includes a loop 914 that includes a shared portion 906b that is shared by the end most loop 904b of the first multi junction SQUID flux-pump circuit 900. The DAC 902 includes a storage inductance 916. The storage inductance 916 of the DAC 902 is at least one of a magnetic inductance, a kinetic inductance, a Josephson inductance, or a combination of two or more of a magnetic inductance, a kinetic inductance, and a Josephson inductance. The DAC 902 may be comprised of a loop of a material that superconducts at least at the critical temperature.

Figure 10:
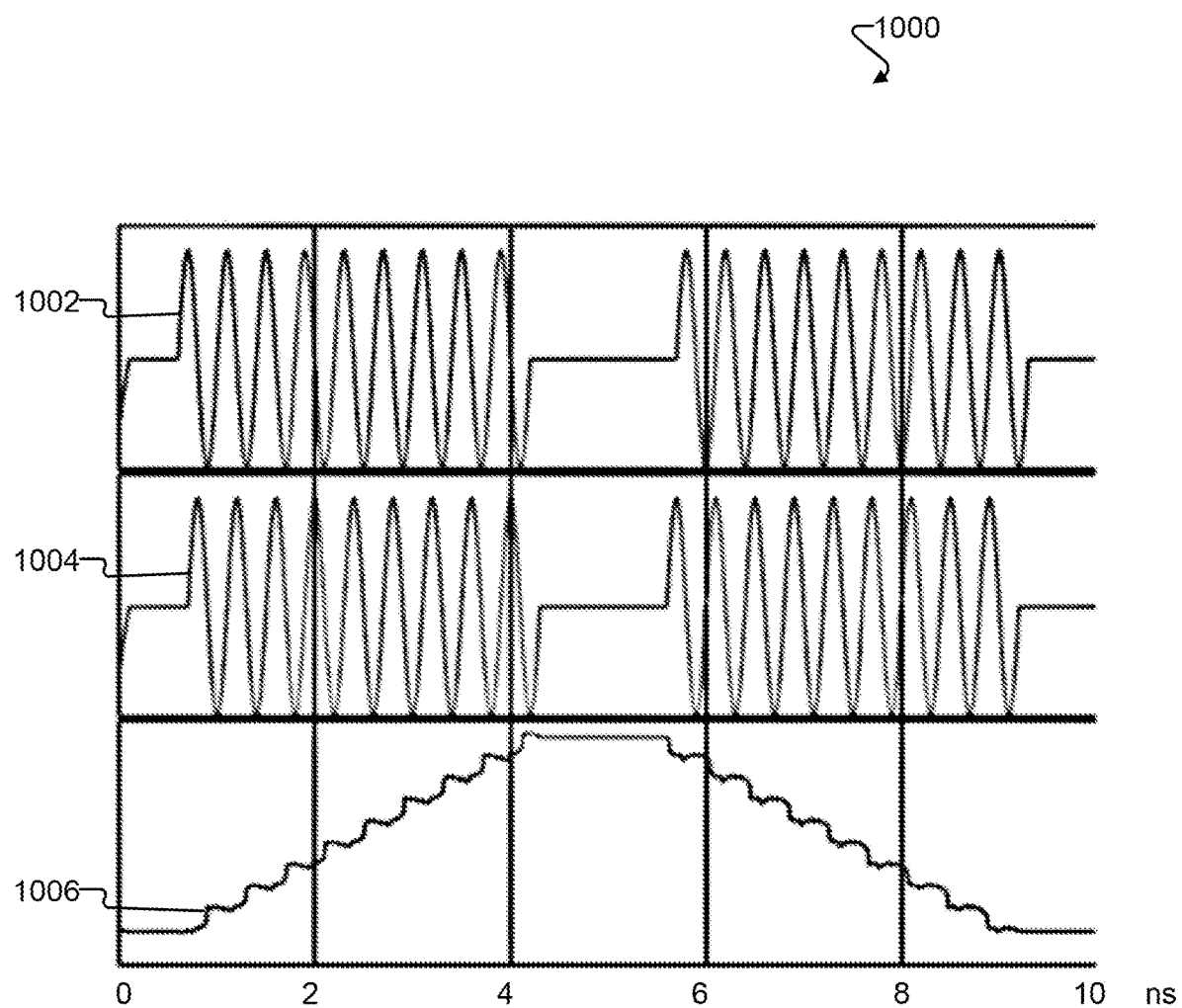
FIG. 10 is a graph showing a plot of applied flux waveforms and Josephson phase of the end-most junction for programming/deprogramming pattern for the three-junction two-loop flux pump of FIG. 9, according to at least one illustrated implementation.

FIG. 9 shows the most basic incarnation, where a two loop, three-junction flux pump is connected to a single superconducting storage inductor. The size of the inductor and flux-pump junctions determine the maximal useful capacity of the DAC. FIG. 10 shows a programming/deprogramming pattern, applied flux waveforms 1002 and 1004, for the three-junction two-loop flux pump of FIG. 9. The Josephson phase 1006 of junction 908c of FIG. 9, also shown, is 2π times the total number of flux quanta in the loop.

One mode of programming operation, illustrated in FIG. 10, shows how applied flux $\Phi_{xa}$, can be used to push flux into and out of the 908a/908b loop, which applied flux $\Phi_{xb}$ can be used to do so for the 908b/908c loop. If operated together, with the phase of clock $\Phi_{xa}$, advanced relative to $\Phi_{xb}$ by π/2, flux will be pushed through the pump into the DAC with one $\Phi_0$ per cycle of programming signal. If $\Phi_{xa}$ is retarded by π/2 relative to $\Phi_{xb}$, flux will be pumped out of the loop, or negative flux pumped in. The three clock pulse bursts in FIG. 10 show N$\Phi_0$ being pumped into the loop, 2N$\Phi_0$ being pumped out, and N$\Phi_0$ being pumped back in.

Figure 11:
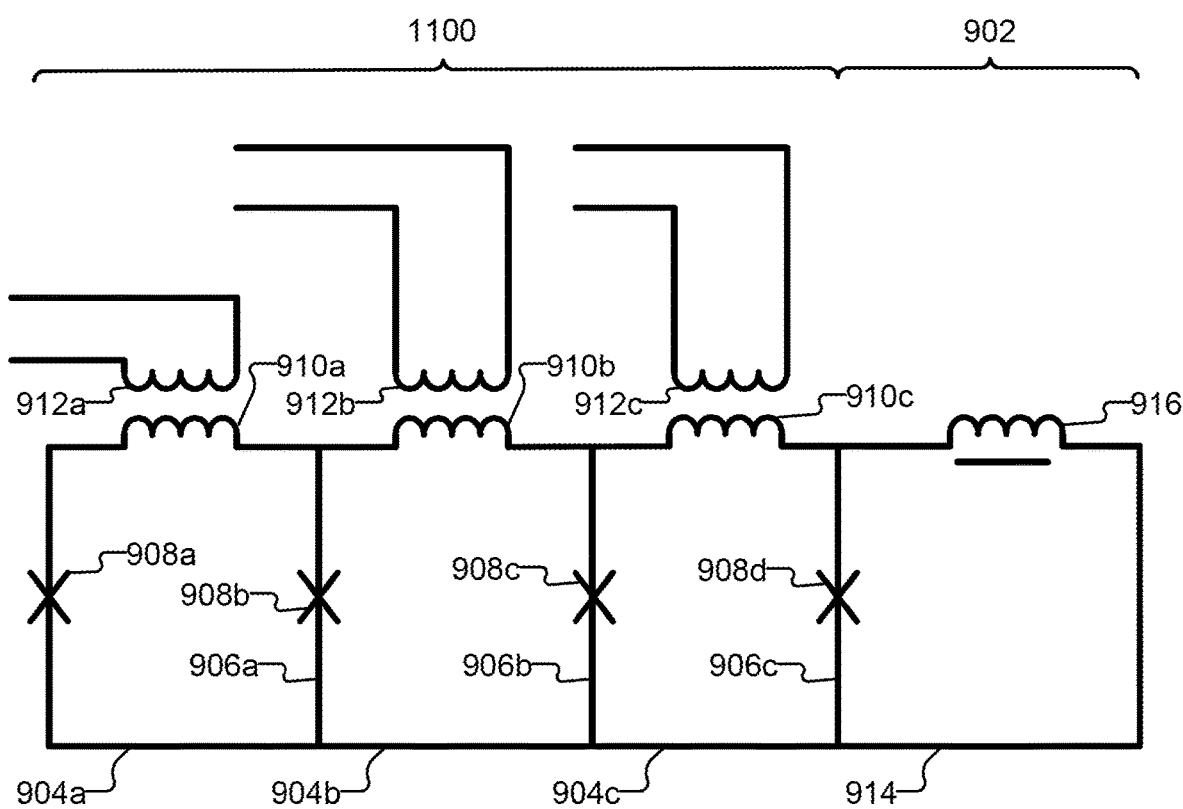
FIG. 11 is a schematic diagram of a four-junction three-loop flux pump circuit addressing a digital-to-analog converter (DAC), according to at least one illustrated implementation.

FIG. 11 shows a four-junction three-loop flux pump circuit 1100 addressing a digital-to-analog converter (DAC) 902, according to at least one illustrated implementation.

The four-junction three-loop flux pump circuit 1100 is similar to the three-junction three-loop flux pump 900 (FIG. 9) but adds a loop thereto. Similar or even identical structures are identified using the same references numbers as used in FIG. 9 and the accompanying discussion of FIG. 12A. In the interest of conciseness and hence clarity, only significant differences between FIG. 11 and FIG. 9 are discussed immediately below.

As illustrated the four-junction two-loop flux pump adds a third loop 904c, a fourth Josephson junction 908d, and a third storage inductance 901c in the third loop 904c. A third interface 912c is positioned with respect to the third storage inductance 910c to selectively communicatively couple a flux $\Phi_{xc}$ therewith. As previously noted, each loop 904 may be comprised of a material that superconducts at least at a critical temperature.

Figure 12A:
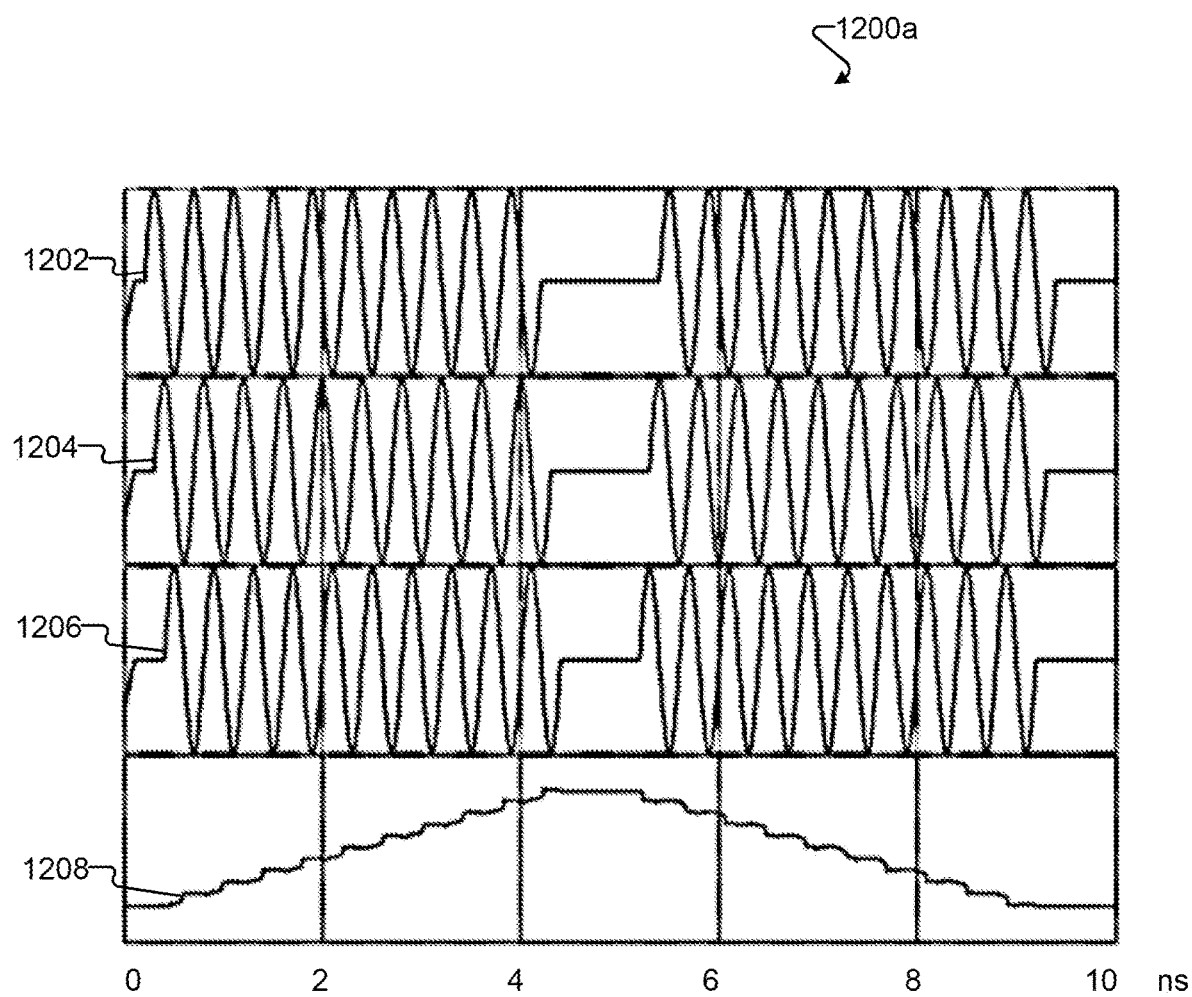
FIG. 12A is a graph showing a plot of applied flux waveforms and Josephson phase of the end-most junction for programming/deprogramming pattern for the four-junction two-loop flux pump of FIG. 11, according to at least one illustrated implementation.

FIG. 12A shows a plot 1200a of applied flux waveforms 1202 to 1206 and a Josephson phase 1208 of the end-most junction 908d for programming/deprogramming pattern for the four-junction two-loop flux pump of FIG. 11, according to at least one illustrated implementation.

While illustrated with two loops and three Josephson junctions as well as with three loops and four Josephson junctions, the teachings herein are extendible to even more loops and Josephson junctions. Increasing the number of loops may make it possible for flux to be stored within the pump without applied bias, and activation of a few of the clocks would be enough to put the flux in the loops.

One of the advantages of avoiding a galvanic select line (e.g., POWER line in at least some existing implementations) is that such allows successive DAC storage loops to be galvanically connected without being concerned about other galvanic connections on the source side, which might in turn result in other undesired current return paths. This could be of particular benefit for multistage DACs with kinetic inductance based storage elements, such as with a Josephson DAC or large A thin film TiN, NbN, NbTiN, or granular aluminum. In this case, the design of the division ratio may be simplified by using shared inductance in articulated storage loops, rather than having each magnetically coupled into an articulated washer as is done in at least some existing architectures.

Figure 12B:
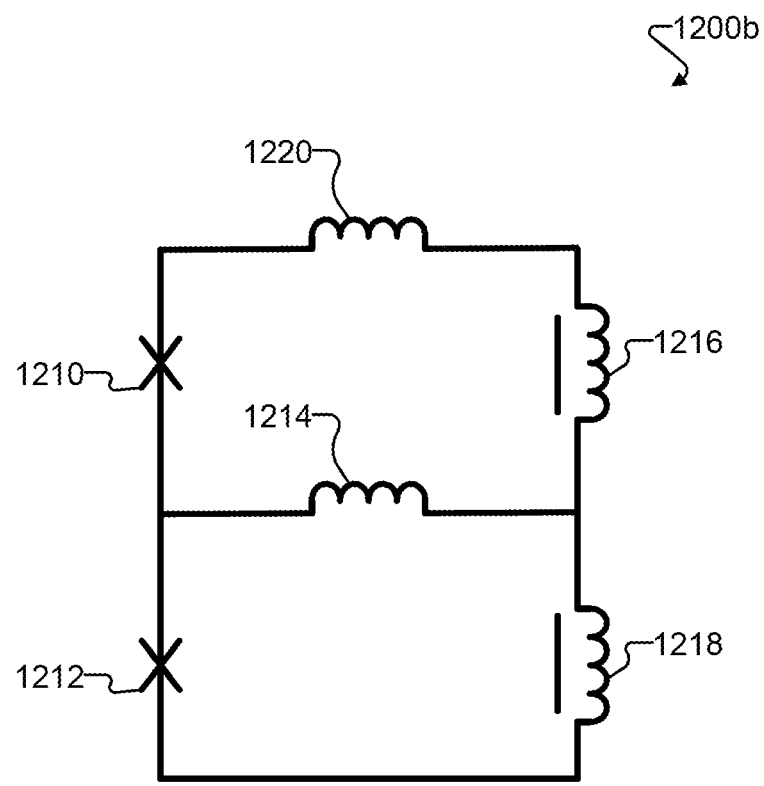
FIG. 12B is a schematic diagram of a direct galvanic connection between two flux DACs, according to at least one illustrated implementation.

FIG. 12B is a schematic diagram of a circuit 1200b that includes a direct galvanic connection between two flux DACs, according to at least one illustrated implementation. Junctions 1210 and 1212 are input junctions to a respective DAC, corresponding, for example, to 908d in FIG. 11. The division ratio may be determined from the values of shared inductance 1214 of the two DAC loops and their respective storage inductances 1216 and 1218. Circuit 1200b includes inductance 1220.

Figure 13:
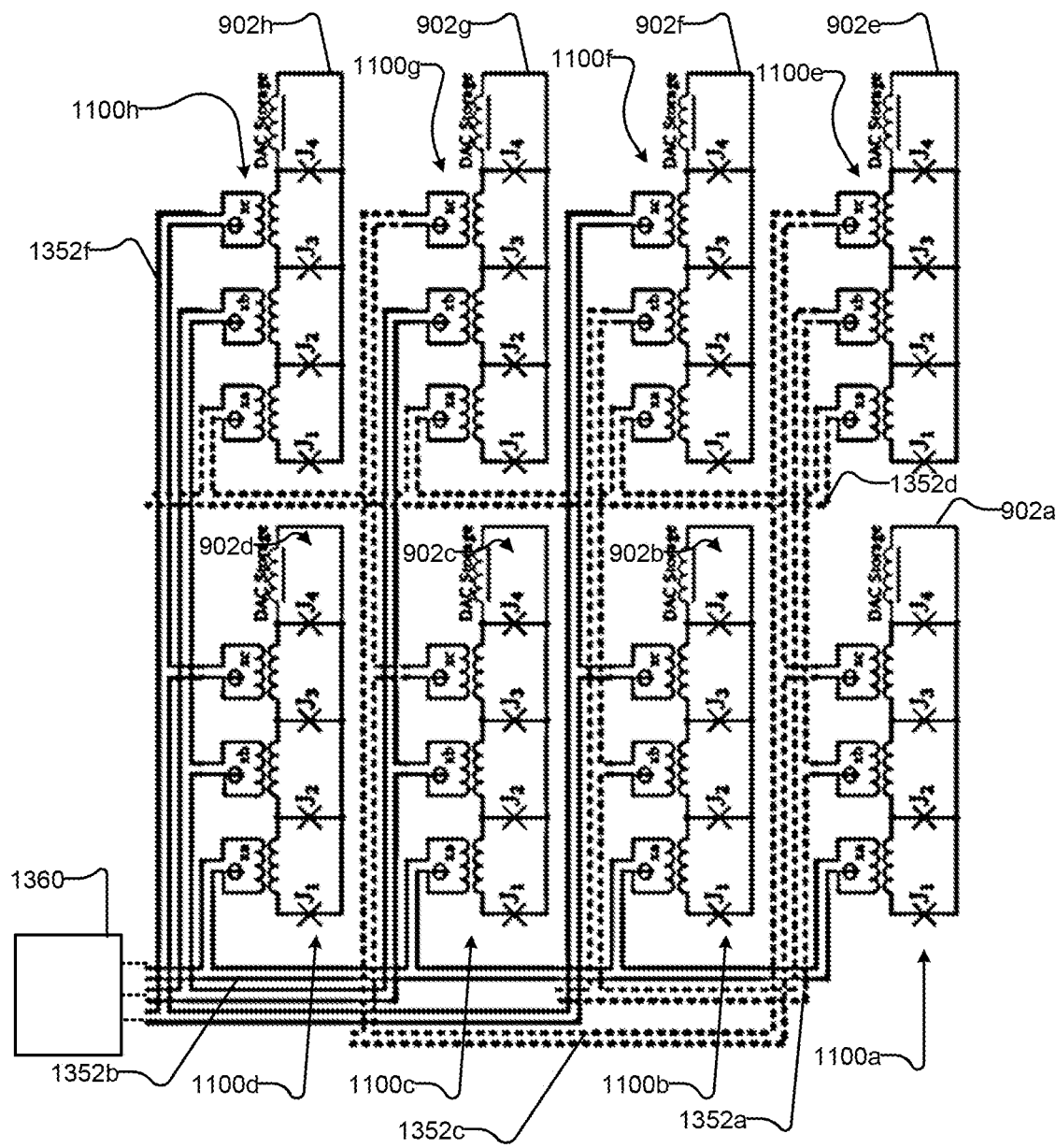
FIG. 13 is a schematic diagram of eight sets of four-junction three-loop flux pump circuits addressing respective digital-to-analog converters (DACs), via a number of address lines, according to at least one illustrated implementation.

With multiple phases, an X-Y-Z addressing scheme is possible, for example as illustrated in FIG. 13. FIG. 13 shows eight sets of four-junction three-loop flux pump circuits 1100a, 1100b, 1100c, 1100d, 1100e, 1100f, 1100g, 1100h (collectively 1100) addressing respective digital-to-analog converters (DACs) 902a, 902b, 902c, 902d, 902e, 902f, 902g, 902h (collectively 902), via a number of address lines 1352, according to at least one illustrated implementation.

The four-junction three-loop flux pump circuits 1100 may, for example, be identical to the four-junction three-loop flux pump circuit 1100 (FIG. 11). The DACs 902 may, for example, be identical to the DACs 902 (FIG. 11). Similar or even identical structures are identified using the same references numbers as used in FIG. 11 and the accompanying discussion of FIG. 14. In the interest of conciseness and hence clarity, description of the structure will not be repeated, and the description will focus on the X-Y-Z addressing scheme used to address the set or array of four-junction three-loop flux pump circuits.

In particular, eight DACs 902 are addressed with eight three-phase flux pumps 1100, operated by (2+2+2) clock lines. Among the set of devices, a particular phase is operated by one of N lines (two in FIG. 13, indicated by solid vs dashed). Making the selection possible, lines for each phase completely specify which DAC is addressed. A selection is made at each phase, choosing between solid or dashed line of each color.

A first set of control lines may include a first subset of control lines to address a first subset of the multi junction SQUID flux-pump circuits, for example a first column of multi junction SQUID flux-pump circuits 1100a-1100d, and a second subset of control lines to address a second subset of the multi junction SQUID flux-pump circuits, for example a second column of multi junction SQUID flux-pump circuits 1100e-1100h.

For example, the first subset of control lines may include a first control line 1352a coupled to respective interfaces of a first loop of each multi junction SQUID flux-pump circuit 1100a-1100d of the first subset, a second control line 1352b coupled to respective interfaces of a second loop of each multi junction SQUID flux-pump circuits 1100a-1100d of the first subset, and a third control line 1352c coupled to respective interfaces of a third loop of the multi junction SQUID flux-pump circuits 1100a-1100d of the first subset.

For example, the second subset of control lines may include a first control line 1352d coupled to respective interfaces of a first loop of each multi junction SQUID flux-pump circuit 1100e-1100h of the second subset, a second control line 1352e coupled to respective interfaces of a second loop of each multi junction SQUID flux-pump circuits 1100e-1100g of the second subset, and a third control line 1352f coupled to respective interfaces of a third loop of the multi junction SQUID flux-pump circuits 1100e-1100h of the third subset.

The first set of control lines 1352a-1352f (collectively 1352) may include a number $N_{ctrl}$ of control lines, where $N_{ctrl}=2\times N$, and where there are total number $N_{fp}$ of multi junction SQUID flux-pumps and $N_{fp}$ is equal to $2(N+1)$.

Control circuitry 1360 is communicatively coupled and operable to implement a multi-phase radio frequency (RF) clocking of flux signals with no direct current (DC) bias to the loops of the multi junction SQUID flux-pump circuits 1100.

The multi-phase radio frequency (RF) clocking of flux signals pushes flux sequentially through the loops of the first multi junction SQUID flux-pump into the DAC 902. The multi-phase radio frequency (RF) clocking of flux signals pushes flux sequentially through the loops of the multi junction SQUID flux-pump circuit(s) 1100 out of the DAC 902. A total number of phases of the multi-phase radio frequency (RF) clocking of flux signals is equal to the total number N of loops of the multi-junction SQUID flux-pump circuit(s) 1100 into the DAC 902.

For example, the control circuitry 1360 may sequentially apply flux signals to successive loops of the multi junction SQUID flux-pump circuit(s) 1100 via a first number N of interfaces where a respective flux signal applied to each interface is advanced by $\pi/2$ with respect to a respective flux signal applied to an immediately following loop along a linear succession of the loops the multi junction SQUID flux-pump circuit 1100.

Also for example, the control circuitry 1360 may sequentially apply flux signals to successive loops of the multi junction SQUID flux-pump circuit(s) 1100 via the first number N of interfaces where a respective flux signal applied to each interface is retarded by $\pi/2$ with respect to a respective flux signal applied to an immediately following loop along a linear succession of the loops the multi junction SQUID flux-pump circuit(s) 1100.

In general, with an n-phase clocking scheme, an incomplete pattern (e.g. a pattern missing a clock signal on one or more of the phases) will interfere with transmitting the flux quanta through the pump. At least for some parameter values, and for some combinations of clocks, this interference is not complete, and partial clocking can transmit pulses. However, blocking pulses can advantageously be used on an otherwise quiescent line to effect, for example, normal X-Y-Z select behavior. This is shown in the plot 1400 of FIG. 14.

Figure 14:
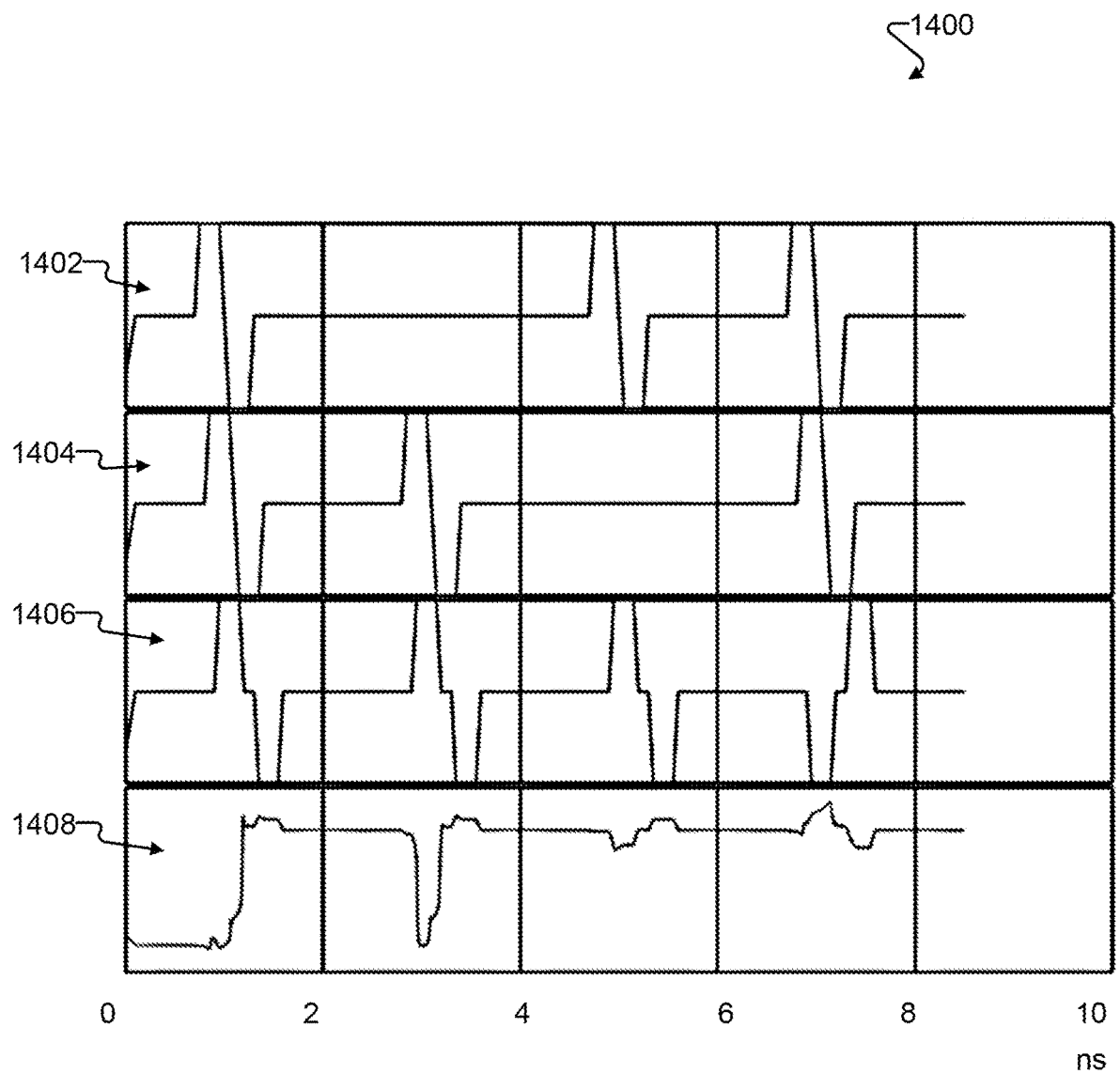
FIG. 14 is a graph showing a plot of applied flux waveforms and a Josephson phase of the end-most Josephson junction for programming/deprogramming pattern for the four-junction two-loop flux pump of FIG. 11, according to at least one illustrated implementation.

FIG. 14 shows a plot 1400 of applied flux waveforms and a Josephson phase of the end-most junction 908d for programming/deprogramming pattern for the four-junction two-loop flux pump of FIG. 11, according to at least one illustrated implementation.

In particular, the plot 1400 shows three clock signals 1402, 1404, and 1406, and one phase 1408 of the last-most Josephson junction 908d in the flux pump, demonstrating the X-Y-Z select capability. Notably, the last sequence employs a blocking pulse of opposite magnitude on the third clock phase.

The sequence shows one successful addressing of the DAC, with the attendant phase advance in the flux pump's output junction, and three partial (⅔) selects which do not result in phase advance. The third partial select is the challenging case, and requires a blocking pulse (clock pulse with the opposite magnitude) to prevent addressing the DAC. The requirement of a blocking pulse does not limit the X-Y-Z addressing scheme, although it would apply an additional constraint in computing parallel DAC loading schemes.

FIGS. 9-14 and the accompanying discussion make clear that at least a multi junction superconducting quantum interface device (SQUID) flux-pump can comprise: a number N of loops where N is an integer greater than or equal to two and each loop comprises a material that superconducts at least at a critical temperature, each of the loops having a portion shared by a successively adjacent loop, a number M of Josephson junctions, where M is greater than N, each of the portions of the loops shared by the successively adjacent loop interrupted by at least one of the Josephson junctions, each of the loops having a respective storage inductance; and a first number N of interfaces positioned with respect to respective loops to selectively communicatively couple a flux therewith. The loops of the multi junction SQUID flux-pump form a linear array of loops. The number N may be an integer, for example, from 2 to 4 inclusive. The number M is equal to the sum N+1.

A DAC is coupled to an end most loop of the multi junction SQUID flux-pump, the DAC comprising a loop of a material and a storage inductance. The loop of the DAC includes a portion shared by the end most loop of the multi junction SQUID flux-pump. The interfaces may each be a respective inductive interface positioned proximate the storage inductances of respective loops of the multi junction SQUID flux-pump.

Figure 15:
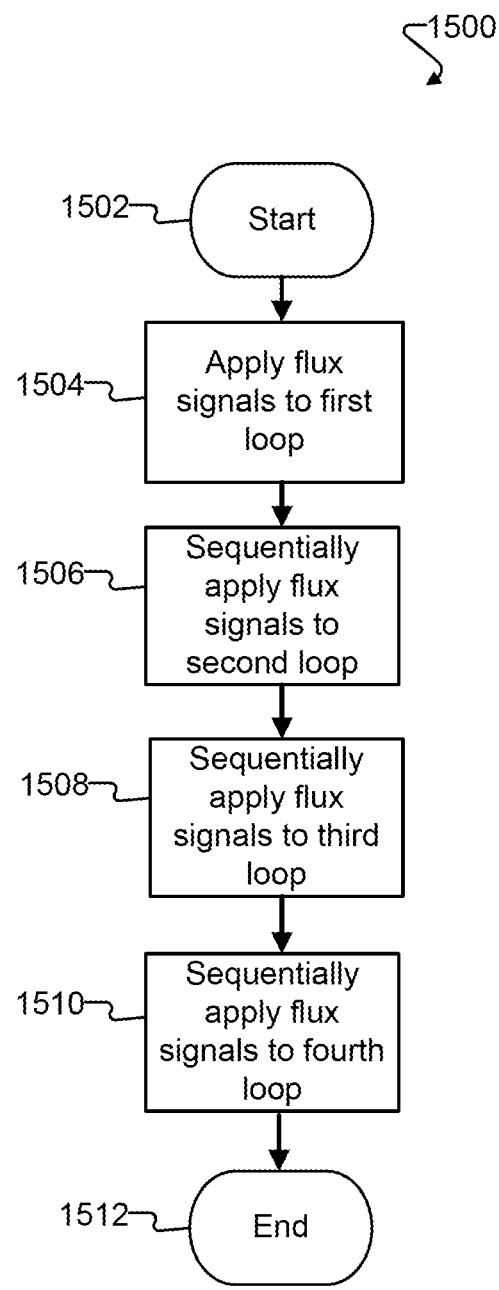
FIG. 15 is a flow diagram of a method of operating a plurality of multi-junction superconducting quantum interface device (SQUID) flux-pumps, according to at least one illustrated implementation.

FIG. 15 shows a method 1500 of operating a plurality of multi junction superconducting quantum interface device (SQUID) flux-pumps, according to at least one illustrated implementation.

The method starts at 1502, for example on application of power, submission of a problem, or invocation by a calling routine or program.

At 1504, controller circuitry causes flux signals to be applied to a first loop of a multi junction SQUID flux-pumps via a respective first interface. At 1506, the controller circuitry then sequentially causes flux signals to be applied to a second loop of the multi junction SQUID flux-pumps via a respective second interface, where the flux signal applied to the second loop is out of phase with the flux signal applied to the first loop.

Optionally where the flux pump includes a third loop, the controller circuitry causes flux signals to be sequentially applied to at least the third loop of the first multi junction SQUID flux-pump via a respective third interface at 1508. The flux signal applied to the third loop is out of phase with the flux signal applied to the second loop.

Optionally where the flux pump includes a fourth loop, the controller circuitry causes flux signals to be sequentially applied to at least the fourth loop of the first multi junction SQUID flux-pump via a respective fourth interface at 1510. The flux signal applied to the fourth loop is out of phase with the flux signal applied to the third loop.

For example, the controller circuitry can apply a respective flux signal to each of the respective first, second, and third interfaces that is $\pi/2$ out of phase with respect to the respective flux signal applied to an immediately following loop along a linear succession of the loops the multi junction SQUID flux-pumps.

Applying flux signals to the first, second, and optionally additional (e.g., third) loops of a multi junction SQUID flux-pump can include applying flux signals that pushes flux sequentially through the loops of the multi junction SQUID flux-pump into a digital-to-analog converter (DAC). For example, the controller circuitry can apply flux signals to the first, second, and third loops of the multi junction SQUID flux-pump where the respective flux signal applied to each of the respective first, second, and third interfaces is advanced by $\pi/2$ with respect to a respective flux signal applied to an immediately following loop along a linear succession of the loops the multi-junction SQUID flux-pump.

Alternatively, applying flux signals to the first, second and optionally additional (e.g., third) loops of a multi junction SQUID flux-pump may include applying flux signals that push flux sequentially through the loops of the multi junction SQUID flux-pump out of a digital-to-analog converter (DAC). For example, the controller circuitry can apply flux signals to the first, second, and third loops of the multi junction SQUID flux-pump where the respective flux signal applied to each of the respective first, second, and third interfaces is retarded by $\pi/2$ with respect to a respective flux signal applied to an immediately following loop along a linear succession of loops in the multi junction SQUID flux-pump.

Applying flux signals to the first, second, and third loops of a first multi-junction SQUID flux-pump may include applying flux signals of a first sign and a first magnitude via first, second and third control lines; and applying a flux signal of a second sign and the first magnitude to at least one of the loops of a second multi-junction SQUID flux-pump via a fourth control line sequentially with applying flux signals to the first, second and third loops of the first multi junction SQUID flux-pump, where the second sign is opposite the first sign.

The method 1500 terminates at 1512, for example until invoked again.

Figure 16A:
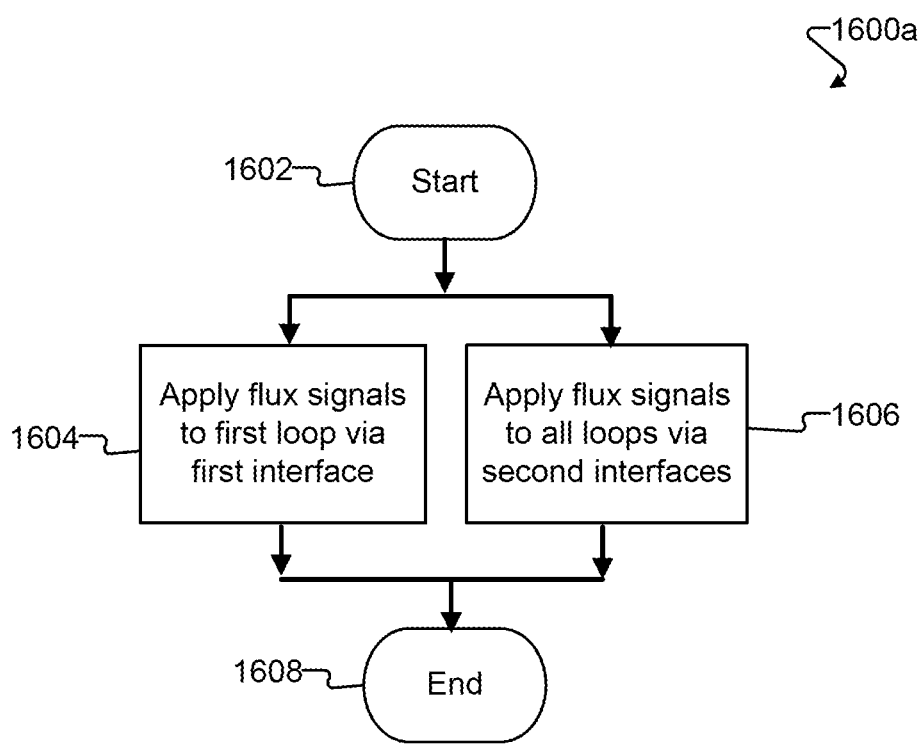
FIG. 16A is a flow diagram of a method of operating a plurality of multi junction superconducting quantum interface device (SQUID) flux-pumps, according to at least one illustrated embodiment.

FIG. 16 shows a method 1600 of operating a plurality of multi junction superconducting quantum interface device (SQUID) flux-pumps, according to at least one illustrated embodiment.

The method starts at 1602, for example on application of power, submission of a problem, or invocation by a calling routine or program.

Controller circuitry concurrently causes application of flux signals of a first sign and a first magnitude to a first loop of a multi junction SQUID flux-pump via a respective first interface at 1604; and causes application of flux signals of the first sign and the first magnitude to all of the other loops of the multi junction SQUID flux-pump via respective second interfaces at 1606, where the flux signals applied to all of the loops are in phase with one another.

Applying flux signals of the first sign and the first magnitude to all of the other loops can include applying the flux signals of the first sign and the first magnitude to a first, a second, and at least a third loop of the first multi junction SQUID flux-pump via respective first, second and third control lines.

The method 1600 terminates at 1608, for example until invoked again.

Figure 16B:
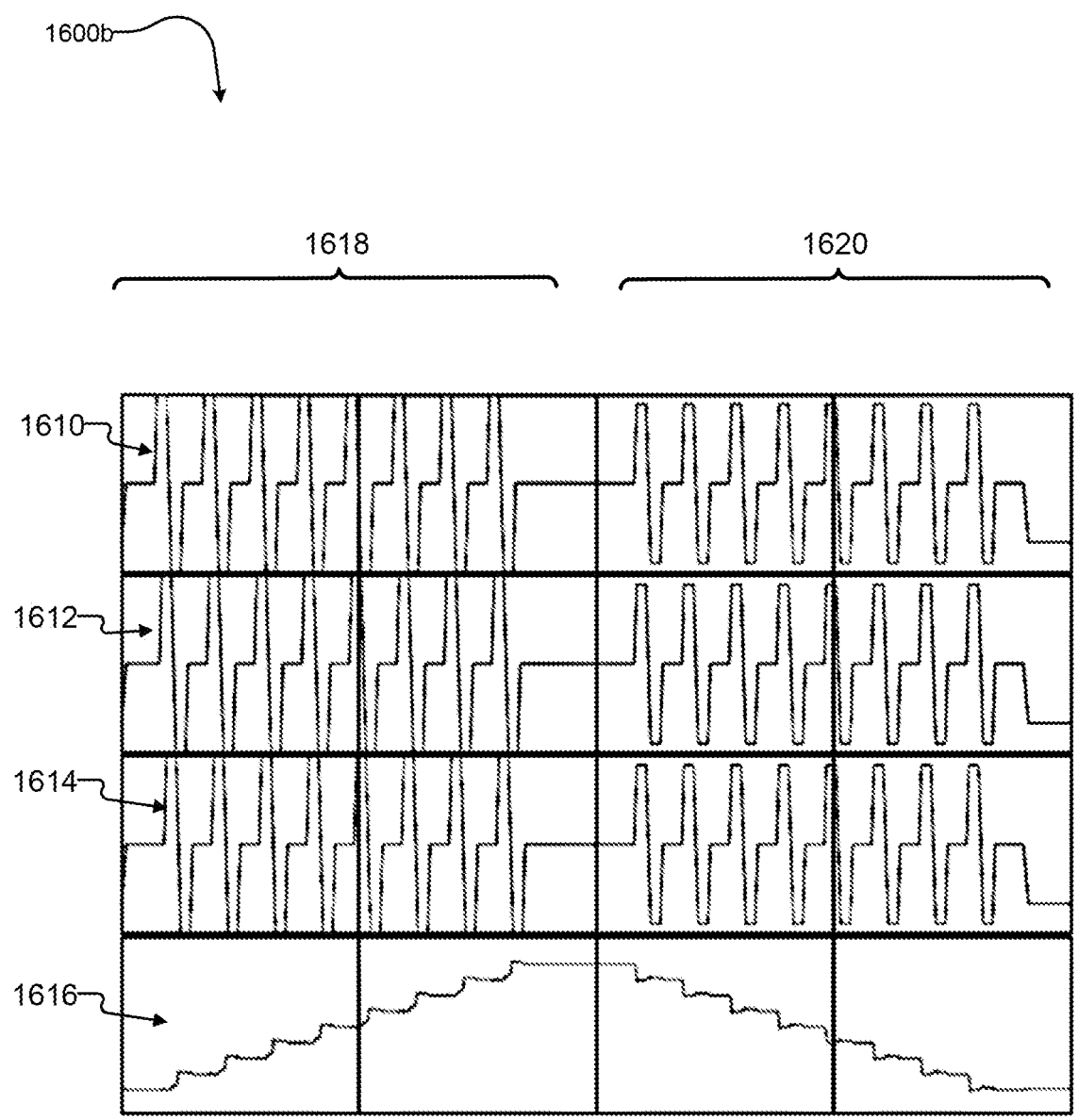
FIG. 16B is a graph showing a plot of applied flux waveforms and a Josephson phase of the end-most Josephson junction for resetting the four-junction two-loop flux pump of FIG. 11, according to at least one illustrated implementation.

Resetting flux-DACs is a challenging behavior to implement, as one simple reset scheme, illustrated in the plot 1600b of FIG. 16B, involves activating all clock phases 1610, 1612, and 1614 at the same time—and in phase—to deprogram the DAC (see 1616). As illustrated in FIG. 16B, an initial clock sequence 1618 programs the DAC loop, and a second subsequent sequence 1620 unloads it. The essential difference in the second sequence is that the pulses occur simultaneously, as opposed to the staggered pulses of the programming sequence. Occurring simultaneously, there is no preferred direction for flux and will, thus, unload pulses of either orientation. Thus, the DAC is first programmed with a clock sequence as described. Then the DAC is emptied by running the clocks simultaneously.

An alternative scheme, which would work for DACs that are of equivalent design capacity, would be to attempt to overfill the DAC, causing the DAC to reach capacity, and then to deprogram the DAC by a known amount. Even in the case where designed capacities of various DACs differed from each other, this approach can still be applied, and it may simply be that the starting point of programming for some DACs would not be mid-scale, but could be, for example, +10 $\Phi0$. In fact, all DACs could be filled to capacity, and then not deprogrammed, to treat being filled to capacity as the starting point. However this approach disadvantageously would likely increase the total number of $\Phi0$ the flux pumps must transmit to achieve a given processor state.

Using capacity as a reference point does not avoid the problem of DACs whose capacity are right on the boundary between two levels and, thus, which end up stochastically in either one of two possible states on subsequent resets. This behavior can be treated by performing a customized DAC-by-DAC reset recovery for those DACs who, when reset nominally, were right on the edge. In the case of a flux pump used to program a DAC to capacity (or some other reset scheme) this can be handled in a similar manner, by operating individual flux pumps with customized levels in a reset recovery sequence.

Extending X-Y-Z Addressing to Multicore Processors

The X-Y-Z addressing scheme discusses above may be extended to the case of processors, for example quantum processors, with multiple cores. In particular, adding two or more processor cores in series allows to use the some of the same signal lines (e.g. IO line for diving a particular device).

Signal lines may be connected in series on a sample-holder, carrier PCB or multi-chip module, while individual core may be tested and calibrated separately before being assembled.

An example implementation of such multi-core processor may have N cores, where each core is an arrangement of cells of qubits. N may be two or more. A cell of qubits may have Q qubits, for example eight qubits, and a core may have C cells, for example 24 cells.

In an implementation with 8 qubits per cell, there are nine DACs per qubits, so that in a cell there are five trigger lines and 15 address line and one common power line. Power lines select an array of tiles and address and trigger lines may be shared between different arrays of cells. Considering an implementation with 24 cells of 8 qubits per core and N cores, there are 9×8×(24×24)*N=41,472N DACs to be addressed. In case of 16 cores, for example, there are 661,248 DACs. An implementation with 16 cores is here discuss for exemplary purposes only and a person skilled in the art will understand than a lower or greater number of cores is also possible.

An X-Y-Z addressing requires three times the ceiling of cubic root of the number of lines, or 264 in the above example. To make the layout more regular it may be possible user power lines to select one quarter of cells on each processor core, 64 power lines in the above example, where each line selects 6×24=144 cells. To address each DAC in a group of 144 cells, there need to be 24×5=120 trigger lines and 6×15=90 address lines. Therefore, for the above example, the total number line for a X-Y-Z programming of all DACs is 64+120+90=274.

Braided Control Lines

Figure 17A:
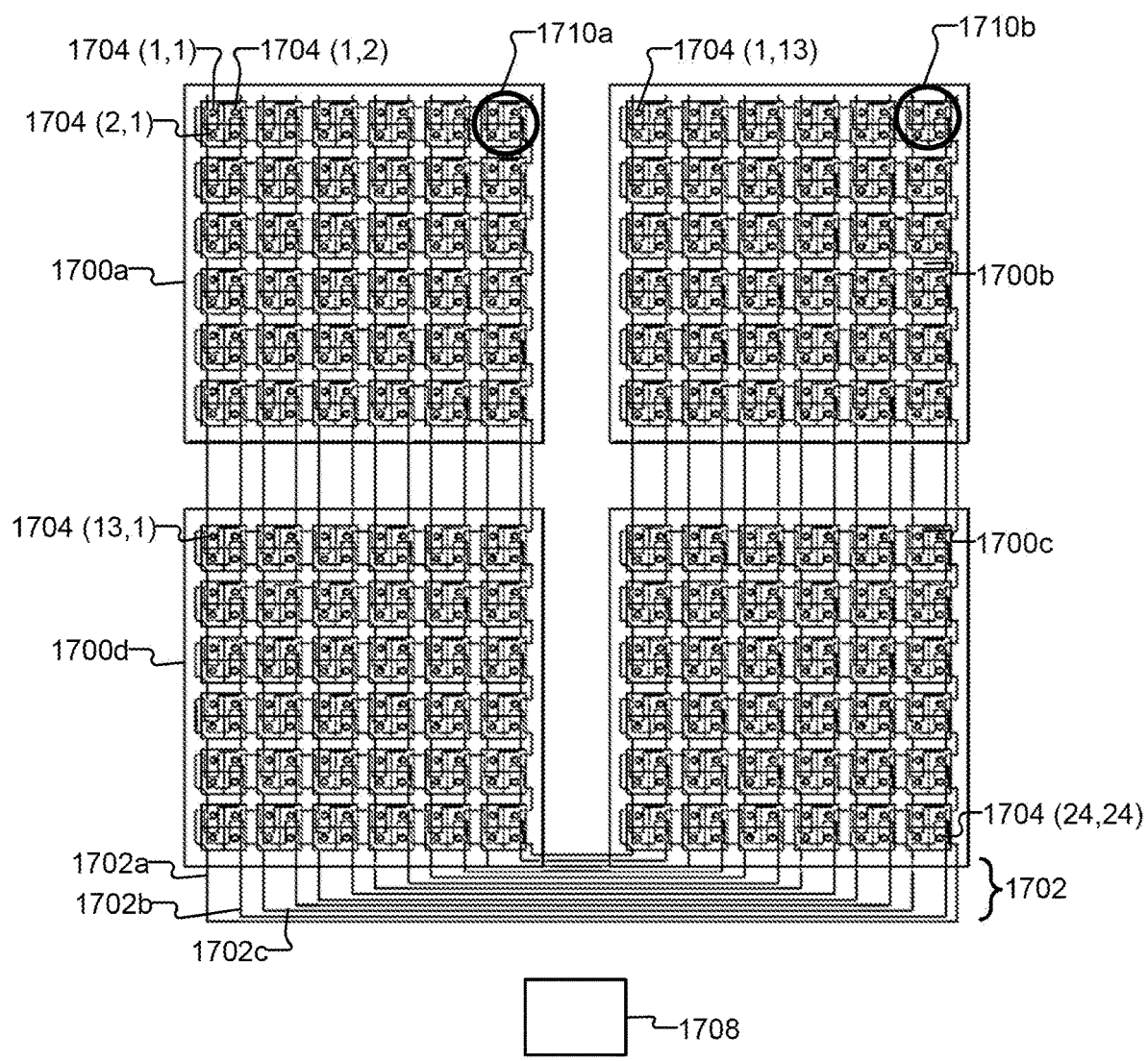
FIG. 17A is a schematic diagram of four sets of digital-to-analog converters (DACs), a number of signal lines arranged to individually address each of DACs, and control circuitry communicatively coupled to cause signals to be supplied to selected ones of the DACs via respective triplets of signal lines, according to at least one illustrated implementation.

FIG. 17A shows four sets of digital-to-analog converters (DACs) 1700a, 1700b, 1700c, 1700d (collectively 1700), a number of signal lines 1702a-1702c (collectively 1702, only three called in FIG. 17A for clarity) arranged to individually address each of DACs 1704 (i, j) (where i are integers from 1 to n, and j are integers from 1 to n, only six called out in FIG. 17A for clarity of illustration, collectively 1704). Control circuitry 1708 is communicatively coupled to cause signals to be supplied to selected ones of the DACs 1704 via respective pairs of signal lines 1702 and one of four power lines (not shown), according to at least one illustrated implementation.

In the illustrated implementation, the DACs 1704 in each set of DACs 1700a-1700d are arranged in a respective two-dimensional array, with a plurality of rows (e.g., extending horizontally across drawing sheet) and a plurality of columns (e.g., extending vertically across drawing sheet). Each set or array of DACs 1700a-1700d are controlled or selected via a respective one of four signal lines (not shown) which can be denominated as a "power line" for convenience of reference. Likewise, each set or array of DACs 1700a-1700d may be denominated as a power domain; each DAC in a power domain is controlled or selected by the same power line. The DACs 1704 of each set or array of DACs 1700a-1700d may be arranged or arrayed in a six by six (6×6) grid or array of quartets (i.e., four DACs) of DACs 1710a, 1710b (only two called out, one for set or array 1700a, and one for set or array 1700b, collectively 1710), for a total of thirty-six (36) quartets of DACs 1710 and a total of one hundred and forty-four (144) DACs 1704 per power domain (e.g., set or array of DACs 1700a-1700d). While generally illustrated as an ordered array, many of the techniques and structures described herein can be employed with a non-ordered array or set of DACs and/or other devices.

In additional to the "power lines", there are other signal lines 1702, in combination with the power lines, to uniquely address each of the one hundred and forty-four (144) DACs 1704 of the four power domains 1700a-1700d. These additional signal lines 1702 can be denominated as "control lines" for convenience of reference. As illustrated and described below, these control lines 1702 are arranged in a braided pattern or configuration across the respective sets or array or power domains 1700a-1700d to effectuate a very efficient addressing scheme, with a relatively low total number of signal lines 1702 to address a given number of DACs 1704. For example, a number $N_{signal}$ of signal lines 1702 is capable of addressing $4(N_{signal}-1)^2$DACs 1704 that are communicatively coupled to respective pairs of the signal lines 1702 and one power line to be controlled via signals carried by the respective pairs of signal lines 1702 and one power line as supplied via the control circuitry 1708. Thus, the control circuitry 1708 is able to uniquely address every DAC 1704 via a pair of signal lines 1702 and one of four power lines.

The number $N_{signal}$ of signal lines 1702 can include a set of control lines 1702 and a set of power lines (not shown), and each triplet is comprised of a unique combination of two of the control lines 1702 and one of the power lines. The signal lines 1702 and the power lines can each be comprised of material that superconducts at least at a critical temperature.

As described above, the DACs 1704 are arrayed in a plurality of two-dimensional arrays, each of the two-dimensional arrays including a respective plurality of the DACs 1704, the number of signal lines 1702 and a first subset of the signal lines, each signal line of the first subset of signal lines communicatively coupled to the DACs of a respective two-dimensional array. Each signal line of the first subset of signal lines may be denominated as a power line and is communicatively coupled to all of the DACs of the respective two-dimensional array or power domain 1700a-1700d. Each signal line 1702 may be denominated as a control line 1702 and is communicatively coupled to a subset of the DACs 1704 on each of two or more of the two-dimensional arrays 1700a-1700d. For example, each signal line 1702 of the second subset of the signal lines is communicatively coupled to a subset of the DACs of all of the two-dimensional arrays 1700a-1700d.

As illustrated, a first control line is positioned operationally proximate (e.g., sufficiently close to transfer flux) at least one DAC in each of at least three rows and at least three columns of a first two-dimensional array of DACs to communicatively couple with the respective DACs in each of at least three rows and at least three columns of the first two-dimensional array of DACs. As illustrated, a second control line is positioned operationally proximate at least one DAC in each of at least three rows and at least three columns of the first two-dimensional array of DACs to communicatively couple with the respective DACs in each of at least three rows and at least three columns of the first two-dimensional array of DACs. The first control line and the second control line can be positioned operationally proximate different DACs, with no DAC in common. Alternatively, the first control line and the second control line can be positioned operationally proximate a same at least one of DACs, with the at least one DAC in common.

Figure 17B:
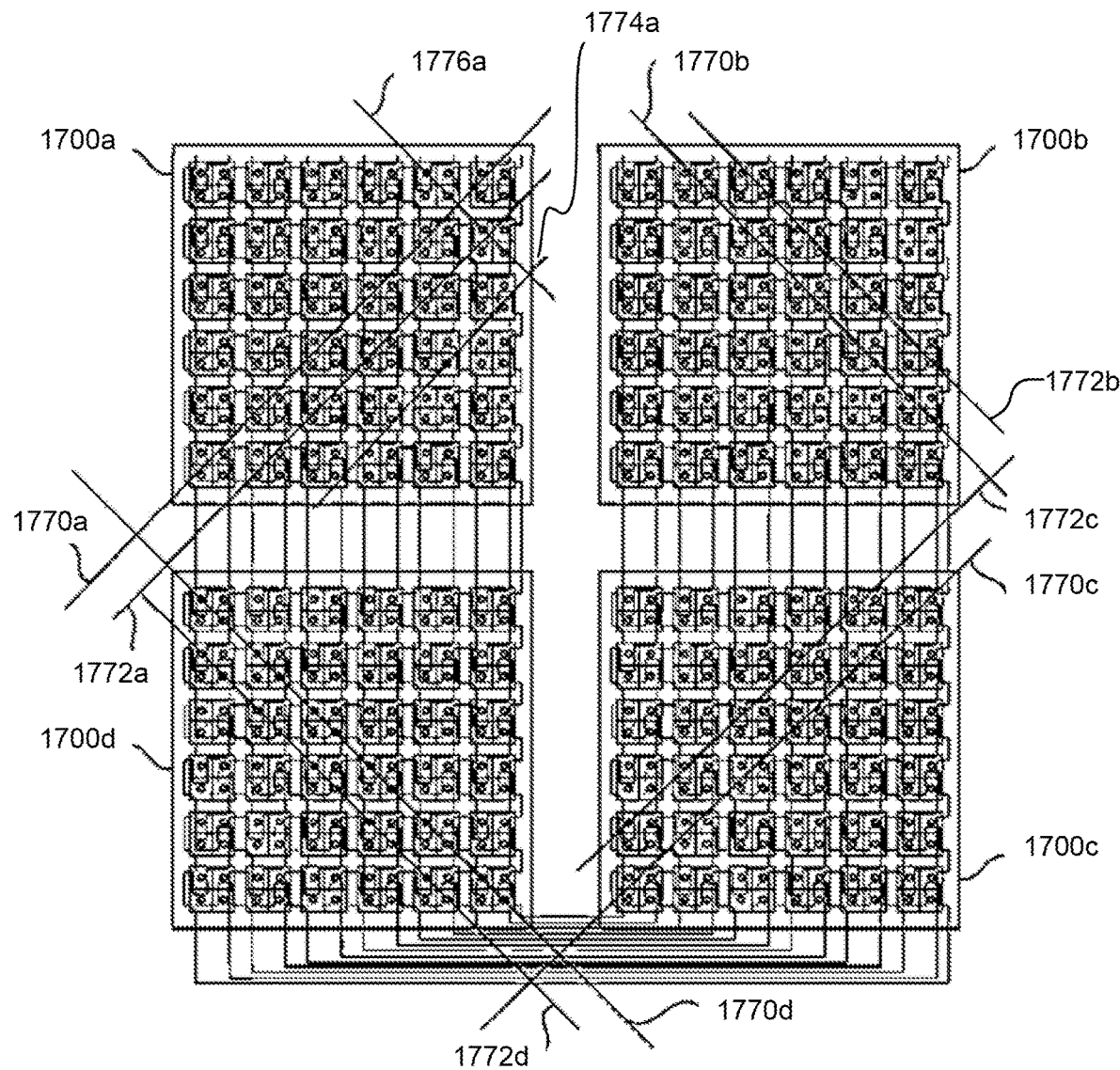
FIG. 17B is a schematic diagram of the four sets of digital-to-analog converters (DACs) and control lines of FIG. 17A, further illustrating a number of diagonal lines that represent a direction of braided control lines across the sets of DACs.

FIG. 17B shows the four sets of digital-to-analog converters (DACs) 1700a, 1700b, 1700c, 1700d (collectively 1700) and control lines 1702 e.g. 1702a, 1702b, and 1702c of FIG. 17A (not specifically called out in FIG. 17B to prevent clutter), and shows a number of diagonal lines that represent a direction of braided control lines 1702.

The approach can advantageously control $4(N_{signal}-1)^2$ DACs with $N_{signal}$ control lines.

With respect to the braiding of the control lines 1702, a first control line is positioned proximate each DAC along a first diagonal 1770a of a first two-dimensional array of DACs 1700a to communicatively couple with the respective DACs along the first diagonal 1770a of the first two-dimensional array of DACs 1700a. The first control line is also positioned proximate each DAC along a first diagonal 1770b of a second two-dimensional array of DACs 1702b to communicatively couple with the respective DACs along the first diagonal 1770b of the second two-dimensional array of DACs 1700b. Likewise, the first control line can also be positioned proximate each DAC along a first diagonal 1770c of a third two-dimensional array 1700c and a first diagonal 1770d of a fourth two-dimensional array of DACs 1700d to communicatively couple with the respective DACs along the first diagonal 1770c, 1770d of the third and the fourth two-dimensional arrays of DACs 1700c, 1700d, respectively.

Where the DACs of the first two-dimensional array of DACs 1700a are arrayed in a number of rows and columns, the first diagonal 1770a of the first two-dimensional array of DACs 1700a may, for example, extend across all rows and all columns of the first two-dimensional array of DACs 1700a. Where the DACs of the second two-dimensional array of DACs 1700b are arrayed in a number of rows and columns, the first diagonal 1770b of the second two-dimensional array of DACs 1700b may, for example, extend across all rows and all columns of the second two-dimensional array of DACs. Likewise, the respective first diagonal 1770c, 1770d of the third and the fourth two-dimensional arrays of DACs 1700c, 1700d may, for example, extend across all rows and all columns of the third and the fourth two-dimensional arrays of DACs 1700c, 1700d, respectively.

In some implementations, the first diagonal 1770b of the second two-dimensional array 1702b is perpendicular to the first diagonal 1770a of the first two-dimensional array 1700a and the first diagonal 1770c of the third two-dimensional array 1700c is perpendicular to the first diagonal 1770b of the second two-dimensional array 1700b. In some implementations, the first diagonal 1770d of the fourth two-dimensional array 1700d is perpendicular to the first diagonal 1770a of the first two-dimensional array 1700a and the first diagonal 1770d of the fourth two-dimensional array 1700d is perpendicular to the first diagonal 1770c of the third two-dimensional array 1700c.

In particular, the first control line can follow a meandering path along the first diagonal 1770a of the first two-dimensional array of DACs 1700a. The first control line can follow a meandering path along the first diagonal 1770b of the second two-dimensional array of DACs 1700b. The first control line can follow a meandering path along the first diagonal 1770c of the third two-dimensional array of DACs 1700c. The first control line can follow a meandering path along the first diagonal 1770d of the fourth two-dimensional array of DACs 1700d. Likewise, additional control lines can follow meandering paths along respective diagonals of the first, second or other two-dimensional arrays of DACs 1700a-1700d.

With respect to the braiding of the control lines, a second control line is positioned proximate each DAC along a second diagonal 1772a of the first two-dimensional array of DACs to communicatively couple with the respective DACs along the second diagonal 1772a of the first two-dimensional array of DACs 1700a. The second control line is also positioned proximate each DAC along a second diagonal 1772b of the second two-dimensional array of DACs 1700b to communicatively couple with the respective DACs along the second diagonal 1772b of the second two-dimensional array of DACs 1700b. Likewise, the second control line can also be positioned proximate each DAC along a second diagonal 1772c, 1772d of a third and a fourth two-dimensional array of DACs 1700c, 1700d to communicatively couple with the respective DACs along the second diagonal 1772c, 1772d of the third and the fourth two-dimensional array of DACs 1700c, 1700d.

Where the DACs of the first two-dimensional array of DACs are arrayed in a number of rows and a number of columns, the second diagonal 1772a of the first two-dimensional array of DACs 1700a may, for example, extend across all rows and all columns of the first two-dimensional array of DACs 1700a. Alternatively, the second diagonal 1772a of the first two-dimensional array of DACs 1700a may, for example, extend across a subset (i.e., less than all) of rows and/or a subset (i.e., less than all) of columns of the first two-dimensional array of DACs 1700a. Thus, any given control line can extend along a first diagonal partially across the two-dimensional array of DACs 1700a-1700d, then switch direction and extend along a second diagonal across a remainder of the two-dimensional array of DACs 1700a-1700d. The second diagonal can extend at a non-zero angle from first diagonal, for example at a right angle or 90°. In some implementations, for example with large enough arrays of DACs, a given control line may extend along one, two, three or even more diagonals, each successive diagonal which extends at a non-zero angle with respect to a preceding and a subsequent diagonal. The successive angles can all be the same, or one or more angles can differ from one another in magnitude and/or in direction. For instance, non-zero angles can, for example, include 90°, 60°, 45° or 30° angles. Also for instance, directions of angle can be clockwise or counterclockwise relative to a preceding or subsequent diagonal. Thus, some of the control lines can take a tortious, zigzag path across one or more sets or arrays of DACs 1700a-1700d.

With respect to the braiding of the control lines, a third control line is positioned proximate each DAC along a third diagonal 1774a and a fourth diagonal 1776a of the first two-dimensional array of DACs 1800a to communicatively couple with the respective DACs along the third and the fourth diagonals 1774a, 1776a of the first two-dimensional array of DACs 1700a. The fourth diagonal extends at a non-zero angle (e.g., perpendicular, right angle, 90°) with respect to the third diagonal. For example, where the DACs of the first two-dimensional array of DACs 1700a are arrayed in a number of rows and columns, the third diagonal 1774a of the first two-dimensional array of DACs 1700a may extend across a first number of rows and a first number of columns of the first two-dimensional array of DACs 1700a, and the fourth diagonal 1776a of the first two-dimensional array of DACs 1700a may extend across a second number of rows and a second number of columns of the first two-dimensional array of DACs 1700a. In some implementations, a combination of the first number and second number of rows includes all rows of the first two-dimensional array of DACs 1700a and a combination of the first number and second number of columns includes all columns of the first two-dimensional array of DACs 1700a.

The third control line can also be positioned proximate each DAC along a third diagonal (not shown) and fourth diagonal (not shown) of the second two-dimensional array of DACs 1700*b* to communicatively couple with respective DACs along the third and fourth diagonals of the second two-dimensional array of DACs, where the fourth diagonal of the second two-dimensional array of DACs extends at a non-zero angle (e.g., perpendicular, right angle) to the third diagonal of the second two-dimensional array of DACs. The third control line can further be positioned proximate each DAC along a third diagonal and a fourth diagonal of the third dimensional array of DACs 1700*c* to communicatively couple with the respective DACs along the third and the fourth diagonals of the third two-dimensional array of DACs 1700*c*, again where the fourth diagonal of the third two-dimensional array of DACs 1700*c* extends at a non-zero angle with respect to the third diagonal of the third two-dimensional array of DACs 1700*c*. The third control line can even further be positioned proximate each DAC along a third diagonal and a fourth diagonal of the fourth dimensional array of DACs 1700*d* to communicatively couple with the respective DACs along the third and fourth diagonals of the fourth two-dimensional array of DACs 1700*d*, again where the fourth diagonal of the fourth two-dimensional array of DACs 1700*d* extends at a non-zero angle to the third diagonal of the fourth two-dimensional array of DACs 1700*d*.

Figure 18:
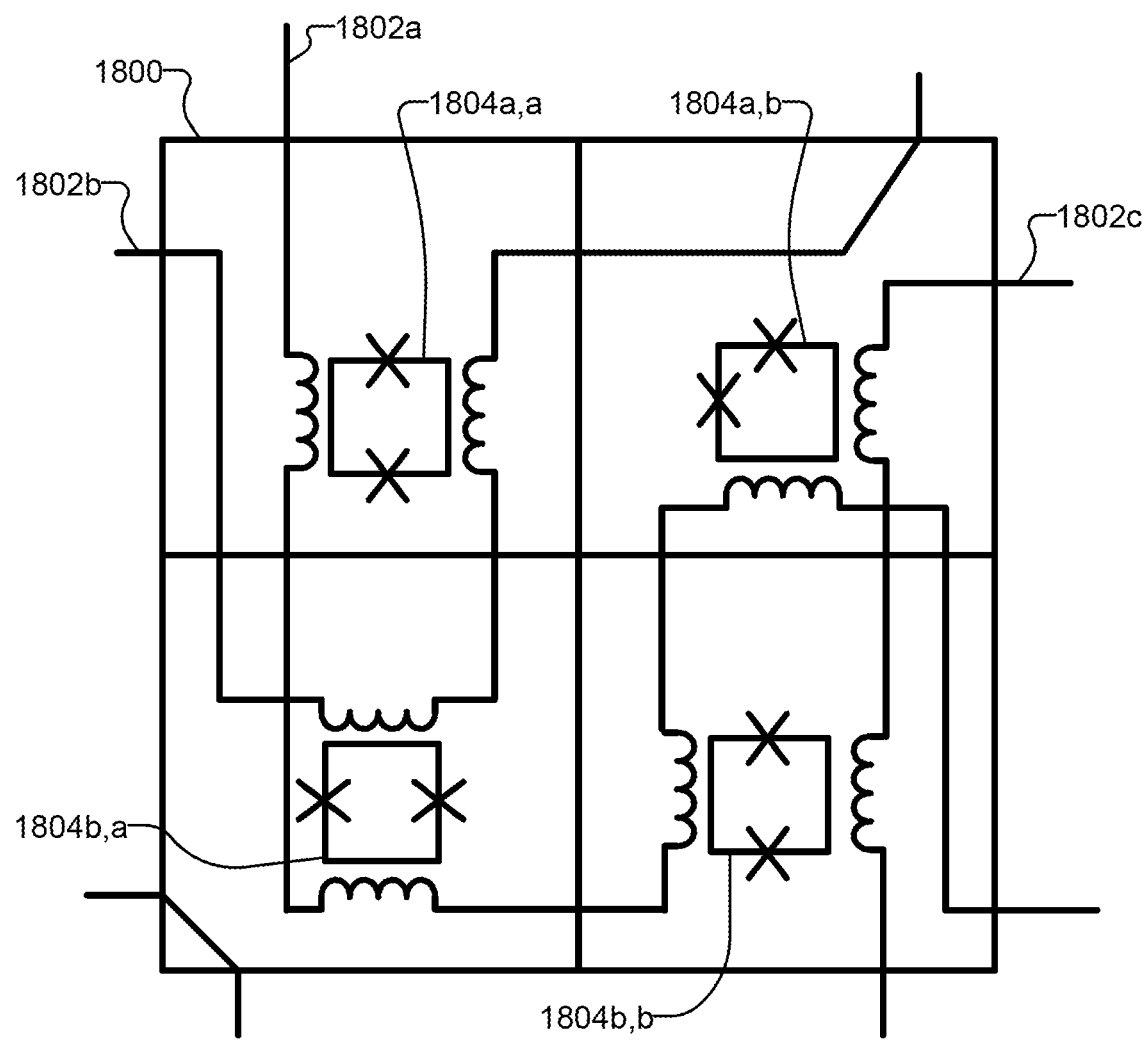
FIG. 18 is a schematic diagram of a quartet of digital-to-analog converters (DACs), a power line, and three control lines, according to at least one illustrated implementation.

There is a small difference in the implementation of this idea when there are an even or odd number of DACS per column. FIG. 18 shows a repeatable tile for pairs of braid crossings which scales to arbitrarily large numbers of lines.

FIG. 18 shows a quartet of DACs 1800, and three control lines 1802*a*, 1802*b*, 1802*c*, according to at least one illustrated implementation. The quartet of DACs 1800, three control lines 1802*a*, 1802*b*, 1802*c* (collectively 1802) may be similar or even identical to the corresponding structures of FIGS. 17A and 17B. FIG. 18 better illustrates the physical arrangement of the control lines 1802 to individually address each of the DACs of the quartet 1800.

The quartet 1800 includes a first DAC 1804*a,a*, a second DAC 1804*a,b*, a third DAC 1804*b,b*, and a fourth DAC 1804*b,a*. Each of the DACs includes a loop of material, a pair of Josephson junctions that interrupt the loop of material, and a pair of interfaces (e.g., inductive interfaces).

A first control line 1802*a* passes operatively proximate the first DAC 1804*a,a*, the fourth DAC 1804*b,a*, the third DAC 1804*b,b*, and the second DAC 1804*a,b* of the quartet 1800. The first control line 1802*a* includes interfaces (e.g., inductive interfaces) operatively proximate complementary interfaces of the first, fourth, third and second DACs 1804*a,a*, 1804*b,a*, 1804*b,b*, 1804*a,b* to provide a signal (e.g., flux) therebetween.

A second control line 1802*b* passes operatively proximate the fourth DAC 1804*b,a* and the first DAC 1804*a,a* of the quartet 1800. The second control line 1802*b* includes interfaces (e.g., inductive interfaces) operatively proximate complementary interfaces of the fourth and first DACs 1804*b,a*, 1804*a,a* to provide a signal (e.g., flux) therebetween.

A third control line 1802*c* passes operatively proximate the third DAC 1804*b,b* and the second DAC 1804*a,b* of the quartet 1800. The third control line 1802*c* includes interfaces (e.g., inductive interfaces) operatively proximate complementary interfaces of the third and second DACs 1804*b,b*, 1804*a,b* to provide a signal (e.g., flux) therebetween.

Figure 19:
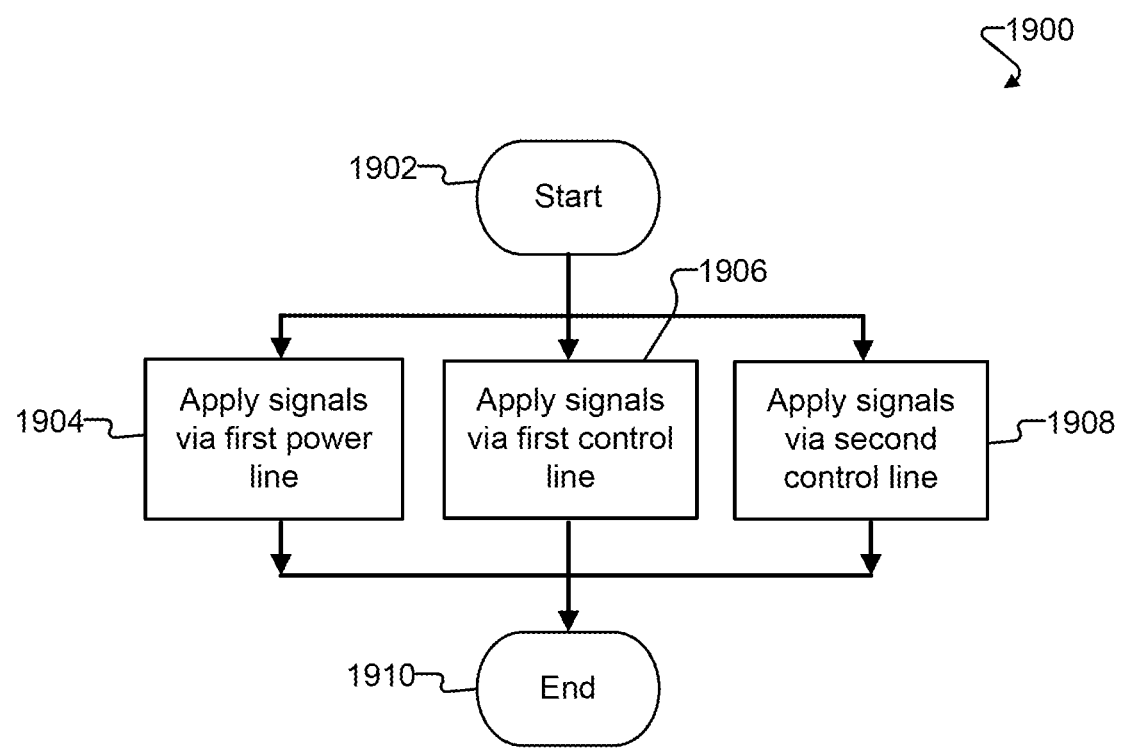
FIG. 19 is a flow diagram of a method of operation employing a braided arrangement of control lines to individually address DACs in a two-dimensional set (e.g., ordered array) of DACs, according to at least one illustrated implementation.

FIG. 19 shows a method 1900 of operation employing a braided arrangement of control lines to individually address DACs in a two-dimensional set (e.g., ordered array) of DACs, according to at least one illustrated implementation.

The method 1900 starts at 1902, for example in response to an application of power, submission or embedding of a problem, or in response to invocation by a calling routine or program.

During a first period of time, the control circuitry applies signals to a first set of DACs (e.g., power domain) via a first power line at 1904.

During the first period, the control circuitry applies signals to a first subset of the first set of DACs via a first control line at 1906. This is performed concurrently with the application of signals via the first power line.

During the first period, the control circuitry applies signals to a second subset of the first set of DACs via a second control line at 1908. This is performed concurrently with the application of signals via the first power line and via the first control line. A second subset of DACs has a single DAC in common with the first subset of DACs, thus a single DAC is individually addressed via signals provided by a triplet of one power line and two control lines (i.e., three signal lines).

The method 1900 terminates at 1910, for example until called or invoked again.

Low Field Magnetic Imaging Device

It is desirable to measure magnetic fields at low temperatures proximal to quantum annealing processors. An existing implementation employs dc SQUIDs to measure the magnetic field around a processor. Typically, for 35 dc SQUIDs 13 bias lines are employed, with 5 of the bias lines requiring specialized filtering and electronics boards. With the elimination of dc SQUIDs on the quantum processors, the magnetometers are the only remaining reason to keep old filters and electronics boards. A number N of dc SQUIDs typically requires ~sqrt(N) bias lines. Dc SQUIDs can occasionally latch up into the voltage state when not intended, disadvantageously generating heat on chip. Further dc SQUID design constrains making the body inductance too large because the modulation depth drops thus limiting the magnetic field sensitivity of the SQUID.

QFP magnetometers hooked into a shift register and readout with via NDRO can be used to advantageously eliminate the reliance on DC SQUIDS. The number of extra lines required is about 6 for any number of linearly connected QFP magnetometers. A 2-dimensional array QFP magnetometers could use up to 18 lines.

A QFP magnetometer is a QFP with the body not living under a ground plane, thus its degeneracy point is a function of external magnetic field. A single read of a QFP gives only a 0 or a 1, so the flux bias on the QFP body is swept while taking many reads of the QFP and the output is monitored until it switches from 0 to 1. Fitting the results to a tanh shape will allow the degeneracy point to be quite precisely determined (where the 0 population and the 1 population are equal).

Annealing the QFP between $+\Phi_0/2$ and $+\Phi_0$, and between $-\Phi_0/2$ and $-\Phi_0$, and averaging the resulting degeneracy points can compensate for asymmetry. QFP annealing line into body cross-talk can be measured and compensated.

The QFP magnetometers can also be used as elements of a shift register if the QFP magnetometers are instrumented with a flux bias line, or if the applied magnetic flux is less than the coupled flux between shift register elements.

This enables, for example, a grid of QFP magnetometers setup as an X-Y shift register to be used for magnetic field imaging wherein one reads out QFP at a time. One has to find the degeneracy point of each QFP individually in the simplest method. The QFPs can also be readout one column at a time if the magnetic field is small enough and the flux bias for each column is scanned to find the degeneracy point of the columns' QFPs in parallel.

The simplest version is replace existing X, Y, Small, Medium, and Large dc SQUIDs with the equivalent QFP versions. The bodies would be the same, except the SQUIDs would be communicatively coupled to their neighbors or to a small shift register connecting them to the outer shift register of the processor so as to plug into the NDRO at the corners of the outer shift register.

QFPs with flux bias acting as magnetometers can, for example, be used for compensation of residual magnetic field (e.g., cycle to 9.2K, cool down, read at 4K, compensate, cycle to 9.2K, cool down, etc.).

In at least one implementation, a system includes a first set of quantum flux parametron (QFP) magnetometers, each QFP magnetometer of the first set of QFP magnetometers includes a respective first loop of material, a respective second loop of material, and a respective compound Josephson junction comprising a pair of Josephson junctions, the respective first and the respective second loops of material which superconductive at a critical temperature, the second loop of material interrupts the respective first loop of material, the respective pair of Josephson junctions interrupt the second loop of material and are in parallel with one another in the second loop of material with respect to nodes at which the respective second loop of material interrupt the respective first loop of material, the respective second loop of material including a respective second loop inductive interface to inductively receive control signals to control the respective compound Josephson junction, and the respective first loop of material includes a plurality of first loop inductive interfaces, at least one of the first loop inductive interfaces exposed to flux from an external magnetic field without any intervening ground plane, to measure the external magnetic field via the respective QFP magnetometer; a set of control lines positioned to selectively communicatively couple control signals to the second loop inductive interface; and a set of flux bias lines positioned to selectively communicatively couple a flux bias to at least one of the first loop inductive interfaces of each QFP magnetometer of the first set of QFP magnetometers for flux feedback to measure the external magnetic field. In some implementations, for each of the QFP magnetometers of the first set of QFP magnetometers, at least some of the first loop inductive interfaces couples the respective QFP magnetometer to respective first loop inductive interfaces of neighboring QFP magnetometers of the first set of QFP magnetometers.

The system may further include a processor chip comprising a plurality of qubits and a plurality of couplers, each coupler operative to selectively communicatively couple a respective pair of the qubits, and wherein the first set of QFP magnetometers are positioned to detect an external magnetic field. The first set of QFP magnetometers may be integral components of the processor chip. Control circuitry communicatively coupled to the QFP magnetometers of the first set of magnetometers via the flux bias lines may be operable to sweep a flux bias applied to a body of each of the QFP magnetometers of the first set of magnetometers while making a plurality of read outs of the QFP magnetometers of the first set of magnetometers. The control circuitry may determine a respective degeneracy point of each of the QFP magnetometers of the first set of magnetometers based at least in part on the plurality of read outs. For example, for each of the QFP magnetometers of the first set of magnetometers, the control circuitry fits a respective set of results of the read out to a tanh shape in order to determines the respective degeneracy point of each of the QFP magnetometers of the first set of magnetometers.

The control circuitry may further be communicatively coupled to the QFP magnetometers of the first set of magnetometers via a first set of annealing lines and operable to anneal each of the QFP magnetometers of the first set of magnetometers between $+\Phi_0/2$ and $+\Phi_0$, and between $-\Phi_0/2$ and $-\Phi_0$.

The control circuitry may further determine a measure of annealing line/QFP magnetometer cross-talk; and compensate for the determined annealing line/QFP magnetometer cross-talk.

The system may further include a first shift register communicatively coupled to the first set of QFP magnetometers. The first shift register may take the form of a QFP-based shift register which is one of magnetically or galvanically coupleable to respective ones of the first set of QFP magnetometers.

The system may further include a number of non-dissipative read outs (NDROs).

In operation, the control circuitry can for each of the QFP magnetometers of the first set of magnetometers, sweeping a flux bias applied to a body of the respective QFP magnetometer; and making a plurality of read outs of the respective QFP magnetometers while sweeping the flux bias applied to the body of the respective QFP magnetometer.

In operation, the control circuitry can further apply flux bias signals to sequentially move quantum flux values between successive elements of the shift registers.

In operation, the control circuitry can further determine a respective degeneracy point of each of the QFP magnetometers of the first set of magnetometers based at least in part on the plurality of read outs. Determining a respective degeneracy point of each of the QFP magnetometers of the first set of magnetometers based at least in part on the plurality of read outs can, for example, include fitting a respective set of results of the read out to a tanh shape in order to determines the respective degeneracy point of each of the QFP magnetometers of the first set of magnetometers.

In operation, the control circuitry can further apply signals to the QFP magnetometers of the first set of magnetometers via a first set of annealing lines to anneal each of the QFP magnetometers of the first set of magnetometers between $+\Phi_0/2$ and $+\Phi_0$, and between $-\Phi_0/2$ and $-\Phi_0$.

In operation, the control circuitry can further determine a measure of annealing line/QFP magnetometer cross-talk; and compensate for the determined annealing line/QFP magnetometer cross-talk based at least in part on the determined measure.

Exemplary Superconducting Quantum Processor

Figure 20:
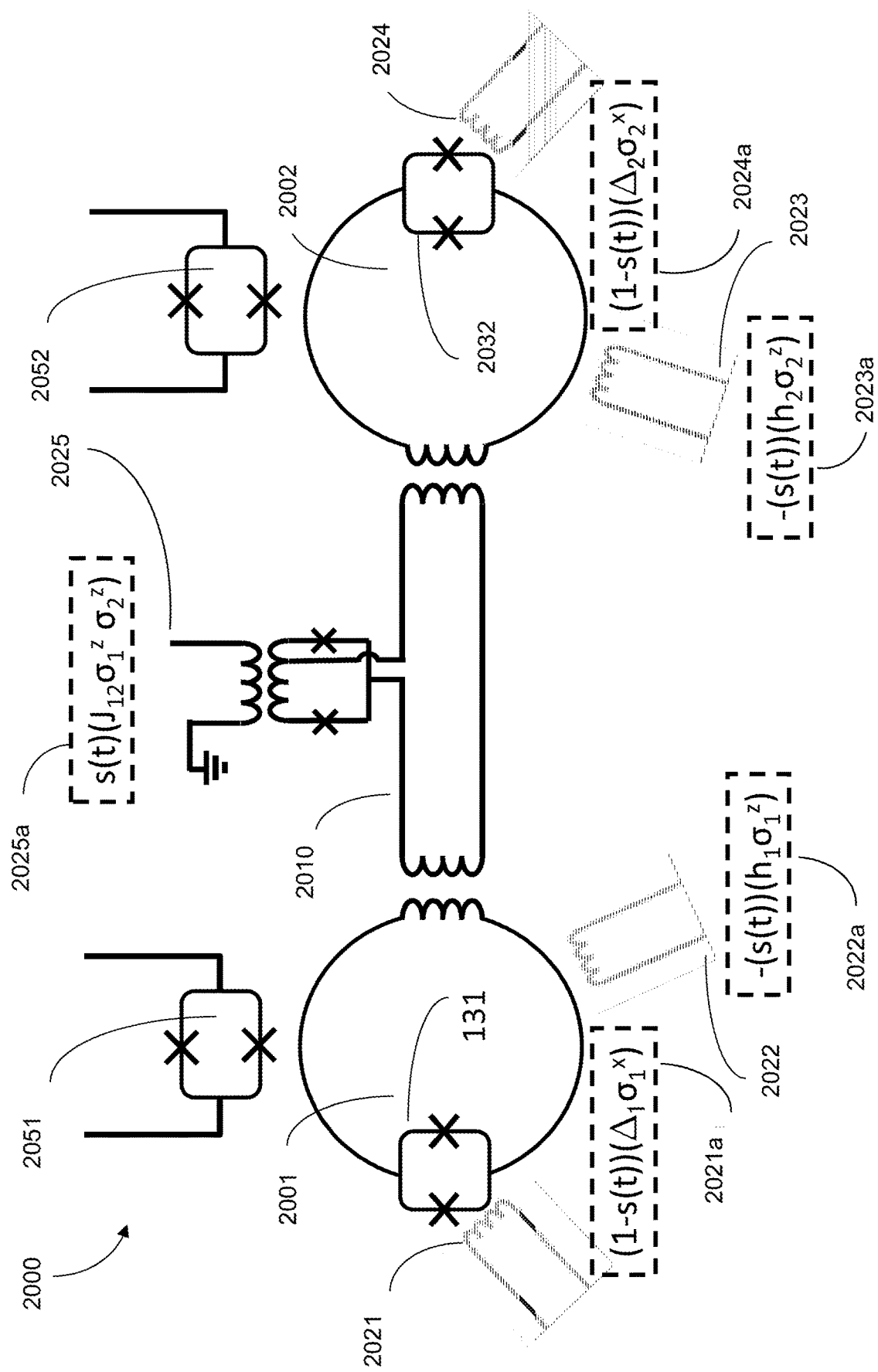
FIG. 20 is a schematic diagram of a portion of an exemplary superconducting quantum processor designed for quantum annealing (and/or adiabatic quantum computing) components from which may be used to implement the present systems and devices.

FIG. 20 is a schematic diagram of a portion of an exemplary superconducting quantum processor 2000 designed for quantum annealing (and/or adiabatic quantum computing) components from which may be used to implement the present systems and devices. The portion of superconducting quantum processor 2000 shown in FIG. 20 includes two superconducting qubits 2001, and 2002. Also shown is a tunable coupling (diagonal coupling) via coupler 2010 between qubits 2001 and 2002 (i.e., providing 2-local interaction). While the portion of quantum processor 2000 shown in FIG. 20 includes only two qubits 2001, 2002 and one coupler 2010, those of skill in the art will appreciate that quantum processor 2000 may include any number of qubits and any number of couplers coupling information between them.

The portion of quantum processor 2000 shown in FIG. 20 may be implemented to physically realize quantum annealing and/or adiabatic quantum computing. Quantum processor 2000 includes a plurality of interfaces 2021-2025 that are used to configure and control the state of quantum processor 2000. Each of interfaces 2021-2025 may be realized by a respective inductive coupling structure, as illustrated, as part of a programming subsystem and/or an evolution subsystem. Alternatively, or in addition, interfaces 2021-2025 may be realized by a galvanic coupling structure, e.g., as described in greater detail elsewhere herein. In some embodiments, one or more of interfaces 2021-2025 may be driven by one or more DACs. Such a programming subsystem and/or evolution subsystem may be separate from quantum processor 2000, or it may be included locally (i.e., on-chip with quantum processor 2000).

In the operation of quantum processor 2000, interfaces 2021 and 2024 may each be used to couple a flux signal into a respective compound Josephson junction 2031 and 2032 of qubits 2001 and 2002, thereby realizing a tunable tunneling term (the $\Delta_i$ term) in the system Hamiltonian. This coupling provides the off-diagonal $\sigma^x$ terms of the Hamiltonian and these flux signals are examples of "delocalization signals". Examples of Hamiltonians (and their terms) used in quantum computing are described in greater detail in, for example, US Publication No. 20140344322.

Similarly, interfaces 2022 and 2023 may each be used to apply a flux signal into a respective qubit loop of qubits 2001 and 2002, thereby realizing the $h_i$ terms (dimensionless local fields for the qubits) in the system Hamiltonian. This coupling provides the diagonal $\sigma^z$ terms in the system Hamiltonian. Furthermore, interface 2025 may be used to couple a flux signal into coupler 2010, thereby realizing the $J_{ij}$ term(s) (dimensionless local fields for the couplers) in the system Hamiltonian. This coupling provides the diagonal $\sigma_i^z \sigma_j^z$ terms in the system Hamiltonian.

In FIG. 20, the contribution of each of interfaces 2021-2025 to the system Hamiltonian is indicated in boxes 2021a-2025a, respectively. As shown, in the example of FIG. 20, the boxes 2021a-2025a are elements of time-varying Hamiltonians for quantum annealing and/or adiabatic quantum computing.

Throughout this specification and the appended claims, the term "quantum processor" is used to generally describe a collection of physical qubits (e.g., qubits 2001 and 2002) and couplers (e.g., coupler 2010). The physical qubits 2001 and 2002 and the coupler 2010 are referred to as the "programmable devices" of the quantum processor 2000 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 2022, 2023, and 2025) used to apply the programmable parameters to the programmable devices of the quantum processor 2000 and other associated control circuitry and/or instructions.

As previously described, the programming interfaces of the programming subsystem may communicate with other subsystems which may be separate from the quantum processor or may be included locally on the processor. As described in more detail later, the programming subsystem may be configured to receive programming instructions in a machine language of the quantum processor and execute the programming instructions to program the programmable devices in accordance with the programming instructions. Similarly, in the context of a quantum processor, the term "evolution subsystem" generally includes the interfaces (e.g., "evolution interfaces" 2021 and 2024) used to evolve the programmable devices of the quantum processor 2000 and other associated control circuitry and/or instructions. For example, the evolution subsystem may include annealing signal lines and their corresponding interfaces (2021, 2024) to the qubits (2001, 2002).

Quantum processor 2000 also includes readout devices 2051 and 2052, where readout device 2051 is associated with qubit 2001 and readout device 2052 is associated with qubit 2002. In some embodiments, such as shown in FIG. 20, each of readout devices 2051 and 2052 includes a DC-SQUID inductively coupled to the corresponding qubit. In the context of quantum processor 2000, the term "readout subsystem" is used to generally describe the readout devices 2051, 2052 used to read out the final states of the qubits (e.g., qubits 2001 and 2002) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.), any of which may comprise DACs. Qubit readout may also be performed using alternative circuits, such as that described in PCT Patent Publication WO2012064974.

While FIG. 20 illustrates only two physical qubits 2001, 2002, one coupler 2010, and two readout devices 2051, 2052, a quantum processor (e.g., processor 2000) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

Examples of superconducting qubits include superconducting flux qubits, superconducting charge qubits, and the like. In a superconducting flux qubit the Josephson energy dominates or is equal to the charging energy. In a charge qubit it is the reverse. Examples of flux qubits that may be used include rf-SQUIDs, which include a superconducting loop interrupted by one Josephson junction, persistent current qubits, which include a superconducting loop interrupted by three Josephson junctions, and the like.

Exemplary Superconducting Kinetic Inductance DACs

Figure 21:
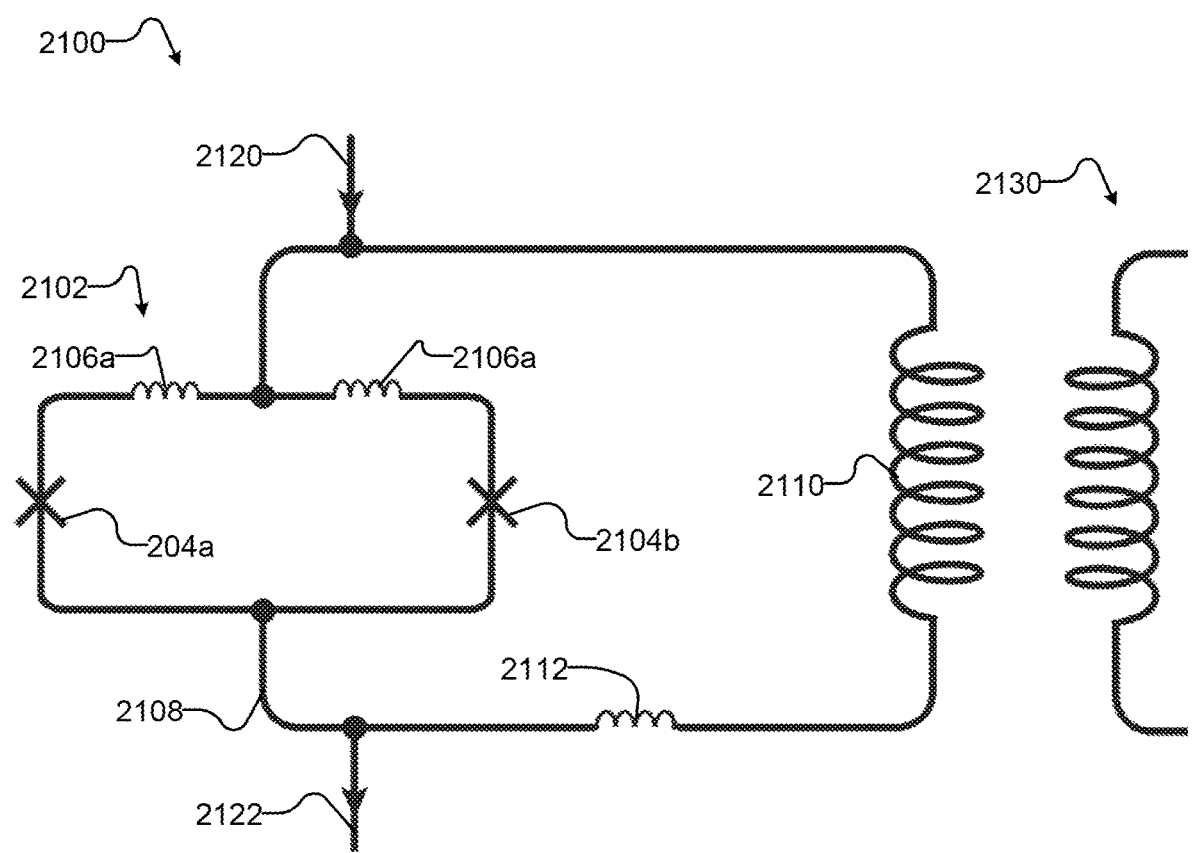
FIG. 21 is a schematic diagram of an exemplary single-loop DAC with a kinetic inductance energy storage element.

FIG. 21 shows an example DAC 2100 comprising a superconducting loop 2108 which, in operation, carries a superconducting current. Superconducting loop 2108 may comprise any suitable superconducting materials such as, for example, niobium, titanium, and/or the like. Superconducting loop 2108 may be coupled to an inflow line 2120 where current is received and to an outflow line 2122; a voltage is induced across superconducting loop 2108 by inflow and outflow lines 2120 and 2122. Outflow line 2122 may optionally provide a current to other devices (e.g., by acting as an inflow line 2120 for other devices). For example, in some implementations, DACs are serially coupled together by inflow and outflow lines 2120, 2122, thereby providing current to a plurality of DACs.

Superconducting loop 2108 is interrupted by one or more Josephson junctions. For example, as shown in FIG. 21, superconducting loop 2108 may be interrupted by a compound Josephson junction ("CJJ") 2102. CJJ 2102 comprises a plurality of Josephson junctions 2104a, 2104b (individually and collectively 2104, in the depicted implementation, two Josephson junctions are shown), at least some of which are arranged in parallel. Parallel branches of CJJ 2102 may have separate biasing elements 2106a, 2106b (individually and collectively 2106); for example, Josephson junction 2104a is coupled in series to biasing element 2106a and Josephson junction 2104b is coupled in series to biasing element 2106b. Biasing elements 2106 may be inductively, galvanically, or otherwise coupled to an electrical signal to bias the current passing through their respective Josephson junction 2104, thereby programmably modifying the behavior of CJJ 2102 (and, thus, of DAC 2100). The operation of Josephson junctions and/or CJJs in DACs is described in greater detail in, for example, U.S. Pat. Nos. 7,876,248 and 8,098,179.

Superconducting loop 2108 is also interrupted by a coupling element 2110 and an energy storage element 2112, which receive a superconducting current mediated by the state of CJJ 2102. Coupling element 2110 couples DAC 2100 to a target device 2130 (e.g., a qubit, a coupler, and/or another programmable device of a quantum processor). Coupling element 2110 may comprise an inductor or a galvanic connection between DAC 2100 and target device 2130. FIG. 21 shows an example implementation where coupling element 2110 comprises an inductor. Example implementations where coupling element 2110 comprises a galvanic connection are described in greater detail below.

Energy storage element 2112 provides a kinetic inductance by inducing a lower charge carrier density than superconducting loop 2108. As charge carriers (e.g., Cooper pairs of electrons) pass through energy storage element 2112, their density decreases and their velocity correspondingly increases so as to preserve total current. The increased velocity of the charge carriers stores kinetic energy, thereby providing a kinetic inductance which may be used instead of or in addition to a magnetic inductance (such as the conventional magnetic-inductance energy storage described elsewhere herein).

In normal metals, this effect is generally negligible at sub-THz frequencies due to the dominance of the scattering effect, which quickly releases energy via Joule heating. However, in superconductors, scattering is substantially reduced. The kinetic inductance effect in superconductors can be contribute significantly to total inductance at a range of frequencies, including conventional AC frequencies.

In some implementations, energy storage element 2112 and coupling element 2110 are combined into a single element. For example, if energy storage element 2112 also provides sufficient flux, all or part of it may be used as all or part an inductive coupling element. Alternatively, or in addition, all or part of energy storage element 2112 may comprise all or part of a galvanic coupling element.

Energy storage elements 2112 may comprise, for example, superconducting thin-film implementations, Josephson junction-based implementations, and/or other implementations. Some implementations of energy storage elements 2112 are discussed in greater detail below. Certain implementations are likely to exhibit particular behavior (and, accordingly, may provide particular design opportunities) in the context of cascading DACs, so this disclosure will first turn to a discussion of cascading DAC implementations.

Exemplary Cascading DACs

In some implementations, a plurality of DACs (including, for example, DAC 2100) are coupled in series, with at least one of the DACs coupling directly to the target device and the remaining DACs coupling indirectly to the target device through the directly-coupled DAC(s). In some implementations, a first DAC is coupled directly to the target device and encodes the most significant digit(s) of the signal represented by the DACs; the other DACs may be coupled serially to the first DAC, with more-distant DACs (relative to the first DAC) encoding increasingly less-significant digits. Implementations of cascading DACs are discussed in greater detail in, for example, U.S. Pat. Nos. 7,876,248 and 8,098,179.

Figure 22:
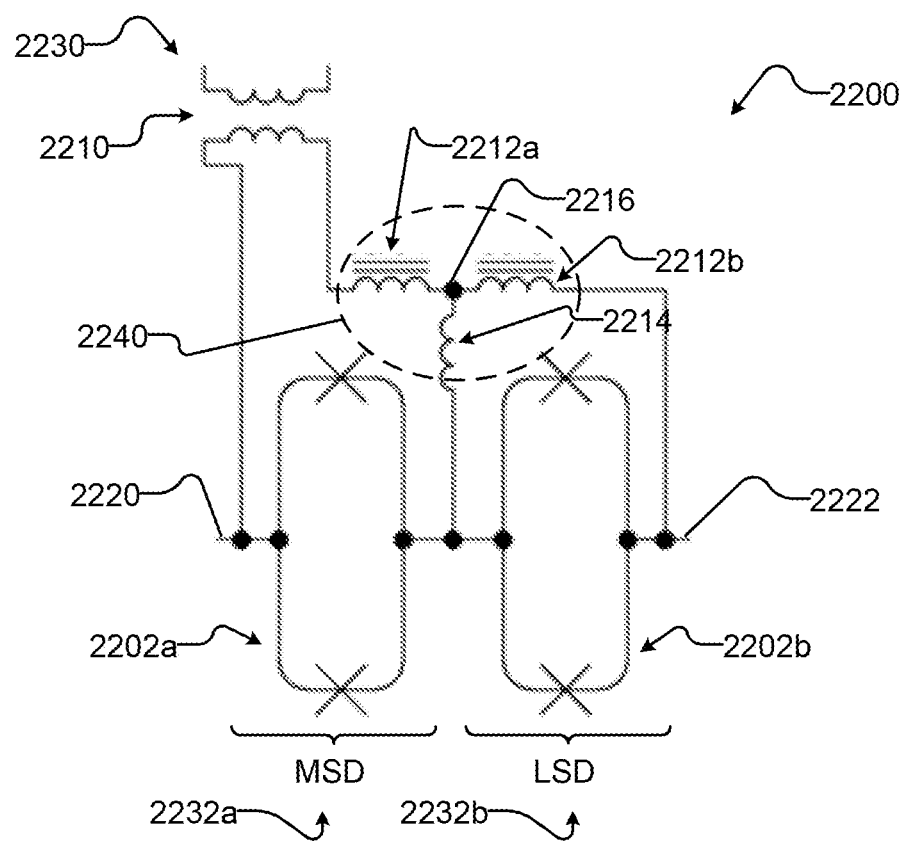
FIG. 22 is a schematic diagram of two exemplary cascading DACs with kinetic inductance energy storage elements.

FIG. 22 shows a schematic example of cascading DACs 2200 having a first DAC 2232a (representing the most significant digit(s)) and second DAC 2232B (representing the least significant digit(s)). DACs 2232a and 2232b (individually and collectively DACs 2232) are programmable via CJJs 2202a and 2202b (individually and collectively CJJs 2202) and have energy storage elements 2212a and 2212b (individually and collectively energy storage elements 2212), respectively. DACs 2232 receive current via inflow line 2220 and go to ground via outflow line 2222. DACs 2232 connect to a target device 2230 via coupling 2210 (which, as described above, may be inductive, galvanic, or otherwise implemented).

DACs 2232 share a galvanic connection 2216, the behavior of which is influenced by the kinetic inductance of energy storage elements 2212. Galvanic connection 2216 couples the superconducting loops of DACs 2232 and results in a shared portion 2214 which is part of both DACs' superconducting loops. Shared portion 2214 also provides a kinetic inductance; the kinetic inductance of shared portion 2214 will, at least in part, define the bit weight ratio between DACs 2232 (i.e., the relative significance of the bits of DACs 2232 to their combined output signal). In some implementations, the kinetic inductance of shared portion 2214 is proportional to the kinetic inductance of the energy storage element 2212 of the more-significant DAC 2232 (e.g., energy storage element 2212a of DAC 2232a).

In some implementations, the kinetic inductance of shared portion 2214 is proportional to the sum of the kinetic inductance of shared portion 2214 and the kinetic inductance of the DAC 2232 representing the more significant digit(s) (relative to other DACs 2232 sharing shared portion 2214). That is, a total kinetic inductance may be split proportionately between shared portion 2214 and the more-significant DAC 2232 based on the desired bitweight of the less-significant DAC 2232. As current flows from energy storage element 2212b through galvanic connection 2216, it will be divided between shared portion 2214 and energy storage element 2212a proportionately to the ratio between their kinetic inductances. In effect, shared portion 2214 siphons off current from the output of less-significant DAC 2232 (e.g., DAC 2232b), thereby weakening its signal relative to more-significant DAC 2232 (e.g., DAC 2232a). The lower the kinetic inductance of shared portion 2214 is relative to the more-significant DAC 2232, the more current is siphoned off (since current has an inverse relationship with inductance) and the weaker the signal of the less-significant DAC 2232.

For example, if a 12-bit cascading DAC 2200 is desired, then two six-bit DACs 2232 may be provided where the less-significant DAC 2232b has a bitweight of 1/64 the bitweight of the more-significant DAC 2232a. Thus, each DAC's energy storage elements must be able to store energy equivalent to $2^6$=64 single-flux quanta $\Phi_0$ in the form of total inductance (kinetic and/or magnetic), and in the DACs' collective output signal, each $\Phi_0$-equivalent provided by the less-significant DAC 2232b contributes 1/64 of the energy of one $\Phi_0$ provided by the more-significant DAC 2232a. This may be accomplished, for example, by dividing 64 units of kinetic inductance between shared portion 2214 and energy storage element 2212a so that shared portion 2214 has 1 unit of kinetic inductance and energy storage element 2212a has 63 units of kinetic inductance, thereby causing 1/64th of the current output by less-significant DAC 2232b to enter energy storage element 2212a.

In at least some implementations of cascading DACs 2200 with a galvanic connection 2216 and a shared portion 2214 having a kinetic inductance proportional to the kinetic inductances of the energy storage elements 2212, the presently-described systems and methods may define a bitweight between DACs 2232 relatively more precisely and/or reliably than at least some magnetic-inductance based DACs. As discussed in greater detail below, energy storage elements 2212 and shared portion 2214 (identified generally as region 2240 in FIG. 22) may also or alternatively require relatively less space than at least some magnetic-inductance based DACs.

Exemplary Thin-Film Energy Storage Elements

Figure 23:
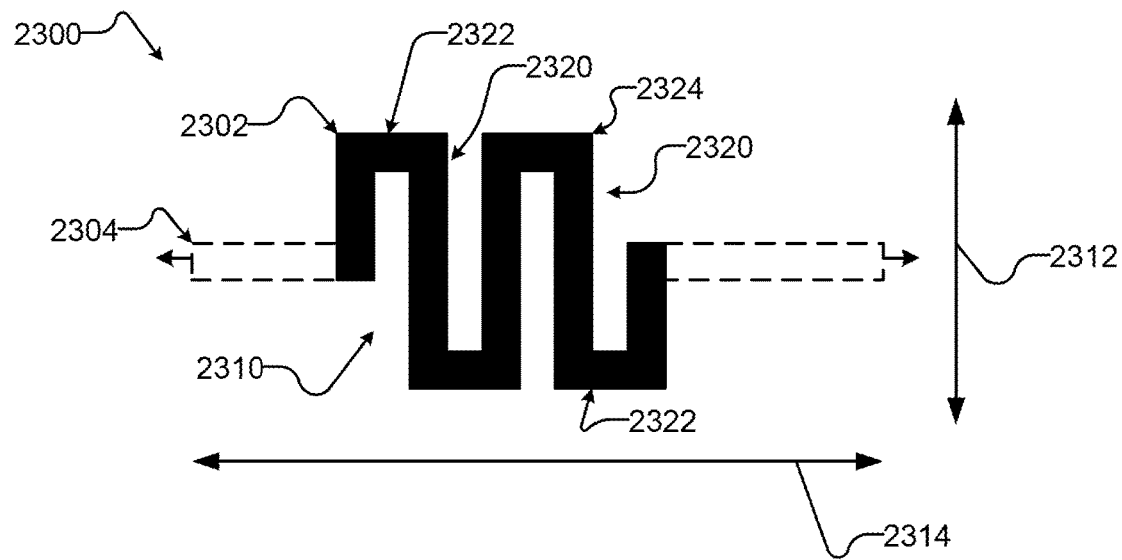
FIG. 23 is a schematic diagram of an exemplary implementation of a kinetic inductance energy storage element using a thin-film superconductor.

FIG. 23 shows an example energy storage region 2300 having a superconducting film 2302 coupled to a wire 2304. Wire 2304 may be a part of superconducting loop 2108 and/or may couple to superconducting loop 2108. Superconducting film 2302 is an example implementation of energy storage elements 2112 and/or 2212.

Superconducting film 2302 induces a kinetic inductance $L_K$ as part of its total inductance L. In general, total inductance L is given by $L=L_K+L_G$, where $L_G$ is the geometric inductance given by the magnetic field of superconducting film 2302. In general $L_K$ can be difficult to calculate, since it is proportional to the complex surface impedance $Z_s=R_s+iX_s$, where $R_s$ is the resistance of the material in the superconducting state and $X_s$ is the inductive component of the impedance $Z_s$ (including geometric and kinetic components). According to the Drude model of charge transport, solving for $R_s$ requires solving for the complex conductivity $$\sigma(\omega) = \frac{\sigma_0}{1 + i\omega\tau}.$$

However, for ideal superconductors at zero temperature, all excitations are suppressed and thus $R_s=0$. The calculation of the complex surface impedance may be further simplified where the geometric component of $X_s$ can be ignored. This is true of thin films where the thickness t of the film is substantially less than the effective penetration depth $\lambda_{eff}$ (i.e., $t<<\lambda_{eff}$). Thus, for a thin-film superconductor at zero at near-zero temperatures, the complex surface impedance reduces to approximately $Z_s=iX_s=i\omega L_K=i\omega L_K=i\omega\mu_0\lambda_{eff}$, where ω is the angular frequency, $\mu_0$ is the vacuum permeability constant, and $\lambda_{eff}$ is the effective penetration depth of the material.

The kinetic inductance of a superconducting film in near-zero temperatures is thus proportional to the effective penetration depth $\lambda_{eff}$. In particular, for a film with a given thickness t, the kinetic inductance of the film is proportional to the ratio of the width of the film W to the length of the film L, where length is in the direction of the current and width is orthogonal to length (note that both width and length are orthogonal to the dimension in which thickness is measured). That is, $$L_K \sim \lambda_{eff}\frac{L}{W}$$

for a superconducting film with a given thickness. Accordingly, to maximize kinetic inductance in the minimal volume, it may be desirable to minimize the width of film 2302, select a suitable material with high effective penetration depth $\lambda_{eff}$ (relative to wire 2304 and/or superconducting loop 208), and select a length for film 2302 which achieves the desired kinetic inductance. It may also be advantageous to minimize thickness t of the material, subject to fabrication constraints, since for $t<3\lambda_{eff(bulk)}$ (where $\lambda_{eff(bulk)}$ is the effective penetration depth of the material in bulk, not thin-film), $\lambda_{eff}$ increases proportionately to $1/t^2$. In some implementations, $t<n\cdot\lambda_{eff(bulk)}$, where n is some value substantially less than 1 (e.g., 0.5, 0.1, 0.05, 0.01, etc.).

In some implementations, film 2302 comprises a high-penetration-depth material such as NbN, NbTiN, or TiN. Other materials with high $\lambda_{eff}$ may alternatively, or additionally, be used. For example, in some implementations, granular aluminum may be used.

In some implementations, film 2302 is disposed entirely within a single fabrication layer of the quantum processor and is substantially planar. Planar arrangements of film 2302 may, for example, reduce the likelihood of phase drops due to flux and/or reduce the sensitivity of the kinetic inductance of film 2302 to variations in thickness between fabrication layers (thereby making it more likely that film 2302 will have consistent $\lambda_{eff}$ and more predictable kinetic inductance).

At least some such implementations are directed to compactly arranging energy storage elements 212 and/or 312 and/or reducing the strength of any flux given off by film 2302. For example, as shown in the example implementation of FIG. 23, film 2302 meanders within a planar area. In particular, film 2302 meanders within an area 2310 extending in a lengthwise dimension 2312 and a widthwise dimension 2314. Lengthwise portions 2320 of film 2302 extend across lengthwise dimension and are spaced apart in the widthwise dimension 2314. Widthwise portions 2322 couple lengthwise portions 2320. Such arrangements may reduce (relative to a linearly-arranged film 2302) the total distance in widthwise dimension 2314 required to obtain a particular kinetic inductance. Such arrangements may alternatively, or in addition, cause adjacent lengthwise portions 2320 may carry current in opposing directions, thereby causing film 2302 to destructively interfere with its own magnetic field (potentially reducing or eliminating the need for shielding and/or increasing predictability of the behavior of film 2302).

However, when current travelling through film 2302 turns at corner portions 2324, the kinetic inductance contributed by the length of film 2302 comprising that portion will generally be less than the kinetic inductance contributed by straight portions (such as the central areas of lengthwise portions 2314). For example, in some implementations, the contribution of corner portions 2324 where current takes a 90-degree turn, as shown in FIG. 23, is estimated to be approximately 0.55 the contribution of an equally-sized area where the current does not turn. In some implementations, the length of the meandering wire is increased to compensate for this. For example, if corner portions 2324 comprise approximately one-eighth of the area of film 2302, the length of film 2302 (measured as the current flows, and not necessarily in solely in the direction of either dimension 2312 or 2314) may be increased by approximately 7% (e.g., by an amount in the range of 5%-10%) to compensate for the effect of corner portions 2324.

Figure 24:
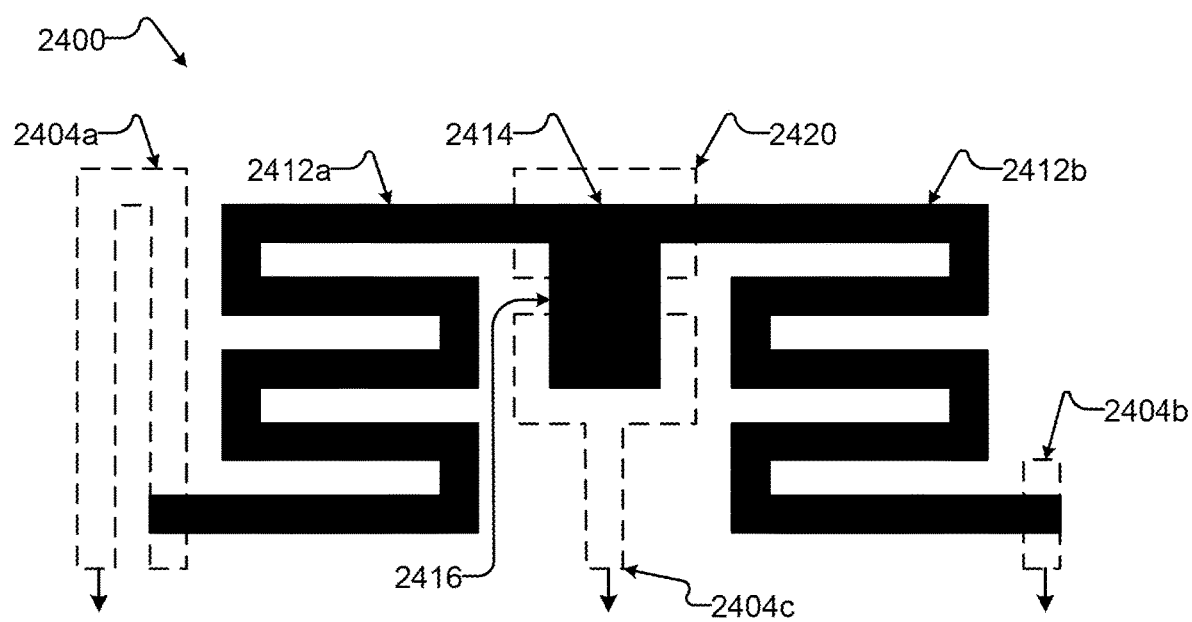
FIG. 24 is a schematic diagram of an exemplary implementation of plurality of kinetic inductance energy storage elements, including a shared portion for cascading DACs such as those shown in FIG. 3, using a thin-film superconductor.

FIG. 24 shows an example implementation of a cascading energy storage region 2400 having two superconducting films 2412a and 2412b (collectively and individually films 2412) galvanically coupled to a shared portion 2414. The features of region 2240 of FIG. 22 may be implemented, for example, by the features of FIG. 24; for instance, energy storage elements may be implemented, at least in part, by films 2412 and shared portion 2214 may be implemented, at least in part, by shared portion 2414. Films 2412 may be galvanically coupled to wires 2404a, 2404b, and/or 2404c (shown in dashed lines in FIG. 24; collectively and individually wires 2404).

In some implementations, it may be desirable to provide low kinetic inductance across shared portion 2414 relative to films 2412. One way to accomplish this is to make shared portion 2414 much shorter (i.e., having a shorter length in the direction of the current) than films 2412 (but otherwise having the same material, width, and thickness). However, fabrication constraints may not permit the formation of such a short shared portion 2412 (since typical fabrication techniques involve a minimum fabrication size). Further, more area may be required or desirable to reliably couple shared portion to other fabricated features such as wire 2404 and/or superconductor 2420.

An alternative (or additional) approach is to widen shared portion 2414 (i.e., expand the area of shared portion 2414 in a direction orthogonal to the direction in which current travels). As described above, kinetic inductance is proportional to the ratio of length to width, so (for example) doubling the width of shared portion 2414 may halve its kinetic inductance. This, however, may require significant additional area to be added if the length of shared portion 2414 is significant.

In some implementations, portions of films 2412 and/or shared portion 314 are coupled to one or more low-kinetic-inductance superconducting wires 2404 and/or other superconductors 2420. For example, in FIG. 24 an area of shared portion 2416 is coupled to wire 2404c and a further area is coupled to superconductor 2420. Superconductor 2420 may comprise a plate, via, or any other suitable structure. It does not necessarily couple to any other structure, although it may optionally do so.

In the coupled areas of shared portion 2414, current has an alternative low-inductance path and accordingly will not primarily travel through the high-inductance material of shared portion 2416. Thus, such coupled areas may not contribute significantly to the kinetic inductance of shared portion 2416. The remaining uncoupled area 2416 will have a kinetic inductance determined by its length, width, thickness, and material as described above. This provides a convenient way to provide shared portions 2216 of various sizes while still obtaining the desired kinetic inductance by shaping uncoupled area 2416.

Returning to the earlier example of a cascading DAC 2200 where there is a desired bitweight of 1/64 between DACs 2232, suppose that region 2400 is fabricated subject to a constraint that all features are formed by squares of material with a minimum side length of 0.25 μm. If each film 2412 meanders through an area that is 1.5 μm by 2.5 μm (i.e., 6 squares by 10 squares) and comprises five 6-square lengthwise portions connected by four 1-square widthwise portions (all portions being one square wide) plus a further two squares (one at either end of each film 2412 proximate to wires 2412 and superconductor 2420), then each film 2412 comprises 36 squares. Due to the effect of the 8 corner squares, each film 2412 has an effective kinetic inductance equivalent to that generated by approximately 32 linearly-arranged squares.

To attain a bitweight of 1/64 between DACs 2232, it may be desirable for shared portion 2414 (and/or uncoupled area 2414) to have 1/64th the kinetic inductance of each of films 2412. A shared portion 2414 with a width of one square would need a length of half a square (i.e., 0.125 μm, which violates the aforementioned example fabrication constraint). The desired bitweight could be obtained by doubling the length of films 2412, thereby causing a shared portion consisting of one square to be sufficient, although this would require significantly greater area for the extended films 2412. Alternatively, shared portion 2412 (and/or uncoupled area 2416) could be made twice as wide as it is long, thereby achieving substantially the same bitweight without extending films 2412 and resulting in a shared portion 2412 (and/or uncoupled area 2416) that is two squares wide and one square long.

For comparison, at least some magnetic inductance energy storage devices occupy areas having side lengths on the order of approximately 10 μm using conventional fabrication techniques (and some implementations are considerably larger than that). Accordingly, relative to at least some magnetic inductance energy storage devices, an equivalent kinetic inductance energy storage element might provide a planar area savings of over 95%. This is even more significant when it is considered that the disclosed kinetic inductance energy storage elements may be disposed entirely within one fabrication layer and emit a relatively weak magnetic field, whereas at least some magnetic inductance energy storage devices use several (and, in some implementations, all available) fabrication layers and emit relatively strong magnetic fields which may require additional shielding and/or require other devices to be spaced apart from the magnetic inductance energy storage devices.

The kinetic inductance response of superconducting thin film energy storage elements is believed to be substantially linear with changes in current, which may in some circumstances be desirable. This feature (as with other potentially-desirable features of kinetic inductance energy storage elements described elsewhere herein) is not necessary; for example, at least some implementations the Josephson junction energy storage elements described herein do not generally provide a linear response.

Exemplary Josephson Junction Energy Storage Elements

Figure 25A:
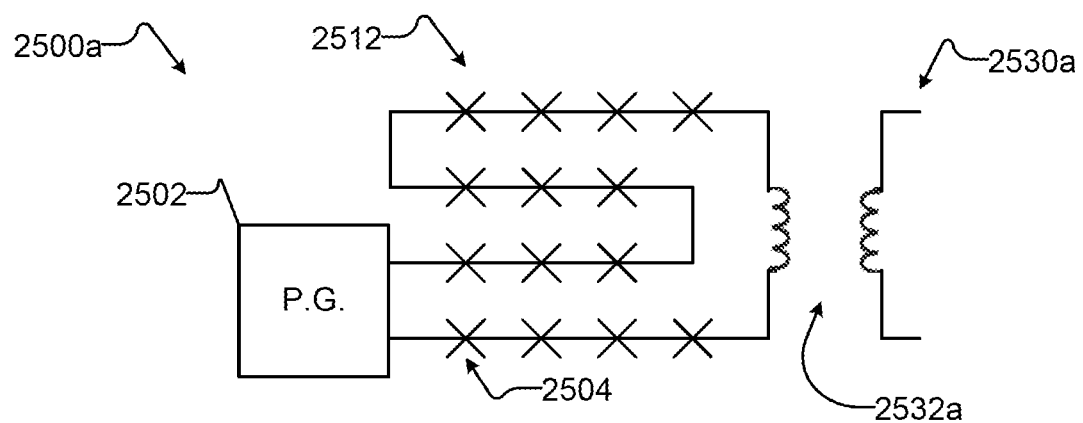
FIG. 25A is a schematic diagram of an exemplary implementation of a kinetic inductance energy storage element using serially-connected Josephson junctions where the DAC is coupled to a target device inductively.
Figure 25B:
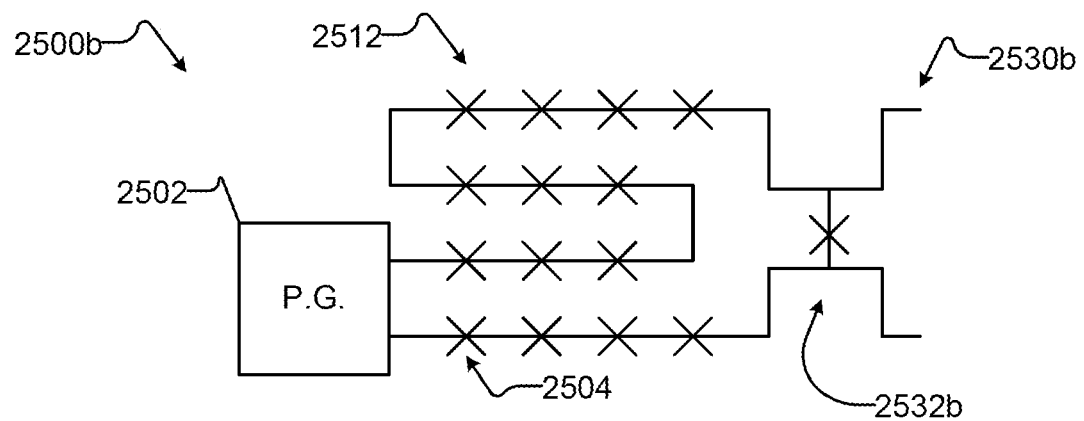
FIG. 25B is a schematic diagram of an exemplary implementation of a kinetic inductance energy storage element using serially-connected Josephson junctions where the DAC is coupled to a target device galvanically.

FIG. 25A shows an example Josephson junction energy storage element 2500a comprising a pulse generator 2502 (which may comprise, for example, an inflow wire, CJJ, etc.), a storage loop 2512 interrupted by one or more Josephson junctions 2504 (fourteen shown, only one called out in FIG. 25A), and a coupling 2532a with a target device 2530a. Example Josephson junction energy storage element 2500a is inductively coupled to target device 2530. FIG. 25B shows a Josephson junction energy storage element 2500b which is galvanically coupled to target device 2530b by a coupling 2532b. Josephson junction energy storage elements 2500a and 2500b are otherwise substantially similar, and for convenience are referred to herein collectively and individually as Josephson junction energy storage element 2500 having coupling 2532 with target device 2530.

Storage loop 2512 comprises N serially-connected Josephson junctions 2504. Each Josephson junction 2504 induces a Josephson inductance (a form of kinetic inductance) depending on the critical current $I_c$ of the Josephson junction 2504 (which, in general, is proportional to $R_N A$, the product of junction resistance $R_N$ and junction area A). Assuming that each Josephson junction 2504 has the same critical current $I_c$, the phase drop across each Josephson junction 2504 is $2\pi/N$ and the current circulating in storage loop 2512 corresponding to $p \cdot \Phi_0$ is $I = I_c \sin(2p\pi/N)$.

We can observe a minimal size for N to store a single flux quantum $\Phi_0$. Namely, for small N (roughly N<4), the storage of one $\Phi_0$ in storage loop 2512 will generally be unstable, due to a negative curvature of the free energy of the Josephson junctions 2504. The capacity of storage loop 2512 is approximately linear in N, so the minimal size for N for a given storage loop 2512 designed to store energy equivalent to $P\Phi_0$ is 4P. In practice, since junction critical currents $I_c$ may vary due to fabrication variations and/or other factors, it may be desirable to provide more than 4P Josephson junctions 2504 (to avoid the likelihood that a circuit used to inject flux to a N=4P ring would need to operate at a lower threshold of phase due to such variations). For example, in some implementations, N=8P Josephson junctions 2504 are provided in storage loop 2512.

Although energy storage of loop 2512 increases linearly with N, individual Josephson junctions do not respond linearly to p (i.e., with the amount of energy being stored). Whether this affects the linearity of the signal provided to target device 2530 (referred to as the "DAC response") depends on coupling 2532. If coupling 2532 comprises a linear inductance (e.g., as shown in FIG. 25A), then the DAC response will vary non-linearly with the current $I=I_c \sin(2p\pi/N)$. Accordingly, since $I_c$ is proportional to $R_N A$, such implementations may be sensitive to variations in $R_N A$. In some implementations, the $R_N A$ for each Josephson junction 2504 deviates from a target $R_N A$ by no more than a threshold amount.

However, if coupling 2532 comprises a galvanic connection with a shared Josephson junction 2504 (e.g., as shown in FIG. 25B), then the DAC response will vary approximately linearly (that is, it will vary linearly with the stored flux, or the kernel of $\sin(2p\pi/N)$). Such implementations will thus generally be insensitive to variations in $R_N A$, except that the overall storage loop 2512 will be constrained by the Josephson junction with the smallest critical current (as exceeding that current may result in unpredictable behavior).

Figure 26A:
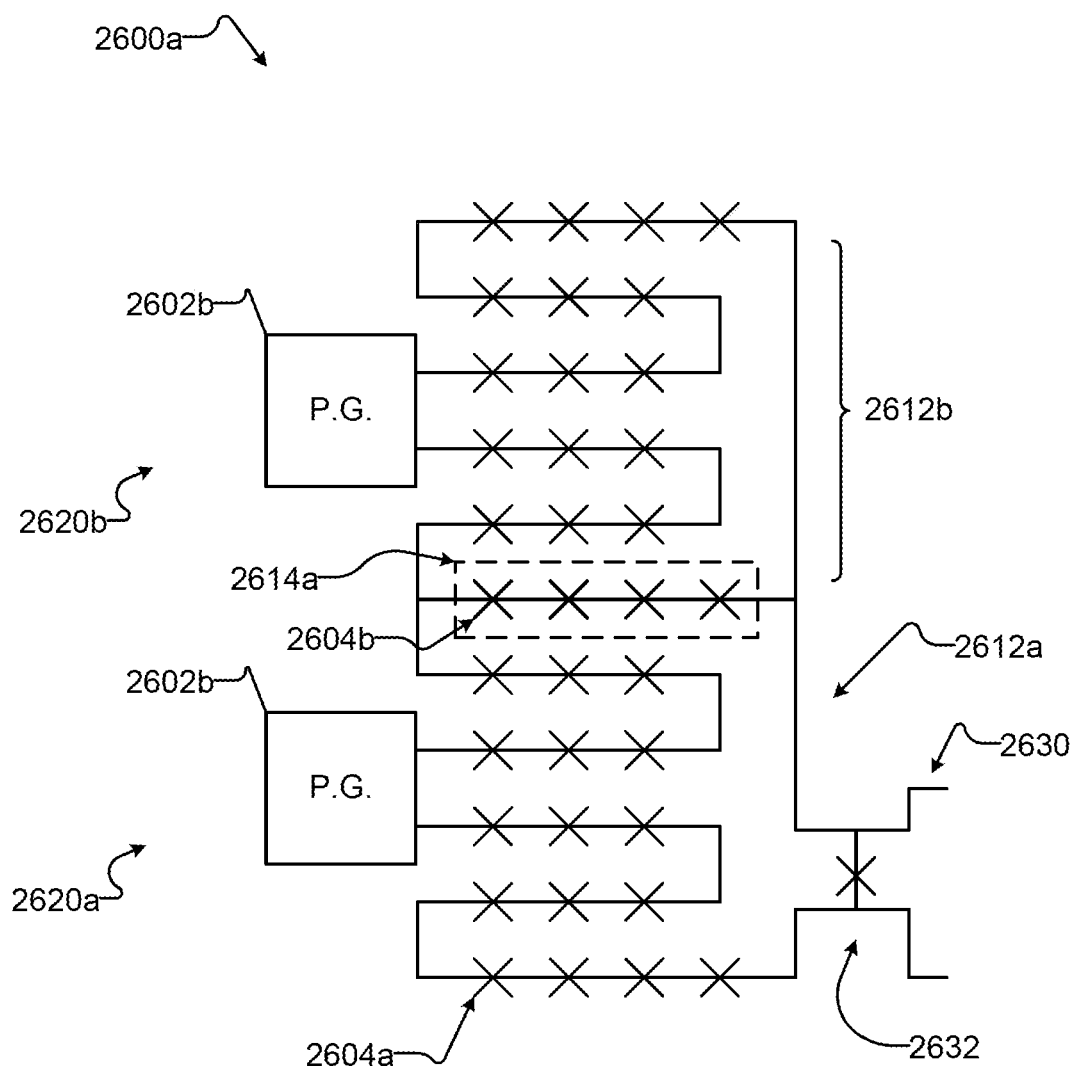
FIG. 26A is a schematic diagram of an exemplary implementation of two exemplary cascading DACs with serially-connected Josephson junctions.
Figure 26B:
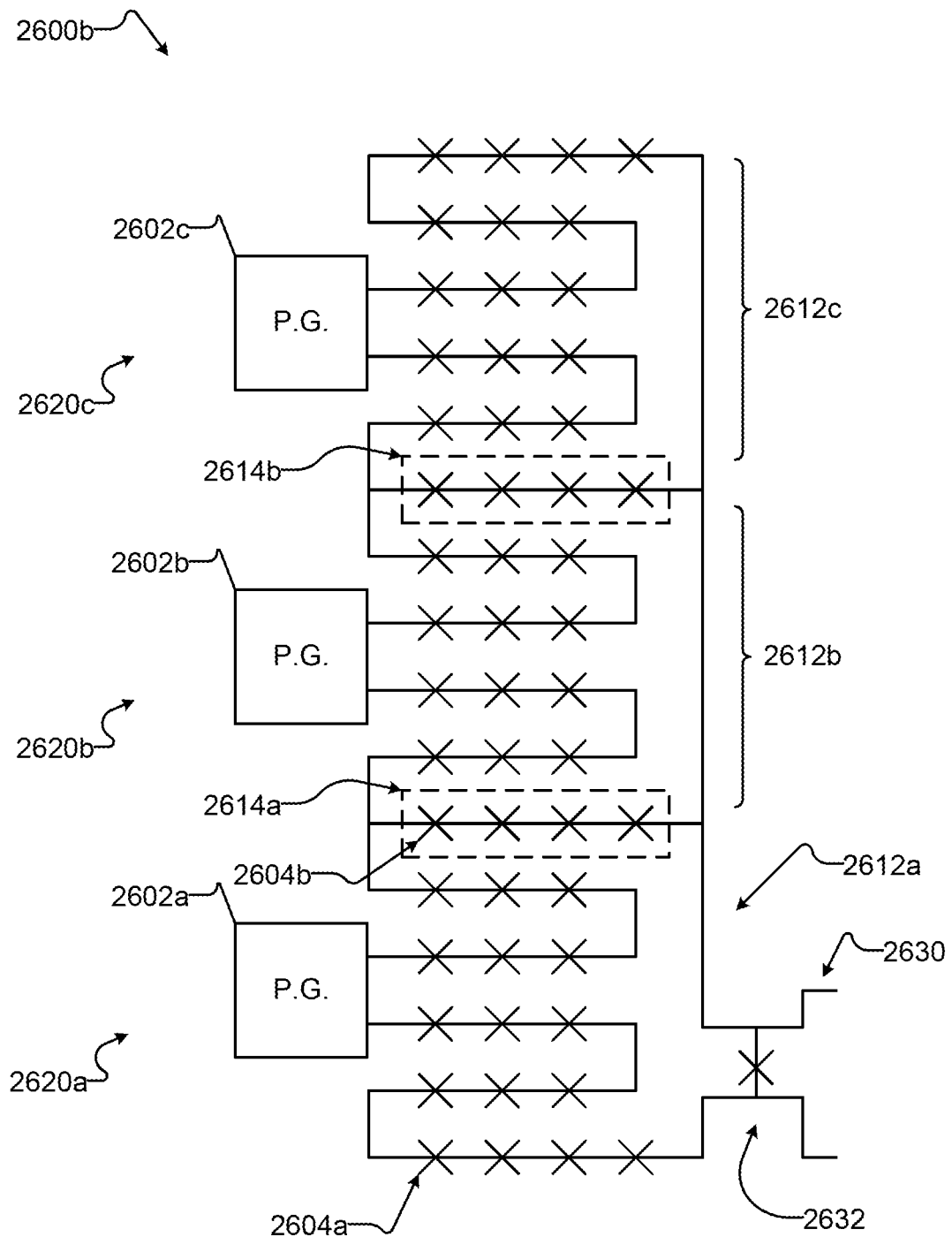
FIG. 26B is a schematic diagram of an exemplary implementation of three exemplary cascading DACs with serially-connected Josephson junctions.

FIGS. 26A and 26B show example cascading Josephson junction DACs 2600a and 2600b. FIG. 26A shows an example two-DAC embodiment which may, for example, be used to implement cascading DACs 2200 of FIG. 22. FIG. 26B shows an example three-DAC embodiment to illustrate the potential to expand to more than two cascading DACs. FIGS. 26A and 26B show DACs 2620a, 2620b, and (in FIG. 26B only) 2620c (collectively and individually referred to herein as DACs 2620) having storage loops 2612a, 2612b, and (in FIG. 26B only) 2612c (collectively and individually referred to herein as storage loops 2612) driven by respective pulse generators 2602a, 2602b and (in FIG. 26B only) 2602c, and coupled by shared portions 2614a and (in FIG. 26B only) 2614b (collectively and individually referred to herein as shared portions 2614). Loops 2612 comprise non-shared Josephson junctions 2604a and shared portions comprise shared Josephson junctions 2604b (collectively and individually referred to herein as Josephson junctions 2604).

DAC 2620a couples directly to target device 2630 via a coupling 2632 and therefore represents the most significant digit(s). DACs 2620b and 2620c are connected serially to DAC 2620a so that DAC 2620c represents the least significant digit(s) and DAC 2620b represents digit(s) with less significance than DAC 2620a and more significance than DAC 2620c. Shared portions 2614 comprise Josephson junctions 2604 which are common to adjacent DACs 2620. For instance, storage loops 2612a and 2612b each comprise shared portion 2614a and storage loops 2612b and 2612c each comprise shared portion 2614b.

The relative bitweights of the DACs 2612 are determined in part by shared portions 2614. Suppose that each of two adjacent loops 2612 comprise N Josephson junctions 2604, of which M Josephson junctions 2604 are common (i.e., the shared portion 2614 has M Josephson junctions 2604). As discussed above, for an energy equivalent to a flux of $p\Phi_0$ stored across one loop 2612a, there is a phase drop of $2p\pi/N$ across each Josephson junction 2604. Accordingly, there is a total phase drop of $2Mp\pi/N$ across all of the Josephson junctions 2604 of shared portion 2614. This will induce a corresponding phase drop of $2Mp\pi/N(N-M)$ across the other loop 2612b. If an energy equivalent to a flux of $q\Phi_0$ is also stored across the other loop 2612, then the phase drop across a non-shared Josephson junction 2604a in loop 2612a will be $(2\pi/N)(p-q \cdot M/(N-M))$, yielding an effective bitweight ratio of $M/(N-M)$. For instance, if N=80 and M=8, then the bitweight ratio would be 1/9.

Since energy stored in one loop 2612 will effectively "spill over" into adjacent loops 2612 (and potentially beyond, if further loops 2612 are cascaded together), each Josephson junction 2604 may experience a phase drop that is larger than the approximately $2\pi p/N$ predicted in the single-loop case. Instead, for a two-loop implementation, the maximum phase drop (found when p=−q for maximal p) across non-shared Josephson junctions 2604a is approximately $2\pi p/(N-M)$, and the maximum phase drop across shared Josephson junctions 2604b is $4\pi p/N$, roughly twice the maximum phase drop of the single-loop case.

Accordingly, in some implementations the area of shared Josephson junctions 2604b is greater than the area of non-shared Josephson junctions 2604a. For example, shared Josephson junctions 2604b may have twice the area of non-shared Josephson junctions 2604a. As another example, shared Josephson junctions 2604b may have an area 2N/(N−M) times larger than non-shared Josephson junctions 2604a (though for N>>M this amounts to roughly the same thing).

Since the phase drop across each Josephson junction 2604 is proportional to the area of the junction, increasing the area of shared Josephson junctions 2604b will result in a smaller total phase drop across shared portion 2614 for a given M. This effect may be mitigated by increasing the size of M proportionately to the increase in the area of shared portion 2614. For example, if the area of shared Josephson junctions 2604b is twice that of non-shared Josephson junctions 2604a then the size of M may be doubled to accommodate the same maximum energy storage.

Alternatively, the size of Josephson junctions 2604a and 2604b can be the same and currents applied to loops 2612a and 2612b can be restricted to avoid overloading shared Josephson junctions 2604b.

More than two Josephson junction DACs 2620 may be cascaded together, as shown (for example) in FIG. 26B. In general, if N Josephson junctions 2604 are arranged serially in a single loop 2612, that loop has a dynamic range of R, but the dynamic range of D loops 2612 with N Josephson junctions 2604 split between them is approximately $(R/D)^D$. For example, assuming 8 Josephson junctions 2604 for each $\Phi_0$ of capacity, four loops 2612 could achieve a dynamic range of $1000\Phi_0$ with approximately 180 Josephson junctions 2604, whereas three loops 2604 would require approximately 240 Josephson junctions 2604 and two loops 2604 would require approximately 500 Josephson junctions 2604 to achieve the same dynamic range.

As is evident from the foregoing discussion, the design of cascading Josephson junction based DACs with a desired bitweight is likely to be substantially simpler than the design of an equivalent magnetic inductance DAC, which is generally done by simulating a magnetic field around a complex three dimensional magnetic structure. Further, bitweight ratios are generally relatively insensitive to variations in layer thickness and $R_NA$, which may provide relatively predictable behavior compared to certain magnetic inductance DACs. Additionally, although some implementations of Josephson junction DACs may require relatively more area than some implementations of thin-film energy storage DACs, both have the potential to use a substantially reduced planar footprint, use fewer layers, and produce less substantial degrees of magnetic interference than at least some magnetic inductance DACs, despite storing an equivalent amount of energy.

Enumerated Example Embodiments

The following enumerated example embodiments provide examples of features, and feature combinations, of non-limiting example embodiments of the invention.

Example embodiment 1. A system, comprising:
at least a first multi junction superconducting quantum interface device (SQUID) flux-pump comprising: a number N of loops where N is an integer greater than or equal to two and each loop comprises a material that superconducts at least at a critical temperature, each of the loops having a portion shared by a successively adjacent one of the loops, a number M of Josephson junctions, where M is greater than N, each of the portions of the loops shared by the successively adjacent one of the loops interrupted by at least one of the Josephson junctions, each of the loops having a respective storage inductance; and
a first number N of interfaces positioned with respect to respective ones of the loops to selectively communicatively couple a flux therewith.

Example embodiment 2. The system according to example embodiment 1, further comprising:
a digital-to-analog converter (DAC) coupled to an endmost one of the loops of the first multi junction SQUID flux-pump, the DAC comprising a loop of a material that superconducts at least at the critical temperature and a storage inductance.

Example embodiment 3. The system according to example embodiment 2 wherein the storage inductance of the DAC is at least one of a magnetic inductance, a kinetic inductance, a Josephson inductance, or a combination of two or more of a magnetic inductance, a kinetic inductance, a Josephson inductance.

Example embodiment 4. The system according to example embodiment 1 wherein the loop of the DAC includes a portion shared by the endmost loop of the first multi junction SQUID flux-pump.

Example embodiment 5. The system according to example embodiment 1 wherein the interfaces of the first number N of interfaces are each respective inductive interfaces positioned proximate the storage inductances of respective ones of the loops of the first multi junction SQUID flux-pump.

Example embodiment 6. The system according to example embodiment 1 wherein the loops of the first multi junction SQUID flux-pump form a linear array of loops.

Example embodiment 7. The system according to example embodiment 1 wherein the number N is between 2 inclusive and 4 inclusive.

Example embodiment 8. The system according to example embodiment 1 wherein the number M is equal to N+1.

Example embodiment 9. The system according to any of example embodiments 1 through 8, further comprising:

control circuitry operable to implement a multi-phase radio frequency (RF) clocking of flux signals with no direct current (DC) bias to the loops of the first multi junction SQUID flux-pump.

Example embodiment 10. The system according to example embodiment 9 wherein the multi-phase radio frequency (RF) clocking of flux signals pushes flux sequentially through the loops of the first multi junction SQUID flux-pump into the DAC.

Example embodiment 11. The system according to example embodiment 9 wherein the multi-phase radio frequency (RF) clocking of flux signals pushes flux sequentially through the loops of the first multi junction SQUID flux-pump out of the DAC.

Example embodiment 12. The system according to example embodiment 9 wherein a total number of phases of the multi-phase radio frequency (RF) clocking of flux signals is equal to the total number N of loops of the first multi-junction SQUID flux-pump into the DAC.

Example embodiment 13. The system according to any of example embodiments 1 through 8, further comprising:
control circuitry communicatively coupled to sequentially apply flux signals to the loops of the first multi junction SQUID flux-pump via the first number N of interfaces where a respective flux signal applied to each interface is advanced by $\pi/2$ with respect to a respective flux signal applied to an immediately following one of the loops along a linear succession of the loops the first multi junction SQUID flux-pump.

Example embodiment 14. The system according to any of example embodiments 1 through 8, further comprising:
control circuitry communicatively coupled to sequentially apply flux signals to the loops of the first multi junction SQUID flux-pump via the first number N of interfaces where a respective flux signal applied to each interface is retarded by $\pi/2$ with respect to a respective flux signal applied to an immediately following one of the loops along a linear succession of the loops the first multi junction SQUID flux-pump.

Example embodiment 15. The system according to example embodiment 1, further comprising:
a first set of control lines, the first set of control lines consisting of a first control line coupled to the interface of a first one of the loops of the first multi junction SQUID flux-pump, a second control line coupled to the interface of a second one of the loops of the first multi junction SQUID flux-pump, and a third control line coupled to the interface of a third one of the loops of the first multi junction SQUID flux-pump.

Example embodiment 16. The system according to example embodiment 1, further comprising:
a plurality of additional multi junction SQUID flux-pumps each comprising: a respective number N of loops, each of the loops having a portion shared by a successively adjacent one of the loops, a respective number M of Josephson junctions, each of the portions of the loops shared by the successively adjacent one of the loops interrupted by at least one of the Josephson junctions, each of the loops having a respective storage inductance; and
for each of the additional multi junction SQUID flux-pumps, an additional number N of interfaces positioned with respect to respective ones of the loops of a respective one of the additional multi junction SQUID flux-pumps to selectively communicatively couple a flux therewith.

Example embodiment 17. The system according to example embodiment 16, further comprising:

a first set of control lines, the first set of control lines including a first subset of control lines, the first subset of control lines comprising of a first control line coupled to the interface of a respective first one of the loops of each multi junction SQUID flux-pump of a first subset of the multi junction SQUID flux-pumps, a second control line coupled to the interface of a respective second one of the loops of each multi junction SQUID flux-pump of the first subset of the multi junction SQUID flux-pumps, and a third control line coupled to the interface of a respective third one of the loops of each multi junction SQUID flux-pump of the first subset of multi junction SQUID flux-pumps, where the first subset of multi junction SQUID flux-pumps includes at least 3 multi junction SQUID flux-pumps.

Example embodiment 18. The system according to example embodiment 17 wherein:
the first set of control lines includes a second subset of control lines, the second subset of control lines comprising of a first control line coupled to the interface of a respective first one of the loops of each multi junction SQUID flux-pump of a second subset of the multi junction SQUID flux-pumps, a second control line coupled to the interface of a respective second one of the loops of each multi junction SQUID flux-pump of the second subset of the multi junction SQUID flux-pumps, and a third control line coupled to the interface of a respective third one of the loops of each multi-junction SQUID flux-pump of the second subset of multi junction SQUID flux-pumps, where the second subset of multi junction SQUID flux-pumps includes at least 3 multi-junction SQUID flux-pumps.

Example embodiment 19. The system according to example embodiment 16, further comprising:
a first set of J control lines, J=2×N, and wherein there are total number I of multi junction SQUID flux-pumps and I is equal to 2(N+1).

Example embodiment 20. A method of operation in a system, the system including: a plurality of multi junction superconducting quantum interface device (SQUID) flux-pumps, each comprising: a number N of loops where N is an integer greater than or equal to two, each of the loops having a portion shared by a successively adjacent one of the loops, a number M of Josephson junctions, where M is greater than N, each of the portions of the loops shared by the successively adjacent one of the loops interrupted by at least one of the Josephson junctions, each of the loops having a respective storage inductance; for each of the multi junction SQUID flux-pump a number N of interfaces positioned with respect to respective ones of the loops of the respective multi junction SQUID flux-pump to selectively communicatively couple a flux therewith, the method comprising:
sequentially:
applying flux signals to a first one of the loops of a first one of the multi junction SQUID flux-pumps via a respective first one of the interfaces; and
applying flux signals to a second one of the loops of the first one of the multi junction SQUID flux-pumps via a respective second one of the interfaces, where the flux signal applied to the second one of the loops is out of phase with the flux signal applied to the first one of the loops.

Example embodiment 21. The method according to example embodiment 20, further comprising:
applying flux signals to at least a third one of the loops of the first one of the multi junction SQUID flux-pumps via a respective third one of the interfaces, where the flux signal applied to the third one of the loops is out of phase with the flux signal applied to the second one of the loops.

Example embodiment 22. The method according to example embodiment 21, further comprising:
applying flux signals to at least a fourth one of the loops of the first one of the multi junction SQUID flux-pumps via a respective fourth one of the interfaces, where the flux signal applied to the fourth one of the loops is out of phase with the flux signal applied to the third one of the loops.

Example embodiment 23. The method according to example embodiment 21 wherein applying flux signals to the first, the second and the third ones of the loops of the first one of the multi junction SQUID flux-pumps includes applying a respective flux signal to each of the respective first, second and at least third interface that is $\pi/2$ out of phase with respect to the respective flux signal applied to an immediately following one of the loops along a linear succession of the loops the first one of the multi-junction SQUID flux-pumps.

Example embodiment 24. The method according to example embodiment 23 wherein applying flux signals to the first, the second and the third ones of the loops of the first one of the multi junction SQUID flux-pumps comprise:
applying flux signals to the first, the second and the third ones of the loops of the first one of the multi junction SQUID flux-pumps where the respective flux signal applied to each of the respective first, second and at least third interface is advanced by $\pi/2$ with respect to a respective flux signal applied to an immediately following one of the loops along a linear succession of the loops the first multi junction SQUID flux-pump.

Example embodiment 25. The method according to example embodiment 23 wherein applying flux signals to the first, the second and the third ones of the loops of the first one of the multi junction SQUID flux-pumps comprises:
applying flux signals to the first, the second and the third ones of the loops of the first one of the multi junction SQUID flux-pumps where the respective flux signal applied to each of the respective first, second and at least third interface is retarded by $\pi/2$ with respect to a respective flux signal applied to an immediately following one of the loops along a linear succession of the loops the first multi junction SQUID flux-pump.

Example embodiment 26. The method according to example embodiment 21 wherein applying flux signals to the first, the second and the third ones of the loops of the first one of the multi junction SQUID flux-pumps comprises: applying flux signals that pushes flux sequentially through the loops of the first multi-junction SQUID flux-pump into a digital-to-analog converter (DAC).

Example embodiment 27. The method according to example embodiment 21 wherein applying flux signals to the first, the second and the third ones of the loops of the first one of the multi junction SQUID flux-pumps comprises: applying flux signals that pushes flux sequentially through the loops of the first multi-junction SQUID flux-pump out of a digital-to-analog converter (DAC).

Example embodiment 28. The method according to example embodiment 21 wherein applying flux signals to the first, the second and the third ones of the loops of the first one of the multi junction SQUID flux-pumps comprises: applying flux signals of a first sign and a first magnitude via a first, a second and a third control line; and further comprising:
applying a flux signal of a second sign and the first magnitude to at least one of the loops of a second one of the multi junction SQUID flux-pumps via a fourth control line sequentially with the applying flux signals to the first, the second and the third ones of the loops of the first one of the multi junction SQUID flux-pumps, the second sign opposite the first sign.

Example embodiment 29. A method of operation in a system, the system including: a plurality of multi junction superconducting quantum interface device (SQUID) flux-pumps, each comprising: a number N of loops where N is an integer greater than or equal to two, each of the loops having a portion shared by a successively adjacent one of the loops, a number M of Josephson junctions, where M is greater than N, each of the portions of the loops shared by the successively adjacent one of the loops interrupted by at least one of the Josephson junctions, each of the loops having a respective storage inductance; for each of the multi junction SQUID flux-pump a number N of interfaces positioned with respect to respective ones of the loops of the respective multi junction SQUID flux-pump to selectively communicatively couple a flux therewith, the method comprising:
concurrently:
applying flux signals of a first sign and a first magnitude to a first one of the loops of a first one of the multi junction SQUID flux-pumps via a respective first one of the interfaces; and
applying flux signals of the first sign and the first magnitude to all of the other loops of the first one of the multi junction SQUID flux-pumps via a respective second one of the interfaces, where the flux signal applied to all of the loops are in phase with one another.

Example embodiment 30. The method according to example embodiment 29 wherein applying flux signals of the first sign and the first magnitude to all of the other loops of the first one of the multi junction SQUID flux-pumps includes first applying flux signals of the first sign and the first magnitude to a first, a second, and at least a third loop of the first one of the multi junction SQUID flux-pumps via respective ones of a first, a second and a third control line.

Example embodiment 31. A method of operation in a computing system, the computing system including: a plurality of digital-to-analog converters (DACs); a number of quantum flux parametron (QFP) based shift registers, each with a respective set of QFP-based shift register elements, that each are one of magnetically or galvanically coupleable to the respective ones of the DACs, a plurality of power lines; and a plurality of trigger lines, wherein: each of the DACs is independently addressable by a triplet of three signals a successive number of times to store a variable number of flux quanta, the triplet of three signals including a first signal received via the shift register elements, a second signal received via the power line, and a third signal received via the trigger line, the method, comprising:
resetting all of the DACs;
applying a signal to one or more of the power lines;
applying a clockwise persistent current to a first number of the QFP-based shift register elements which are coupled to the DACs into which quantums of flux are to be loaded;
applying a counter-clockwise persistent current to a second number of the QFP-based shift register elements which are coupled to the DACs into which quantums of flux are not to be loaded; and
for a first number of times, applying a signal to the trigger line, where the first number of times is equal to a total number of quantums of flux to be loaded.

Example embodiment 32. The method according to example embodiment 31, further comprising:
sorting all of the DACs based on a number of quantums of flux to be loaded to the DACs;
for an integer number i times from i equals 2 to a maximum number of quantums of flux n to be programmed:
applying a clockwise persistent current to a number of the QFP-based shift register elements which are coupled to the DACs into which at least i quantums of flux are to be loaded;
applying a counter-clockwise persistent current to a number of the QFP-based shift register elements which are coupled to the DACs into which less than i quantums of flux are to be loaded; and
applying a signal to the trigger line.

Example embodiment 33. The method according to example embodiment 32 wherein the maximum number of quantums of flux n is between 18 and 22.

Example embodiment 34. A method of operating a system, the system including: a number of quantum flux parametrons (QFPs); at least one pair of quantum flux parametron digital-to-analog converters (QFP-DACs); a current bias line that applies a current bias to both of the QFP-DACs of the at least one pair of the QFP-DACs without any bias resistors; and for each QFP of the number of QFPs, a respective first number of quantum flux parametron latches (QFP-latches) selectively operable to communicatively couple flux between the QFP and a first one of the QFP-DACs of the at least one pair of QFP-DACs and a respective second number of QFP-latches selectively operable to communicatively couple flux between the QFP and a second one of the QFP-DACs of the at least one pair of QFP-DACs, the method comprising:
during a first period of time, concurrently:
applying signals to a first one of the first number of the QFP-latches; and
applying signals to a first one of the second number of the QFP-latches; and
to transfer a flux quanta state between least one of the QFP-DACs of the at least one pair of the QFP-DACs and a respective one of the quantum flux parametrons.

Example embodiment 35. The method according to example embodiment 34, further comprising:
applying signals to a first one of the QFP-DACs; and
applying signals to a second one of the QFP-DACs.

Example embodiment 36. The method according to example embodiment 35 wherein applying signals to a first one of the first number of the QFP-latches and applying signals to a first one of the QFP-DACs includes sequentially applying the signals to load information into the first one of the DACs, and wherein applying signals to a first one of the second number of the QFP-latches and applying signals to a second one of the QFP-DACs includes sequentially applying the signals to load information into the second one of the DACs.

Example embodiment 37. The method according to example embodiment 34, further comprising:
applying signals to a second one of the first pair of the QFP-latches; and
applying signals to a second one of the second pair of the QFP-latches.

Example embodiment 38. The method according to example embodiment 37, further comprising:
applying signals to a first one of the QFP-DACs sequentially with applying signals to the first and the second QFP-latches of the first number of QFP-latches; and
applying signals to a second one of the QFP-DACs sequentially with applying signals to the first and the second QFP-latch of the second number of QFP-latches.

Example embodiment 39. The method according to example embodiment 38 wherein applying signals to a first one of the QFP-DACs includes applying a respective second latch signal to the first one of the QFP-DACs and applying signals to a second one of the QFP-DACs includes applying the respective second latch signal to the second one of the QFP-DACs.

Example embodiment 40. The method according to example embodiment 38 wherein applying signals to a first one of the QFP-DACs includes applying a respective first tip signal to the first one of the QFP-DACs at a same time as applying the second latch signal thereto, and applying signals to a second one of the QFP-DACs includes applying the respective first tip signal to the second one of the QFP-DACs at a same time as applying the second latch signal thereto.

Example embodiment 41. The method according to example embodiment 40, further comprising:
  applying a reset signal to at least one of the QFP-DACs; and
  applying a respective offset signal to at least one of the QFP-DACs.

Example embodiment 42. The method according to example embodiment 37 wherein applying signals to a first and a second one of the first number of the QFP-latches and applying signals to a first and a second one of the second number of the QFP-latches includes applying signals to the QFP-latches to load information into the QFP-DACs.

Example embodiment 43. The method according to example embodiment 42, further comprising:
  applying reset signals to the QFP-DACs prior to applying signals to the QFP-latches to load information into the QFP-DACs in a given cycle.

Example embodiment 44. The method according to example embodiment 37 wherein applying signals to a first and a second one of the first number of the QFP-latches and applying signals to a first and a second one of the second number of the QFP-latches includes applying signals to the QFP-latches to operate as a quantum flux parametron demultiplexer (QFP-Demux).

Example embodiment 45. The method according to example embodiment 44, further comprising:
  applying reset signals to the QFP-DACs prior to applying signals to the QFP-latches to operate as a QFP-Demux in a given cycle.

Example embodiment 46. The method according to example embodiment 37 wherein applying signals to a first and a second one of the first number of the QFP-latches and applying signals to a first and a second one of the second number of the QFP-latches includes applying signals to the QFP-latches to load information from the QFP-DACs.

Example embodiment 47. The method according to example embodiment 37 wherein applying signals to a first and a second one of the first number of the QFP-latches and applying signals to a first and a second one of the second number of the QFP-latches includes applying signals to operate as a quantum flux parametron multiplexer (QFP-Mux).

Example embodiment 48. The method according to example embodiment 34 wherein applying signals to a first one of the first number of the QFP-latches includes applying a respective first latch signal to the first one of the first number of the QFP-latches and applying signals to a first one of the second number of the QFP-latches includes applying a logical inverse of the respective first latch signal to the first one of the second number of the QFP-latches.

Example embodiment 49. The method according to example embodiment 48 wherein applying signals to a first one of the first number of the QFP-latches includes applying a respective first offset signal to the first one of the first number of the QFP-latches and applying signals to a first one of the second number of the QFP-latches includes applying the respective first offset signal to the first one of the second number of the QFP-latches.

Example embodiment 50. The method according to example embodiment 34 wherein applying signals to a first one of the first number of the QFP-latches includes applying a respective first address signal to the first one of the first number of the QFP-latches and applying signals to a first one of the second number of the QFP-latches includes applying a logical inverse of the respective address signal to the first one of the second number of the QFP-latches.

Example embodiment 51. The method according to example embodiment 50, further comprising:
  summing a plurality of address lines together logarithmically into one of the QFPs.

Example embodiment 52. The method according to example embodiment 50 wherein applying signals to a first one of the first number of the QFP-latches includes applying a respective first latch signal to the first one of the first number of the QFP-latches and applying signals to a first one of the second number of the QFP-latches includes applying the respective first latch signal to the first one of the second number of the QFP-latches.

Example embodiment 53. A system, comprising:
  a number N of signal lines; and
  a number $4(N-1)2$ of digital-to-analog converters (DACs) that are communicatively coupled to respective triplets of the signal lines to be controlled via signals carried by the respective triplet of signal lines, each of the DACs of the number of DACs including a respective loop of material and a respective pair of Josephson junctions that interrupt the respective loop and are electrically coupled in parallel with one another in the loop of material.

Example embodiment 54. The system according to example embodiment 53 wherein the number N of signal lines includes a set of control lines and a set of power lines, and each triplet is comprised of a unique combination of two of the control lines and one of the power lines.

Example embodiment 55. The system according to example embodiment 53 wherein the signal lines are each comprised of material that superconducts at least at a critical temperature, and the respective loop of material of each of the DACs is comprised of a material that superconducts at least at the critical temperature.

Example embodiment 56. The system according to example embodiment 53 wherein the DACs are arrayed in a plurality of two-dimensional arrays, each of the two-dimensional arrays including a respective plurality of the DACs, and the number of signal lines includes a first subset of the signal lines, each signal line of the first subset of the signal lines communicatively coupled to the DACs of a respective one of the two-dimensional arrays.

Example embodiment 57. The system according to example embodiment 56 wherein each signal line of the first subset of the signal lines communicatively coupled to all of the DACs of the respective one of the two-dimensional arrays.

Example embodiment 58. The system according to any of example embodiments 56 or 57 wherein the number of signal lines includes a second subset of the signal lines, each signal line of the second subset of the signal lines communicatively coupled to a subset of the DACs on each two or more of the two-dimensional arrays.

Example embodiment 59. The system according to example embodiment 58, further comprising:

control circuitry communicatively coupled to cause signals to be supplied to selected ones of the DACs via respective triplets of signal lines.

Example embodiment 60. The system according to any of example embodiments 56 or 57 wherein the number of signal lines includes a second subset of the signal lines, each signal line of the second subset of the signal lines communicatively coupled to a subset of the DACs of all of the two-dimensional arrays.

Example embodiment 61. A system, comprising:
a first two-dimensional array of digital-to-analog converters (DACs), the first two-dimensional array comprising a plurality of DACs;
at least a second two-dimensional array of DACs, the second two-dimensional array comprising a plurality of DACs that are not DACs in the first two-dimensional array;
a first power line coupled to selectively provide a current to the DACS of the first two-dimensional array of DACs;
a second power line coupled to selectively provide a current to the DACS of the second two-dimensional array of DACs; and
a set of control lines, the set of control lines including at least:
a first control line, the first control line positioned proximate each DAC along a first diagonal of the first two-dimensional array of DACs to communicatively couple with the respective DACs along the first diagonal of the first two-dimensional array of DACs, the first control line also positioned proximate each DAC along a first diagonal of the second two-dimensional array of DACs to communicatively couple with the respective DACs along the first diagonal of the second two-dimensional array of DACs.

Example embodiment 62. The system according to example embodiment 61 wherein the DACs of the first two-dimensional array of DACs are arrayed in a number of rows and a number of columns and the first diagonal of the first two-dimensional array of DACs extends across all rows and all columns of the first two-dimensional array of DACs.

Example embodiment 63. The system according to example embodiment 62 wherein the DACs of the second two-dimensional array of DACs are arrayed in a number of rows and a number of columns and the first diagonal of the second two-dimensional array of DACs extends across all rows and all columns of the second two-dimensional array of DACs.

Example embodiment 64. The system according to example embodiment 61, further comprising:
a third two-dimensional array of DACs, the third two-dimensional array comprising a plurality of DACs that are not DACs in the first or the second two-dimensional arrays;
a fourth two-dimensional array of DACs, the fourth two-dimensional array comprising a plurality of DACs that are not DACs in the first, the second or the third two-dimensional arrays;
a third power line coupled to selectively provide a current to the DACS of the third two-dimensional array of DACs; and
a fourth power line coupled to selectively provide a current to the DACS of the fourth two-dimensional array of DACs, wherein
the first control line is positioned proximate each DAC along a first diagonal of the third dimensional array of DACs to communicatively couple with the respective DACs along the first diagonal of the third two-dimensional array of DACs; and the first control line is further positioned proximate each DAC along a first diagonal of the fourth dimensional array of DACs to communicatively couple with the respective DACs along the first diagonal of the fourth two-dimensional array of DACs.

Example embodiment 65. The system according to example embodiment 64 wherein the DACs of the first two-dimensional array of DACs are arrayed in a number of rows and a number of columns and the first diagonal of the first two-dimensional array of DACs extends across all rows and all columns of the first two-dimensional array of DACs.

Example embodiment 66. The system according to example embodiment 65 wherein the DACs of the second two-dimensional array of DACs are arrayed in a number of rows and a number of columns and the first diagonal of the second two-dimensional array of DACs extends across all rows and all columns of the second two-dimensional array of DACs.

Example embodiment 67. The system according to example embodiment 66 wherein the DACs of the third two-dimensional array of DACs are arrayed in a number of rows and a number of columns and the first diagonal of the third two-dimensional array of DACs extends across all rows and all columns of the third two-dimensional array of DACs.

Example embodiment 68. The system according to example embodiment 67 wherein the DACs of the fourth two-dimensional array of DACs are arrayed in a number of rows and a number of columns and the first diagonal of the fourth two-dimensional array of DACs extends across all rows and all columns of the fourth two-dimensional array of DACs.

Example embodiment 69. The system according to example embodiment 65 wherein the first diagonal of the second two-dimensional array is perpendicular to the first diagonal of the first two-dimensional array and the first diagonal of the third two-dimensional array is perpendicular to the first diagonal of the second two-dimensional array.

Example embodiment 70. The system according to example embodiment 65 wherein the first diagonal of the fourth two-dimensional array is perpendicular to the first diagonal of the first two-dimensional array and the first diagonal of the fourth two-dimensional array is perpendicular to the first diagonal of the third two-dimensional array.

Example embodiment 71. The system according to example embodiment 64 wherein the first control line follows a meandering path along the first diagonal of the first two-dimensional array of DACs, follows a meandering path along the first diagonal of the second two-dimensional array of DACs, follows a meandering path along the first diagonal of the third two-dimensional array of DACs, and follows a meandering path along the first diagonal of the fourth two-dimensional array of DACs.

Example embodiment 72. The system according to example embodiment 64 wherein the set of control lines further includes:
a second control line, the second control line positioned proximate each DAC along a second diagonal of the first two-dimensional array of DACs to communicatively couple with the respective DACs along the second diagonal of the first two-dimensional array of DACs, the second control line also positioned proximate each DAC along a second diagonal of the second two-dimensional array of DACs to communicatively couple with the respective DACs along the second diagonal of the second two-dimensional array of DACs, the second control line further positioned proximate each DAC along a second diagonal of the third dimensional array of DACs to communicatively couple with the respective DACs along the second diagonal of the third two-dimensional array of DACs; and the second control line even further positioned proximate each DAC along a second diagonal of the fourth dimensional array of DACs to communicatively couple with the respective DACs along the second diagonal of the fourth two-dimensional array of DACs.

Example embodiment 73. The system according to example embodiment 72 wherein the DACs of the first two-dimensional array of DACs are arrayed in a number of rows and a number of columns and the second diagonal of the first two-dimensional array of DACs extends across all rows and all columns of the first two-dimensional array of DACs.

Example embodiment 74. The system according to example embodiment 72 wherein the set of control lines further includes:

a third control line, the third control line positioned proximate each DAC along a third diagonal and a fourth diagonal of the first two-dimensional array of DACs to communicatively couple with the respective DACs along the third and the fourth diagonals of the first two-dimensional array of DACs, fourth diagonal is perpendicular to the third diagonal.

Example embodiment 75. The system according to example embodiment 74 wherein the DACs of the first two-dimensional array of DACs are arrayed in a number of rows and a number of columns and the third diagonal of the first two-dimensional array of DACs extends across a first number of the rows and a first number of the columns of the first two-dimensional array of DACs, and the fourth diagonal of the first two-dimensional array of DACs extends across a second number of the rows and a second number of the columns of the first two-dimensional array of DACs, a combination of the first number and the second number of rows includes all rows of the first two-dimensional array of DACs and a combination of the first number and the second number of columns includes all columns of the first two-dimensional array of DACs.

Example embodiment 76. The system according to example embodiment 74 wherein the third control line is also positioned proximate each DAC along a third diagonal and fourth diagonal of the second two-dimensional array of DACs to communicatively couple with the respective DACs along the third and the fourth diagonals of the second two-dimensional array of DACs, where the fourth diagonal of the second two-dimensional array of DACs is perpendicular to the third diagonal of the second two-dimensional array of DACs, the third control line further positioned proximate each DAC along a third diagonal and a fourth diagonal of the third dimensional array of DACs to communicatively couple with the respective DACs along the third and the fourth diagonals of the third two-dimensional array of DACs, where the fourth diagonal of the third two-dimensional array of DACs is perpendicular to the third diagonal of the third two-dimensional array of DACs, and the third control line even further positioned proximate each DAC along a third diagonal and a fourth diagonal of the fourth dimensional array of DACs to communicatively couple with the respective DACs along the third and fourth diagonals of the fourth two-dimensional array of DACs, where the fourth diagonal of the fourth two-dimensional array of DACs is perpendicular to the third diagonal of the fourth two-dimensional array of DACs.

Example embodiment 77. The system according to any of example embodiments 64-74 wherein there are a total of N signal lines and each of the first, the second, the third and the fourth array of DACs includes a number 4(N−1)2 of DACs.

Example embodiment 78. The system according to any of example embodiments 64-74, further comprising:

control circuitry communicatively coupled to cause signals to be supplied to selected ones of the DACs via a respective triplet comprised of one power line and two of the signal lines, the triplet uniquely communicatively coupled to operate a single respective DAC.

Example embodiment 79. A method of operation in a system, the system including: a first two-dimensional array of digital-to-analog converters (DACs), the first two-dimensional array comprising a plurality of DACs; at least a second two-dimensional array of DACs, the second two-dimensional array comprising a plurality of DACs that are not DACs in the first two-dimensional array; a first power line coupled to selectively provide a current to the DACS of the first two-dimensional array of DACs; a second power line coupled to selectively provide a current to the DACS of the second two-dimensional array of DACs; a set of control lines, the set of control lines including at least: a first control line, the first control line positioned proximate each DAC along a first diagonal of the first two-dimensional array of DACs to communicatively couple with the respective DACs along the first diagonal of the first two-dimensional array of DACs, the first control line also positioned proximate each DAC along a first diagonal of the second two-dimensional array of DACs to communicatively couple with the respective DACs along the first diagonal of the second two-dimensional array of DACs, and a second control line, the second control line positioned proximate each DAC along a second diagonal of the first two-dimensional array of DACs to communicatively couple with the respective DACs along the second diagonal of the first two-dimensional array of DACs, the second control line also positioned proximate each DAC along a second diagonal of the second two-dimensional array of DACs to communicatively couple with the respective DACs along the second diagonal of the second two-dimensional array of DACs, the method comprising:

during a first period of time, concurrently:
applying signals to a first DAC via the first power line;
applying signals to the first DAC via the first control line; and
applying signals to the first DAC via the second control line.

Example embodiment 80. A system, comprising:
a number N of signal lines;
a first plurality of analog converters (DACs) that are arranged in a first two-dimensional array, each of the DACs of the first plurality of DACs including a respective loop of material and a respective pair of Josephson junctions that interrupt the respective loop and are electrically coupled in parallel with one another in the loop of material; and
a plurality of signal lines arranged in a braided configuration through the first two-dimensional array of the first plurality of DACs and communicatively coupled to the DACs of the first plurality of DACs.

Example embodiment 81. The system according to example embodiment 80, further comprising:
a second plurality of analog converters (DACs) that are arranged in a second two-dimensional array, each of the DACs of the second plurality of DACs including a respective loop of material and a respective pair of Josephson junctions that interrupt the respective loop and are electrically coupled in parallel with one another in the loop of material;

a third plurality of analog converters (DACs) that are arranged in a third two-dimensional array, each of the DACs of the third plurality of DACs including a respective loop of material and a respective pair of Josephson junctions that interrupt the respective loop and are electrically coupled in parallel with one another in the loop of material; and a fourth plurality of analog converters (DACs) that are arranged in a fourth two-dimensional array, each of the DACs of the fourth plurality of DACs including a respective loop of material and a respective pair of Josephson junctions that interrupt the respective loop and are electrically coupled in parallel with one another in the loop of material, wherein the number of signal and the plurality of signal lines are arranged in a braided configuration through the second, the third and the fourth two-dimensional arrays of the second, the third and the fourth plurality of DACs, respectively, and communicatively coupled to the DACs of the second, the third and the fourth pluralities of DACs.

Example embodiment 82. The system according to any of example embodiments 80 or 81 wherein a sum of the DACs in the first, the second, the third, and the fourth pluralities of DACs includes a number 4(N−1)2 of DACs that are communicatively coupled to respective triplets of the signal lines to be controlled via signals carried by the respective triplet of signal lines.

Example embodiment 83. The system according to example embodiment 72 wherein the plurality of signal lines includes a number N of signal lines which includes a set of control lines and a set of power lines, and each DAC is controlled via a respective of control lines, each triplet comprised of a unique combination of two of the control lines and one of the power lines.

Example embodiment 84. A system, comprising:

a first two-dimensional array of digital-to-analog converters (DACs), the first two-dimensional array comprising a plurality of DACs arranged in a plurality of rows and a plurality of columns of the first two-dimensional array;

a first power line coupled to selectively provide a current to the DACS of the first two-dimensional array of DACs; and a set of control lines, the set of control lines including at least:
  a first control line, the first control line positioned operationally proximate at least one DAC in each of at least three rows and at least three columns of the first two-dimensional array of DACs to communicatively couple with the respective DACs in each of at least three rows and at least three columns of the first two-dimensional array of DACs.

Example embodiment 85. The system according to example embodiment 84, further comprising:

at least a second two-dimensional array of DACs, the second two-dimensional array comprising a plurality of DACs comprising a plurality of DACs that are not DACs in the first two-dimensional array, and which are arranged in a plurality of rows and a plurality of columns of the second two-dimensional array; and a second power line coupled to selectively provide a current to the DACS of the second two-dimensional array of DACs, wherein the first control line also positioned operationally proximate at least one DAC in each of at least three rows and at least three columns of the second two-dimensional array of DACs to communicatively couple with the respective DACs in each of at least three rows and at least three columns of the second two-dimensional array of DACs.

Example embodiment 86. The system according to any of example embodiments 84 or 85, further comprising:

a second control line, the second control line positioned operationally proximate at least one DAC in each of at least three rows and at least three columns of the first two-dimensional array of DACs to communicatively couple with the respective DACs in each of at least three rows and at least three columns of the first two-dimensional array of DACs.

Example embodiment 87. The system according to example embodiment 86 wherein the first control line and the second control line are positioned operationally proximate different DACs, with no DAC in common.

Example embodiment 88. The system according to example embodiment 87 wherein the first control line and the second control line are positioned operationally proximate a same at least one of DACs, with the at least one DAC in common.

Example embodiment 89. A system, comprising:

a first set of quantum flux parametron (QFP) magnetometers, each QFP magnetometer of the first set of QFP magnetometers includes a respective first loop of material, a respective second loop of material, and a respective compound Josephson junction comprising a pair of Josephson junctions, the respective first and the respective second loops of material which superconductive at a critical temperature, the second loop of material interrupts the respective first loop of material, the respective pair of Josephson junctions interrupt the second loop of material and are in parallel with one another in the second loop of material with respect to nodes at which the respective second loop of material interrupt the respective first loop of material, the respective second loop of material including a respective second loop inductive interface to inductively receive control signals to control the respective compound Josephson junction, and the respective first loop of material includes a plurality of first loop inductive interfaces, at least one of the first loop inductive interfaces exposed to flux from an external magnetic field without any intervening ground plane, to measure the external magnetic field via the respective QFP magnetometer;

a set of control lines positioned to selectively communicatively couple control signals to the second loop inductive interface; and a set of flux bias lines positioned to selectively communicatively couple a flux bias to at least one of the first loop inductive interfaces of each QFP magnetometer of the first set of QFP magnetometers for flux feedback to measure the external magnetic field.

Example embodiment 90. The system according to example embodiment 89, further comprising:

a processor chip comprising a plurality of qubits and a plurality of couplers, each coupler operative to selectively communicatively couple a respective pair of the qubits, and wherein the first set of QFP magnetometers are positioned to detect an external magnetic field.

Example embodiment 91. The system according to example embodiment 90 wherein the first set of QFP magnetometers are integral components of the processor chip.

Example embodiment 92. The system according to any of example embodiments 89 through 91, further comprising:

a first shift register communicatively coupled to the first set of QFP magnetometers.

Example embodiment 93. The system according to example embodiment 89 wherein the first shift register is a QFP-based shift register which is one of magnetically or galvanically coupleable to respective ones of the first set of QFP magnetometers.

Example embodiment 94. The system according to example embodiment 93, further comprising:
a number of non-dissipative read outs (NDROs).

Example embodiment 95. The system according to example embodiment 93, further comprising:
control circuitry communicatively coupled to the QFP magnetometers of the first set of magnetometers via the flux bias lines and operable to sweep a flux bias applied to a body of each of the QFP magnetometers of the first set of magnetometers while making a plurality of read outs of the QFP magnetometers of the first set of magnetometers.

Example embodiment 96. The system according to example embodiment 95 wherein the control circuitry further determines a respective degeneracy point of each of the QFP magnetometers of the first set of magnetometers based at least in part on the plurality of read outs.

Example embodiment 97. The system according to example embodiment 96 wherein, for each of the QFP magnetometers of the first set of magnetometers, the control circuitry fits a respective set of results of the read out to a tanh shape in order to determines the respective degeneracy point of each of the QFP magnetometers of the first set of magnetometers.

Example embodiment 98. The system according to example embodiment 97 wherein the control circuitry further communicatively coupled to the QFP magnetometers of the first set of magnetometers via a first set of annealing lines and operable to anneal each of the QFP magnetometers of the first set of magnetometers between $+\Phi_0/2$ and $+\Phi_0$, and between $-\Phi_0/2$ and $-\Phi_0$.

Example embodiment 99. The system according to example embodiment 98 wherein the control circuitry further:
determines a measure of annealing line/QFP magnetometer cross-talk; and
compensates for the determined annealing line/QFP magnetometer cross-talk.

Example embodiment 100. The system according to example embodiment 89 wherein, for each of the QFP magnetometers of the first set of QFP magnetometers, at least some of the first loop inductive interfaces couples the respective QFP magnetometer to respective first loop inductive interfaces of neighboring QFP magnetometers of the first set of QFP magnetometers.

Example embodiment 101. A method of operation in a system, the system including a first set of quantum flux parametron (QFP) magnetometers, each QFP magnetometer of the first set of QFP magnetometers includes a respective first loop of material, a respective second loop of material, and a respective compound Josephson junction comprising a pair of Josephson junctions, the respective first and the respective second loops of material which superconductive at a critical temperature, the second loop of material interrupts the respective first loop of material, the respective pair of Josephson junctions interrupt the second loop of material and are in parallel with one another in the second loop of material with respect to nodes at which the respective second loop of material interrupt the respective first loop of material, the respective second loop of material including a respective second loop inductive interface to inductively receive control signals to control the respective compound Josephson junction, and the respective first loop of material includes a plurality of first loop inductive interfaces, at least one of the first loop inductive interfaces exposed to flux from an external magnetic field without any intervening ground plane, to measure the external magnetic field via the respective QFP magnetometer; a set of control lines positioned to selectively communicatively couple control signals to the second loop inductive interface; a set of flux bias lines positioned to selectively communicatively couple a flux bias to at least one of the first loop inductive interfaces of each QFP magnetometer of the first set of QFP magnetometers for flux feedback to measure the external magnetic field, and control circuitry, the method comprising:
for each of the QFP magnetometers of the first set of magnetometers,
sweeping a flux bias applied to a body of the respective QFP magnetometer; and
making a plurality of read outs of the respective QFP magnetometers while sweeping the flux bias applied to the body of the respective QFP magnetometer.

Example embodiment 102. The method according to example embodiment 101 wherein the system further includes a first shift register, the method further comprising:
communicatively coupling the first set of QFP magnetometers to a first shift register; and
applying flux bias signals to sequentially move quantum flux values between successive elements of the shift registers.

Example embodiment 103. The method according to example embodiment 102 wherein making a plurality of read outs of the respective QFP magnetometers includes reading out the respective QFP magnetometers via an non-dissipative read out (NDRO).

Example embodiment 104. The method according to any of example embodiments 101 through 103, further comprising:
determining a respective degeneracy point of each of the QFP magnetometers of the first set of magnetometers based at least in part on the plurality of read outs.

Example embodiment 105. The method according to example embodiment 104 wherein determining a respective degeneracy point of each of the QFP magnetometers of the first set of magnetometers based at least in part on the plurality of read outs includes fitting a respective set of results of the read out to a tanh shape in order to determines the respective degeneracy point of each of the QFP magnetometers of the first set of magnetometers.

Example embodiment 106. The method according to example embodiment 105, further comprising:
applying signals to the QFP magnetometers of the first set of magnetometers via a first set of annealing lines to anneal each of the QFP magnetometers of the first set of magnetometers between $+\Phi_0/2$ and $+\Phi_0$, and between $-\Phi_0/2$ and $-\Phi_0$.

Example embodiment 107. The method according to example embodiment 106, further comprising:
determining a measure of annealing line/QFP magnetometer cross-talk; and
compensating for the determined annealing line/QFP magnetometer cross-talk.

Example embodiment 108. A system, comprising:
a first set of quantum flux parametron (QFP) magnetometers arranged and communicatively coupled to one another as a first QFP shift register, each QFP magnetometer of the first set of QFP magnetometers includes a respective first loop of material, a respective second loop of material, and a respective compound Josephson junction comprising a pair of Josephson junctions, the respective first and the respective second loops of material which superconductive at a critical temperature, the second loop of material interrupts the respective first loop of material, the respective pair of Josephson junctions interrupt the second loop of material and are in parallel with one another in the second loop of material with respect to nodes at which the respective second loop of material interrupt the respective first loop of material, the respective second loop of material including a respective second loop inductive interface to inductively receive control signals to control the respective compound Josephson junction, and the respective first loop of material includes a plurality of first loop inductive interfaces;

a set of control lines positioned to selectively communicatively couple control signals to the second loop inductive interface;

a set of flux bias lines positioned to selectively communicatively couple a flux bias to at least one of the first loop inductive interfaces of each QFP magnetometer of the first set of QFP magnetometers; and control circuitry communicatively coupled to sequentially apply flux signals to the loops of the first set of QFP magnetometers via the first loop inductive interfaces to shift a value along at least one dimension of the first QFP shift register.

Example embodiment 109. The system according to example embodiment 108 wherein control circuitry sequentially applies flux signals to the loops of the first set of QFP magnetometers via the first loop inductive interfaces where a respective flux signal applied to each of the first loop inductive interface is offset by $\pi/2$ with respect to a respective flux signal applied to an immediately following one of the loops along a linear succession of the loops the first set of QFP magnetometers.

Example embodiment 110. The system according to example embodiment 109 wherein the respective flux signal applied to the first loop inductive interface of each loop is advanced by $\pi/2$ with respect to a respective flux signal applied to the immediately following one of the loops along the linear succession of the loops the first set of QFP magnetometers.

Example embodiment 111. The system according to example embodiment 109 wherein the respective flux signal applied to the first loop inductive interface of each loop is retarded by $\pi/2$ with respect to the respective flux signal applied to the immediately following one of the loops along the linear succession of the loops the first set of QFP magnetometers.

Example embodiment 112. The system according to any of example embodiments 108 through 111 wherein the first set of QFP magnetometers are arranged as a one-dimensional array a shift register.

Example embodiment 113. The system according to any of example embodiments 108 through 111 wherein the first set of QFP magnetometers are arranged as a two-dimensional array shift register.

Example embodiment 114. The system according to example embodiment 108 wherein the control circuitry causes the shift register to be read out one QFP magnetometer at a time.

Example embodiment 115. The system according to example embodiment 108 wherein the control circuitry causes the shift register to be read out an entire column of QFP magnetometers at a time.

Example embodiment 116. The system according to any of example embodiments 108, 114 or 115 wherein the control circuitry is further operable to sweep a flux bias applied to a body of each of the QFP magnetometers of the first set of magnetometers while making a plurality of read outs of the QFP magnetometers of the first set of magnetometers.

Example embodiment 117. The system according to example embodiment 116 wherein the control circuitry further determines a respective degeneracy point of each of the QFP magnetometers of the first set of magnetometers based at least in part on the plurality of read outs.

Example embodiment 118. The system according to example embodiment 117 wherein, each of the QFP magnetometers of the first set of magnetometers, the control circuitry fits a respective set of results of the read out to a tanh shape in order to determines the respective degeneracy point of each of the QFP magnetometers of the first set of magnetometers.

Example embodiment 119. The system according to example embodiment 118 wherein the control circuitry further communicatively coupled to the QFP magnetometers of the first set of magnetometers via a first set of annealing lines and operable to anneal each of the QFP magnetometers of the first set of magnetometers between $+\Phi_0/2$ and $+\Phi_0$, and between $-\Phi_0/2$ and $-\Phi_0$.

Example embodiment 120. The system according to example embodiment 119 wherein the control circuitry further:

determines a measure of annealing line/QFP magnetometer cross-talk; and compensates for the determined annealing line/QFP magnetometer cross-talk.

121. A hybrid computing system comprising a digital computer and a quantum computer, the quantum computer comprising a plurality of logic devices and/or control circuitry that implements any one or more of the addressing methods as described in any of example embodiments 1 through 120.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations, examples, and embodiments described above can be combined to provide further implementations, examples, and embodiments respectively. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet are incorporated herein by reference, including but not limited to the following: U.S. Provisional Patent Application Ser. No. 60/986,554 filed Nov. 8, 2007 and entitled "Systems, Devices and Methods for Analog Processing"; U.S. Provisional Patent Application No. 62/161,780, filed May 14, 2015; U.S. Provisional Patent Application No.: 62/288,251, filed Jan. 28, 2016; U.S. Pat. No. 8,854,074; U.S. patent application Ser. No. 12/017,995; U.S. Pat. No. 8,169,231; U.S. Patent Publication No. 2006-0225165; U.S. Patent Publication No. 2006-0147154; U.S. patent application Ser. No. 12/013,192; U.S. Provisional Application No. 62/331,287, filed May 3, 2016; U.S. Provisional Application No. 62/405,027, filed Oct. 6, 2016; International Patent Application Serial No. PCT/US2016/031885 filed Jun. 1, 2016 and entitled "Frequency Multiplexed Resonator Input And/Or Output For A Superconducting Device"; U.S. Pat. Nos. 7,876,248; 8,098,179; and US Publication No. 2014-0344322;

Aspects of the embodiments can be modified, if necessary, to employ systems, circuits and concepts of the various patents, applications and publications to provide yet further embodiments. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system, comprising:
   a first set of digital-to-analog converters (DACs), each of the DACs of the first set of DACs including a respective loop of material and a respective pair of Josephson junctions that interrupt the respective loop of material and are electrically coupled in parallel with one another in the respective loop of material;
   a first quantum flux parametron (QFP) based shift register comprising a sequence of a plurality of QFP-based shift register elements, the first QFP-based shift register one of magnetically or galvanically coupleable to the DACs of the first set of DACs;
   a power line that serially couples the DACs of the first set of DACs; and
   a trigger line that serially couples the DACs of the first set of DACs, wherein:
      each of the DACs of the first set of DACs is independently addressable by a triplet of three signals a successive number of times to store a variable number of flux quanta, the triplet of three signals including a first signal received via the QFP-based shift register elements of the first QFP-based shift register, a second signal received via the power line, and a third signal received via the trigger line.

2. The system of claim 1, further comprising:
   an inductor ladder circuit that superconducts at a critical temperature and that includes a plurality of inductors, wherein each of the QFP-based shift register element of the first QFP-based shift register is magnetically coupled to one of the DACs of the first set of DACs via the inductor ladder circuit.

3. The system of claim 1, further comprising:
   a first set of QFP amplifiers that galvanically couple to respective ones of the DACs of the first set of DAC as a respective flux amplifier.

4. The system of claim 3 wherein each of the QFP amplifiers of the first set of QFP amplifiers includes a respective loop of material that superconducts at a critical temperature and a respective pair of Josephson junctions that interrupt the respective loop and are electrically coupled in parallel with one another in the loop of material.

5. The system of claim 3, and further comprising:
   an inductor ladder circuit that superconducts at a critical temperature and that includes a plurality of inductors, wherein each of the QFP amplifiers of the first set of QFP amplifiers is coupled between a respective one of the DACs of the first set of DACs and the QFP-based shift register elements of the first QFP-based shift register via the inductor ladder circuit.

6. The system of claim 1 wherein the first QFP-based shift register includes at least three QFP register elements per DAC of the first set of DACs.

7. The system of claim 6 wherein each of the QFP register elements of the first QFP-based shift register includes a respective loop of material that superconducts at a critical temperature and a respective pair of Josephson junctions that interrupt the respective loop and are electrically coupled in parallel with one another in the loop of material.

8. The system of claim 7 wherein each of the QFP register elements of the first QFP-based shift register includes a respective galvanic interface to one of a plurality of address lines.

9. The system of claim 7, further comprising:
   a plurality of additional sets of DACs; and
   a plurality of additional QFP-based shift registers.

10. The system of claim 6, further comprising:
    control circuitry communicatively coupled to apply signals to the power line, the trigger line and an address line.

11. The system of claim 10 wherein the control circuitry sequentially applies signals to the power line, the trigger line and the address line to load single flux quanta (SFQ) to selected ones of the DACs.

12. The system of claim 10 wherein the control circuitry:
    resets all of the DACs of the first set of DACs;
    applies a clockwise persistent current to a first number of the QFP-based shift register elements which are coupled to the DACs into which quantums of flux are to be added;
    applies a counter-clockwise persistent current to a second number of the QFP-based shift register elements which are coupled to the DACs into which quantums of flux are not to be loaded; and
    for a first number of times, applies a signal to the trigger line, where the first number of times is at least proportional to a total number of quantums of flux to be added.

13. The system of claim 12 wherein the first number of times is equal to the total number of quantums of flux to be loaded.

14. The system of claim 10 wherein the control circuitry:
    sorts all of the DACs based on a number of quantums of flux to be loaded to the DACs;

resets all of the DACs;
applies a clockwise persistent current to a number of the QFP-based shift register elements which are coupled to the DAC stages into which at least one quantum of flux is to be loaded;
applies a counter-clockwise persistent current to a number of the QFP-based shift register elements which are coupled to the DACs into which less than one quantum of flux is to be loaded;
applies a signal to the trigger line;
applies a clockwise persistent current to a number of the QFP-based shift register elements which are coupled to the DACs into which at least two quantums of flux are to be loaded;
applies a counter-clockwise persistent current to a number of the QFP-based shift register elements which are coupled to the DACs into which less than two quantums of flux are to be loaded; and
applies a signal to the trigger line.

15. The system of claim 10 wherein the control circuitry:
sorts all of the DAC stages based on a number of quantums of flux to be loaded to the DACs;
resets all of the DACs of all of the DAC stages; and
for an integer number i times from i equals 1 to a maximum number of quantums of flux n to be programmed:
applies a clockwise persistent current to a number of the QFP-based shift register elements which are coupled to the DACs into which at least i quantums of flux are to be loaded;
applies a counter-clockwise persistent current to a number of the QFP-based shift register elements which are coupled to the DACs into which less than i quantums of flux are to be loaded; and
applies a signal to the trigger line.

16. The system of claim 15 wherein the maximum number of quantums of flux n is between 18 and 22.

17. The system of claim 10 wherein to reset all of the DACs of the first set of DACs, the control circuitry repeatedly applies a signal to the trigger line.

18. The system of claim 1, further comprising:
a second set of DACs, each of the DACs of the second set of DACs including a respective loop of material that superconducts at a critical temperature and a respective pair of Josephson junctions that interrupt the respective loop and are electrically coupled in parallel with one another in the loop of material;
a second QFP-based shift register comprising a sequence of a plurality of QFP-based shift register elements, the QFP-based shift register elements of the second QFP-based shift register one of magnetically or galvanically coupleable to the DACs of the second set of DACs; and
each of the DACs of the second set of DACs is independently addressable by a triplet of three signals a successive number of times to store a variable number of flux quanta, the triplet of three signals including a first received via the QFP-based shift register elements of the second QFP-based shift register, a second signal, and signal a third signal.

19. The system of claim 1 wherein the respective loop of material of each of the DACs superconducts at least at a critical temperature and all of the DACS and QFP-based shift register reside on a single chip.

20. A system, comprising:
a number of quantum flux parametrons (QFPs);
at least one pair of quantum flux parametron digital-to-analog converters (QFP-DACs);
a current bias line that applies a current bias to both of the QFP-DACs of the at least one pair of the QFP-DACs without any bias resistors; and
for each QFP of the number of QFPs, a respective first number of quantum flux parametron-latches (QFP-latches) selectively operable to communicatively couple flux between the QFP and a first one of the QFP-DACs of the at least one pair of QFP-DACs and a respective second number of QFP-latches selectively operable to communicatively couple flux between the QFP and a second one of the QFP-DACs of the at least one pair of QFP-DACs.

21. The system of claim 20 wherein each of the QFPs includes a respective first loop of material interrupted by a respective second loop of material, the first and the second loops of material which are superconductive at a critical temperature, and having a respective first and a respective second interface, the second loop of material interrupted by two Josephson junctions, the first inductive interface positioned to communicatively couple flux with the first one of the respective first number of QFP-latches and the second inductive interface positioned to communicatively couple flux with the first one of the respective second number of QFP-latches.

22. The system of claim 20 wherein each of the QFPs includes a respective loop with a first interface positioned to communicatively couple flux to a first one of the respective first number of QFP-latches and a second interface positioned to communicatively couple flux to a first one of the respective second number of QFP-latches.

23. The system of claim 20 wherein each of the first one of the respective first number of QFP-latches includes a respective loop with a respective second interface positioned to communicatively couple flux to a second one of the respective first number of QFP-latches, and each of the first one of the respective second number of QFP-latches includes a respective loop with a respective second interface positioned to communicatively couple flux to a second one of the respective second number of QFP-latches.

24. The system of claim 23 wherein the first one of each of the first number of QFP-latches is responsive to a respective first latch signal and the first one of each of the second number of QFP-latches is responsive to a logical inverse of the respective first latch signal.

25. The system of claim 20, further comprising:
control circuitry communicatively coupled to apply signals to the QFP-DACs and the QFP-latches.

26. The system of claim 25 wherein the control circuitry applies signals to the QFP-latches to load information into the DACs and/or from the DACs.

27. The system of claim 20 wherein all of the QFPs QFP-DACs and QFP-latches form a non-dissipative programmable magnetic memory (PMM) that resides on a single chip.

* * * * *